(12) United States Patent
Chen et al.

(10) Patent No.: US 12,382,705 B2
(45) Date of Patent: Aug. 5, 2025

(54) SEMICONDUCTOR DEVICE AND FORMING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Miin-Jang Chen, Taipei (TW); Sheng-Han Yi, Taipei (TW); Chen-Hsuan Lu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 18/507,957

(22) Filed: Nov. 13, 2023

(65) Prior Publication Data
US 2024/0088255 A1    Mar. 14, 2024

Related U.S. Application Data

(60) Continuation of application No. 17/400,668, filed on Aug. 12, 2021, now Pat. No. 11,855,171, which is a division of application No. 16/232,932, filed on Dec. 26, 2018, now Pat. No. 11,101,362.

(60) Provisional application No. 62/712,196, filed on Jul. 30, 2018.

(51) Int. Cl.
| | |
|---|---|
| H10D 64/68 | (2025.01) |
| H10D 1/68 | (2025.01) |
| H10D 30/01 | (2025.01) |
| H10D 30/69 | (2025.01) |

(52) U.S. Cl.
CPC ............. *H10D 64/689* (2025.01); *H10D 1/68* (2025.01); *H10D 1/694* (2025.01); *H10D 1/696* (2025.01); *H10D 30/0415* (2025.01); *H10D 30/701* (2025.01); *H10D 64/691* (2025.01)

(58) Field of Classification Search
None
See application file for complete search history.

(56) References Cited

U.S. PATENT DOCUMENTS

| | | |
|---|---|---|
| 6,777,777 B1 | 8/2004 | Kar-Roy et al. |
| 2009/0004809 A1 | 1/2009 | Chinthakindi et al. |
| 2010/0213572 A1 | 8/2010 | Ching et al. |
| 2011/0237043 A1* | 9/2011 | Kim .................... H10B 12/033 257/E21.011 |
| 2014/0187015 A1 | 7/2014 | Rui et al. |

(Continued)

OTHER PUBLICATIONS

Johannes Müller et al., "Ferroelectricity in Simple Binary ZrO2 and HfO2", Nano Letters, 2012, 12, pp. 4318-4323.

(Continued)

*Primary Examiner* — Khaja Ahmad
(74) *Attorney, Agent, or Firm* — Maschoff Brennan

(57) ABSTRACT

A method includes forming source/drain regions in a semiconductor substrate; depositing a zirconium-containing oxide layer over a channel region in the semiconductor substrate and between the source/drain region; forming a titanium oxide layer in contact with the zirconium-containing oxide layer; forming a top electrode over the zirconium-containing oxide layer, wherein no annealing is performed after depositing the zirconium-containing oxide layer and prior to forming the top electrode.

20 Claims, 58 Drawing Sheets

(56) References Cited

U.S. PATENT DOCUMENTS

| | | | |
|---|---|---|---|
| 2015/0295019 A1* | 10/2015 | Wang | H10D 1/696 |
| | | | 257/532 |
| 2016/0336312 A1 | 11/2016 | Yan | |
| 2017/0117467 A1 | 4/2017 | Chang | |
| 2017/0141235 A1 | 5/2017 | Lai et al. | |
| 2018/0240804 A1 | 8/2018 | Yoo | |
| 2018/0286988 A1 | 10/2018 | Yoo | |
| 2019/0066917 A1 | 2/2019 | Nahar | |
| 2019/0130956 A1 | 5/2019 | Müller et al. | |
| 2019/0148390 A1 | 5/2019 | Frank | |
| 2019/0305076 A1 | 10/2019 | Ando et al. | |
| 2020/0020762 A1 | 1/2020 | Frank et al. | |

OTHER PUBLICATIONS

Asif I. Khan et al., "Ferroelectric Negative Capacitance MOSFET: Capacitance Tuning & Antiferroelectric Operation", 2011 IEEE, pp. 11-255-11-258.

ZhengWen et al., "Ferroelectric-field-effect-enhanced electroresistance in metal/ ferroelectric/ semiconductor tunnel junctions", Nature Materials, vol. 12, 2013, 07, pp. 617-621.

Sayeef Salahuddin et al., "Use of Negative Capacitance to Provide Voltage Amplification for Low Power Nanoscale Devices", Nano Letters, 2008, vol. 8, No. 2, pp. 405-410.

Kamal Karda, et al., "An anti-ferroelectric gated Landau transistor to achieve sub-60 mV/dec switching at low voltage and high speed", Applied Physics Letters 106, 163501, 2015.

T. S. Böscke et al., "Ferroelectricity in hafnium oxide thin films", Applied Physics Letters 99, 102903, 2011.

Bo-Ting Lin, et al., "Induction of ferroelectricity in nanoscale ZrO2 thin films on Pt electrode without post-annealing", Journal of the European Ceramic Society 37, 2017 pp. 1135-1139.

Patrick D. Lomenzo et al., "Annealing behavior of ferroelectric Si-doped HfO2 thin films", Thin Solid Films 615, 2016, pp. 139-144.

Stephen L. Weeks et al., "Engineering of Ferroelectric HfO2—ZrO2 Nanolaminates", ACS Applied Materials & Interfaces 2017, 9, pp. 13440-13447.

Min Hyuk Park, et al., "The effects of crystallographic orientation and strain of thin Hf0. 5Zr0. 5O2 film on its ferroelectricity", Applied Physics Letters 104, 072901, 2014.

M. Dawber et al., "Physics of thin-film ferroelectric oxides", Reviews Of Modern Physics, vol. 77, No. 4, Oct. 2005, pp. 1083-1130.

Li Jin et al., "Decoding the Fingerprint of Ferroelectric Loops: Comprehension of the Material Properties and Structures", Journal of the American Ceramic Society, vol. 97, No. 1, 2014, pp. 1-27.

Milan Pešić et al., "Nonvolatile Random Access Memory and Energy Storage Based on Antiferroelectric Like Hysteresis in ZrO2", Advanced Functional Materials 2016, 26, pp. 7486-7494.

T. Schenk et al., "About the deformation of ferroelectric hystereses", Applied Physics Reviews 1, 041103, 2014.

Xihong Hao et al., "A comprehensive review on the progress of lead zirconate-based antiferroelectric materials", Progress in Materials Science 63, 2014, pp. 1-57.

Muhammad A. Alam, "A Tutorial Introduction to Negative Capacitor Field Effect Transistors: Perspective on The Road Ahead", nanoHUB.org, 2015.

* cited by examiner

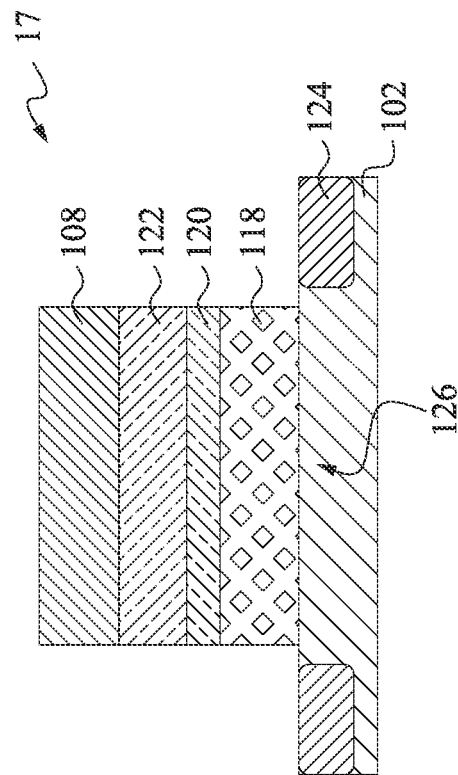
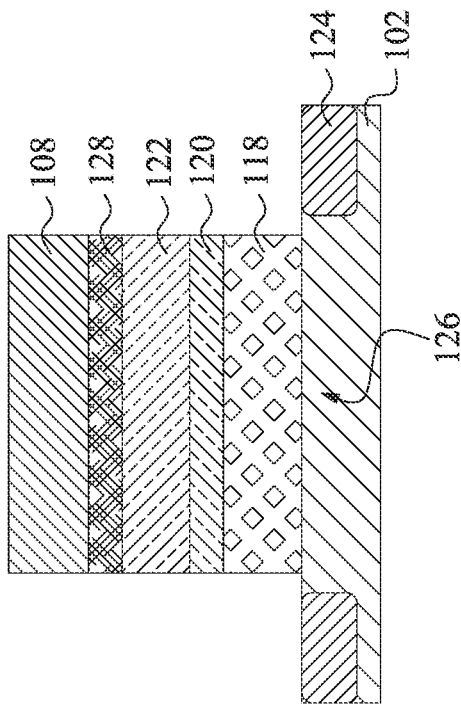
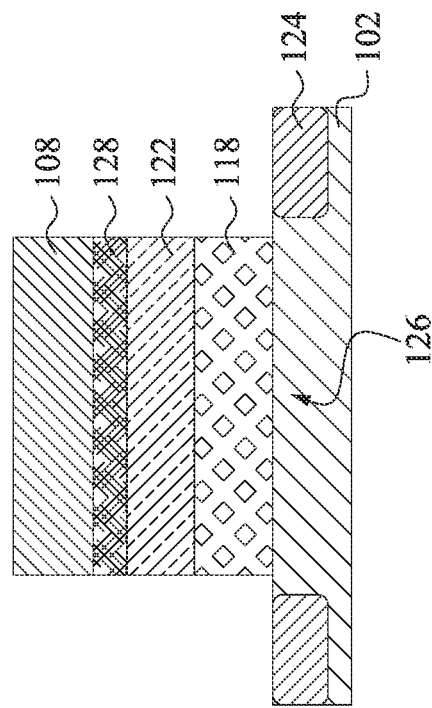
Fig. 24
Fig. 25
Fig. 26

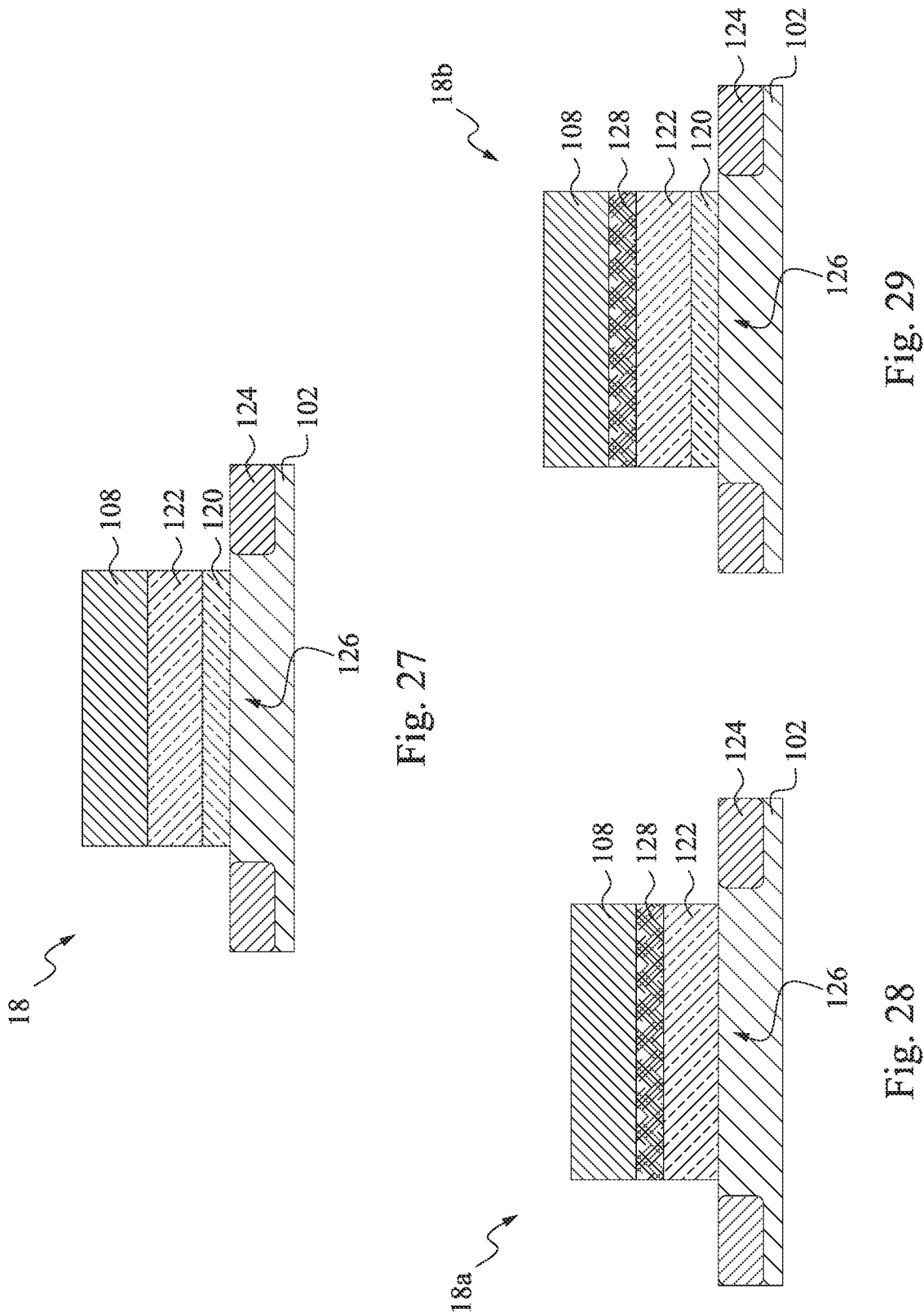

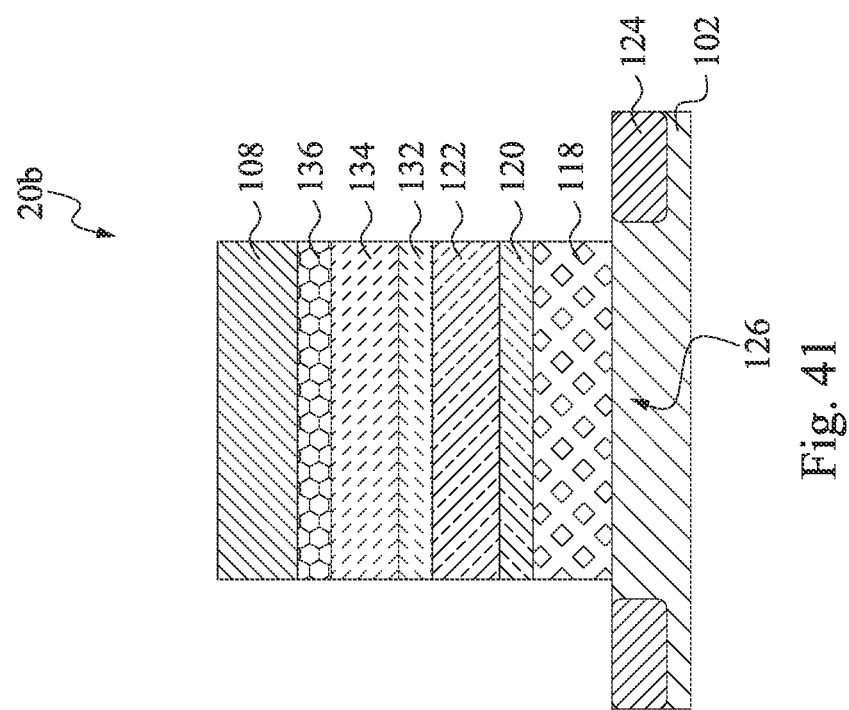

SEMICONDUCTOR DEVICE AND FORMING METHOD THEREOF

PRIORITY CLAIM AND CROSS-REFERENCE

The present application is a Continuation Application of the U.S. application Ser. No. 17/400,668, filed Aug. 12, 2021, which is a Divisional Application of the U.S. application Ser. No. 16/232,932, filed Dec. 26, 2018, now U.S. Pat. No. 11,101,362, issued Aug. 24, 2021, which claims priority to U.S. Provisional Application Ser. No. 62/712,196, filed Jul. 30, 2018, all of which are herein incorporated by reference in their entirety.

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately logarithmic linear behavior in this metal-oxide-semiconductor field-effect transistor (MOSFET) operating region. To improve the subthreshold properties, a negative capacitance field effect transistor (NC-FET) using a ferroelectric material has been proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 22-56 illustrate schematic cross-sectional views of the semiconductor structure in accordance with some embodiments of the present disclosure.

DETAILED DESCRIPTION

Figure 1A:
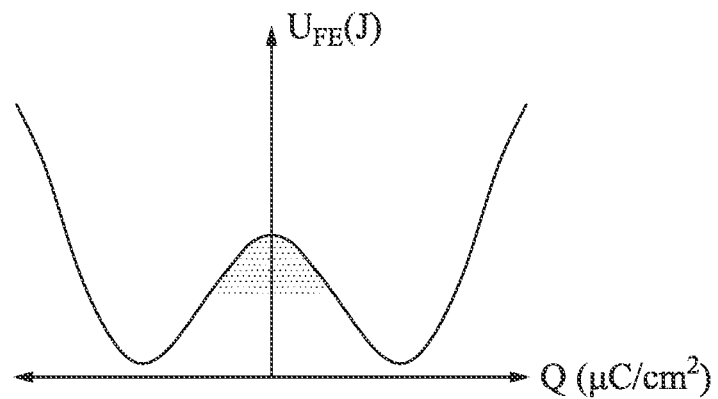
FIGS. 1A and 1B are diagrams showing energy versus polarization for ferroelectricity and antiferroelectricity, respectively.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following embodiments disclose ferroelectric or antiferroelectric capacitor structures that can be used for negative-capacitance fin field effect transistors (NC-FinFETs) with subthreshold swing improvement.

As the transistor size is scaled down, continuously scaling down of voltage (e.g., power supply) is a target for ultra-low power devices. However, voltage scaling down will meet the bottleneck of physical limitation of subthreshold swing with 60 mV/decade, which is accompanied with a higher off-state leakage current. An NC-FET, which introduces negative capacitance to a gate stack of MOSFET, will overcome the problem. The negative-capacitance may result from the ferroelectricity or antiferroelectricity of a dielectric layer in the gate stack.

Figure 1B:
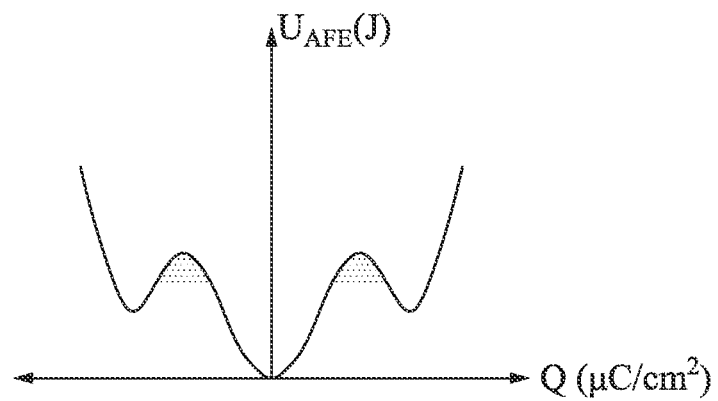

Reference is made to FIGS. 1A and 1B. FIGS. 1A and 1B are diagrams showing energy versus polarization for ferroelectricity and antiferroelectricity, respectively. As shown in FIG. 1A, materials with ferroelectricity possess two or more stable states of different nonzero polarization and thus exhibit nonzero polarization without an applied electric field. As a result, materials with ferroelectricity are able to be switched between those different polarization states by an applied electric field. In contrast, as shown in FIG. 1B, materials with antiferroelectricity possess a stable state of zero polarization (nonpolar AFE phase) and two metastable states of nonzero polarization (polar FE phase), and hence exhibit no polarization without an applied electric field. However, antiferroelectric materials are able to be switched to one of the two original metastable states of nonzero polarization (AFE phase→FE phase) when an electric field is applied. Once the applied electric field is removed, such materials are switched back to the stable state of zero polarization (FE phase→AFE phase).

Figure 2A:
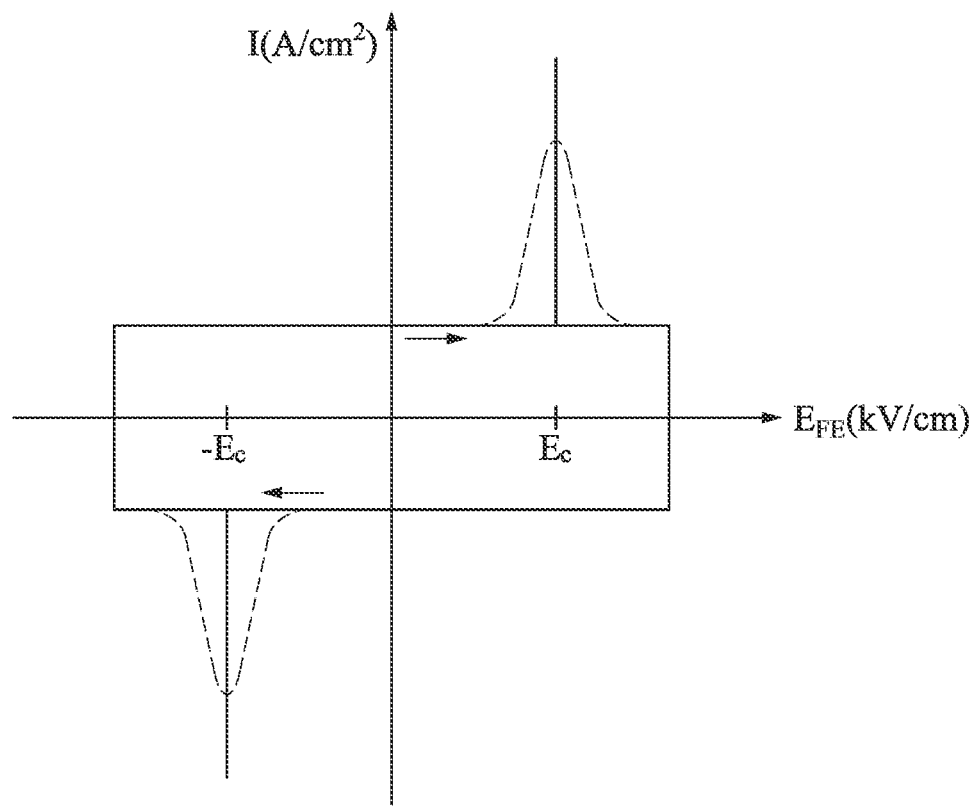
FIG. 2A is a diagram showing transient currents integrated during an electric field with a triangular-shaped wave in which Ec is coercive field.
Figure 2B:
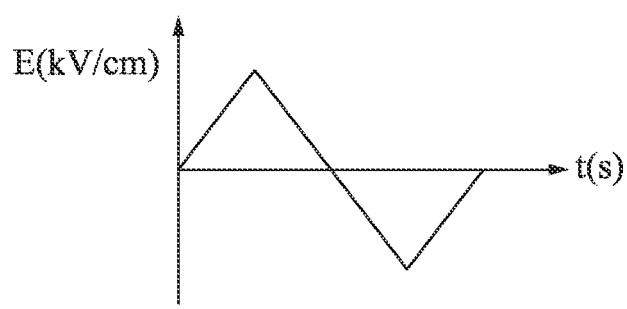
FIG. 2B is a diagram showing an ac excitation signal, which is expressed as E(t), a function of time.
Figure 2C:
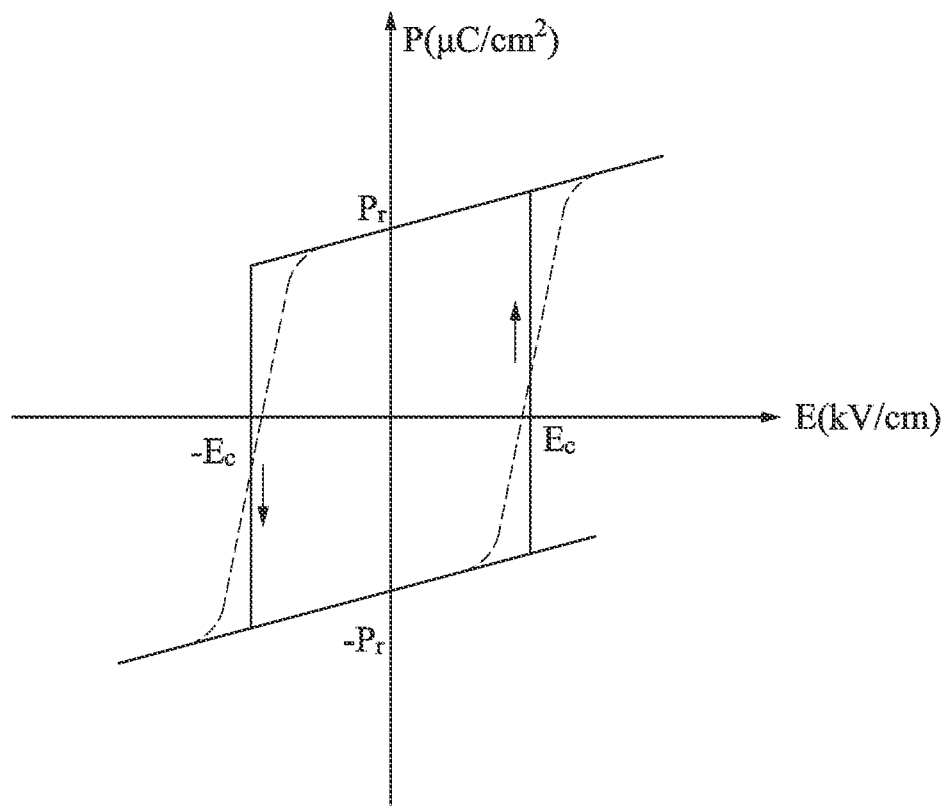
FIG. 2C is a diagram showing an exemplary polarization-electric field (P-E) hysteresis loop of a ferroelectric material.
Figure 3A:
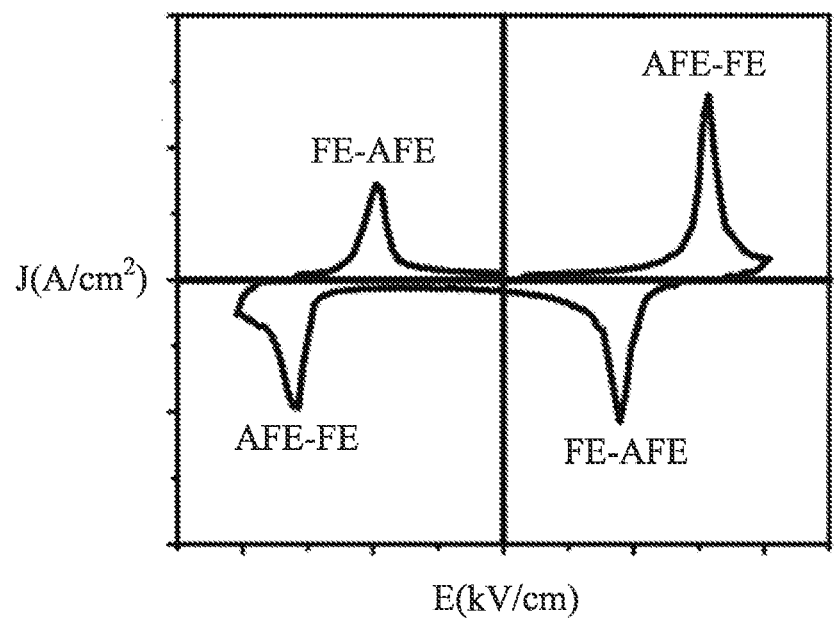
FIG. 3A is a diagram showing current density versus electric field for antiferroelectricity.
Figure 3B:
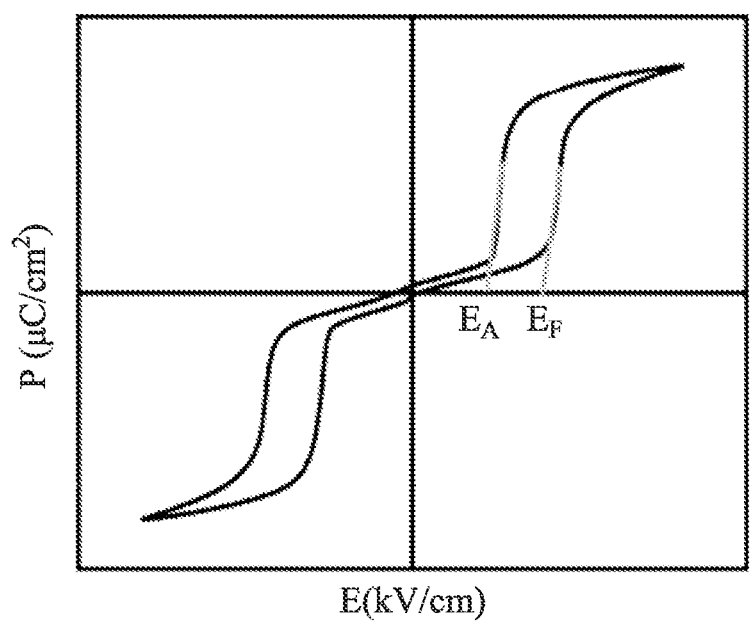
FIG. 3B is a diagram showing polarization versus electric field for antiferroelectricity.

With reference to FIGS. 2A-3B. FIG. 2A is a diagram showing transient currents during an electric field with a triangular-shaped wave in which Ec is coercive field. FIG. 2B is a diagram showing an alternating current (AC) excitation signal, which is expressed as E(t), a function of time. FIG. 2C is a diagram showing an exemplary polarization-electric field (P-E) hysteresis loop of a ferroelectric material in which Pr is remanent polarization and Ec is coercive field. FIG. 3A is a diagram showing current density versus electric field of antiferroelectric materials. The label "AFE-FE" in the figure indicates that the switching peak arises from the transformation of a non-polar antiferroelectric phase into a polar ferroelectric phase. FIG. 3B is a diagram showing polarization versus electric field of an antiferroelectric material. Ferroelectricity or antiferroelectricity may be measured using a dynamic hysteresis measurement with a triangular excitation field, which has a triangular wave form (see FIG. 2B), and by integrating the current with time, the polarization may be obtained. When a material that exhibits ferroelectricity or antiferroelectricity undergoes switching between different polarization states, it gives rise to a switching current and a sudden change in polarization, which corresponds to a peak in the transient current-electric field (I-E) loop (see FIGS. 2A and 3A) and a steep slope in the polarization-electric field (P-E) hysteresis loop (see FIGS. 2C and 3B), respectively. There is an energy barrier to overcome for the switching process to take place, and thus the switching process happens when the excitation field exceeds a threshold value, which results in the hysteric behavior in the P-E loop of the material exhibiting ferroelectricity or antiferroelectricity.

Once a positive triangular excitation field is applied across a material that exhibits ferroelectricity, one switching operation occurs if the ascending field exceeds a threshold value, which is also referred to as coercive field (Ec), and this corresponds to the switching of the stable state from a positive polarization to a negative polarization. The same goes for a negative triangular excitation field but of the opposite sign. Such a ferroelectricity shows an I-E loop (see FIG. 2A) with two peaks and a single hysteretic P-E loop (see FIG. 2C).

In comparison, in the case of a material that exhibits antiferroelectricity, two switching operations occur when a positive triangular excitation field is applied. The first switching takes place when the ascending field exceeds one threshold value ($E_F$) and the material undergoes a switching from its non-polar state (AFE phase) into a positive polarization state (FE phase). This switching process is referred to as "field-induced-phase-transition" of an antiferroelectric material. The second switching takes place when the descending field reduces to another threshold value ($E_A$) less than the previous threshold value ($E_F$) and the material switches from its polar state (FE phase) to its non-polar state (AFE phase) (see FIG. 3B). Again, the same goes for a negative triangular excitation field but of opposite sign. Therefore, the material which exhibits antiferroelectricity has an I-E loop with four peaks (see FIG. 3A) and a double hysteresis P-E loops (see FIG. 3B).

Modulation of ferroelectricity or antiferroelectricity of a zirconium-containing oxide material is provided, which will be discussed in more detail below. Corresponding hysteresis loops are illustrated, as shown in FIGS. 4B, 4C, 4E, 6B, 6D-6F, 9B, 9D, 11B, 11D, 12B, 12D, 12F, 15B, 15D, 17B, 17D-17F where first curves 4P1, 4P2, 4P3, 6P1, 6P2, 6P3, 6P4, 9P1, 9P2, 11P1, 11P2, 12P1, 12P2, 12P3, 15P1, 15P2, 17P1, 17P2, 17P3 and 17P4 are depicted. The first curves are given in terms of the polarization charge in microcoulombs per squared centimeter versus the electric field in microvolts per centimeter, as for example, first curve 4P1 in FIG. 4B. Corresponding transient current-electric field (I-E) loops to ferroelectric structures are also illustrated in FIGS. 4B, 4C, 4E, 6B, 6D-6F, 9B, 9D, 11B, 11D, 12B, 12D, 12F, 15B, 15D, 17B, 17D-17F where second curves 4J1, 4J2, 4J3, 6J1, 6J2, 6J3, 6J4, 9J1, 9J2, 11J1, 11J2, 12J1, 12J2, 12J3, 15J1, 15J2, 17J1, 17J2, 17J3 and 17J4 are depicted. The second curves are given in terms of the current density in microamperes per squared micrometer versus the electric field in microvolts per centimeter, as for example, second curve 4J1 in FIG. 4B.

Figure 4A:
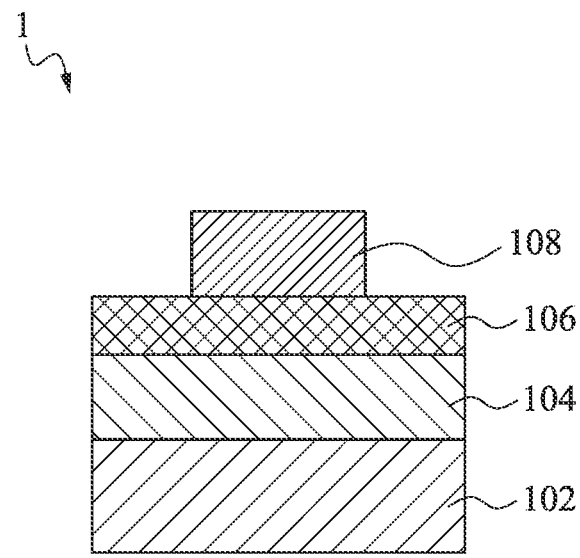
FIGS. 4A and 4D are examples of semiconductor structures in accordance with some embodiments of the present disclosure.

FIG. 4A is an example of a semiconductor structure 1 in accordance with some embodiments. As shown in FIG. 4A, a bottom electrode 104, a $ZrO_2$ layer 106 and a top electrode 108 are sequentially formed over a substrate 102. The bottom electrode 104, the $ZrO_2$ layer 106, and the top electrode 108, in combination, serve as a metal-insulator-metal (MIM) capacitor, wherein the bottom and top electrodes 104 and 108 are metal layers of the MIM capacitor, and the $ZrO_2$ layer 106 is a dielectric layer between the metal layers and has ferroelectricity or antiferroelectricity. In some embodiments, the bottom electrode 104 and/or top electrode 108 are made of Pt or other suitable metals. In some embodiments, the substrate 102 is made of silicon or other suitable semiconductors. The substrate 102 may be a silicon substrate with a p-type dopant (e.g., boron), for example.

The voltage across the MIM capacitor formed by the bottom electrode 104, a $ZrO_2$ layer 106, and a top electrode 108 is calculated from the equation derived from the Landua model for ferroelectrics: $V=(2\alpha Q+4\beta Q^3)*T$, where $\alpha$ and $\beta$ are anisotropy constant, Q is the surface charge density and T is the ferroelectric (or antiferroelectric) layer thickness. When imposing a voltage on the MIM capacitor, the voltage is amplified due to the induced negative voltage across the ferroelectric MIM capacitor, resulting in a sub-60 mV/decade subthreshold swing when the MIM capacitor is used in a transistor (i.e., NC-FET).

Figure 4B:
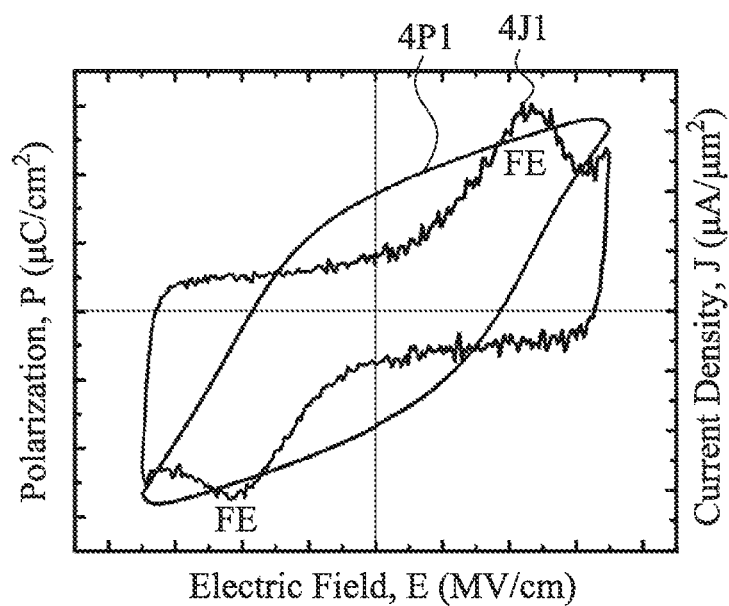
FIGS. 4B and 4C are charts of a polarization-electric field (P-E) hysteresis loop overlying a transient current-electric field (I-E) loop with respect to the semiconductor structures in FIG. 4A.
Figure 4C:
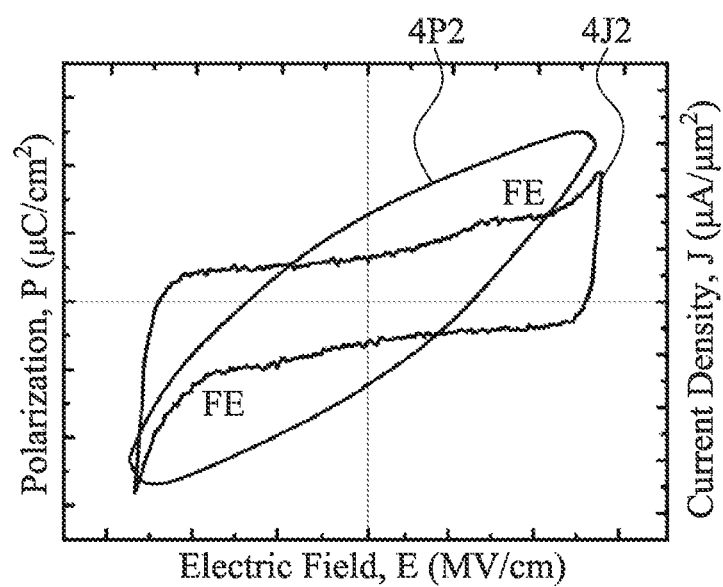

FIGS. 4B and 4C are charts of a polarization-electric field (P-E) hysteresis loop overlying a transient current-electric field (I-E) loop with respect to the semiconductor structure 1 having different $ZrO_2$ layer thicknesses. In greater detail, the chart as shown in FIG. 4B corresponds to the semiconductor structure 1 with a $ZrO_2$ layer 106 having a thickness of about 10.3 nm, and the chart as shown in FIG. 4C corresponds to the semiconductor structure 1 with the $ZrO_2$ layer 106 having a thickness of about 6.4 nm. Comparing curves 4P1, 4J1 in FIG. 4B with curves 4P2, 4J2 in FIG. 4C, the $ZrO_2$ layer 106 having a thickness of about 6.4 nm exhibits weaker ferroelectricity (e.g., smaller remanent polarization and wider distribution of the switching field) than that of the $ZrO_2$ layer 106 having a thickness of about 10.3 nm. Therefore, scaling down of the $ZrO_2$ layer 106 would result in weakened ferroelectricity, as shown in FIGS. 4B and 4C.

Figure 4D:
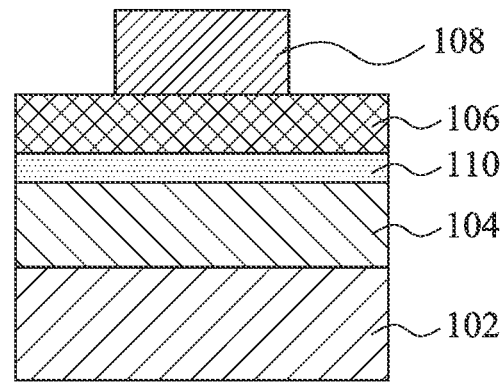
Figure 4E:
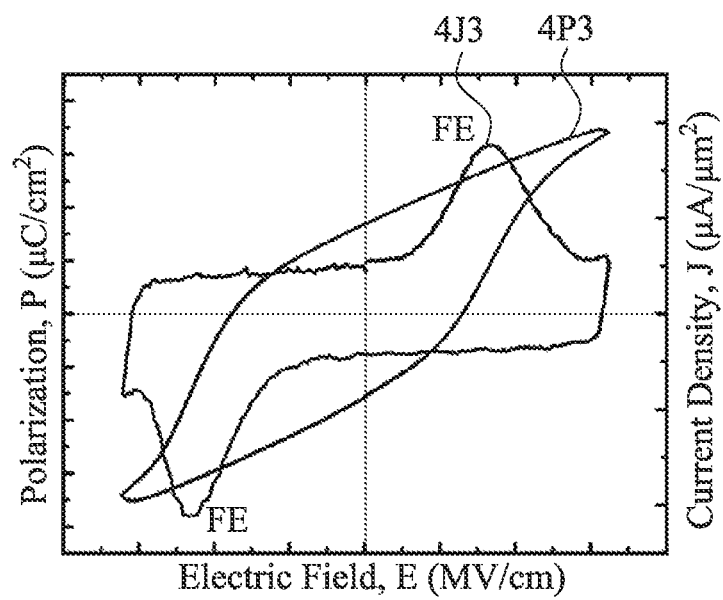
FIG. 4E is a chart of a polarization-electric field (P-E) hysteresis loop overlying a transient current-electric field (I-E) loop with respect to the semiconductor structure in FIG. 4D.

FIG. 4D shows another semiconductor structure 2 similar to the semiconductor structure 1, except for a seed layer 110 between the bottom electrode 104 and the $ZrO_2$ layer 106. In greater detail, the semiconductor structure 2 includes the seed layer 110 which is made of $HfO_2$ and under the $ZrO_2$ layer 106 having the thickness of 6.4 nm. FIG. 4E is a chart of a polarization-electric field (P-E) hysteresis loop overlying a transient current-electric field (I-E) loop with respect to the semiconductor structure 2. Comparing curves 4P3, 4J3 in FIG. 4E with curves 4P2, 4J2 in FIG. 4C, the ferroelectricity and the hysteresis behavior of the semiconductor structure 2 are enhanced (e.g., larger remanent polarization and narrower distribution of the switching field) as compared to the semiconductor structure 1 without the seed layer. Based on FIGS. 4B, 4C and 4E, it can be concluded that a thin $ZrO_2$ layer (with a thickness less than 10 nm) has unsatisfactory ferroelectricity, but a combined structure of an $HfO_2$ seed layer and the thin $ZrO_2$ layer deposited directly on the $HfO_2$ seed layer has an improved ferroelectricity. Moreover, the seed layer 110 has a thickness less than the $ZrO_2$ layer 106, so that a thickness of the combined structure of the layers 110 and 106 can be thin enough to meet satisfaction of scaling down. In some embodiments, the thickness of the seed layer 110 is in a range from about 1 nm to about 5 nm. For example, the seed layer 110 resulting in the chart shown in FIG. 4E has a thickness of about 2.3 nm.

Figure 5A:
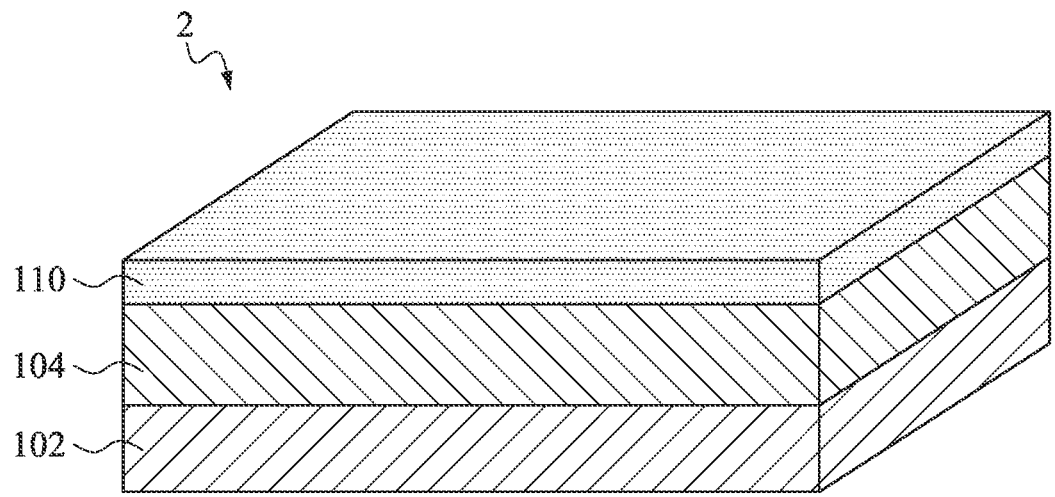
FIGS. 5A-5C illustrate fabrication of the semiconductor structure of FIG. 4D in accordance with some embodiments of the present disclosure.
Figure 5B:
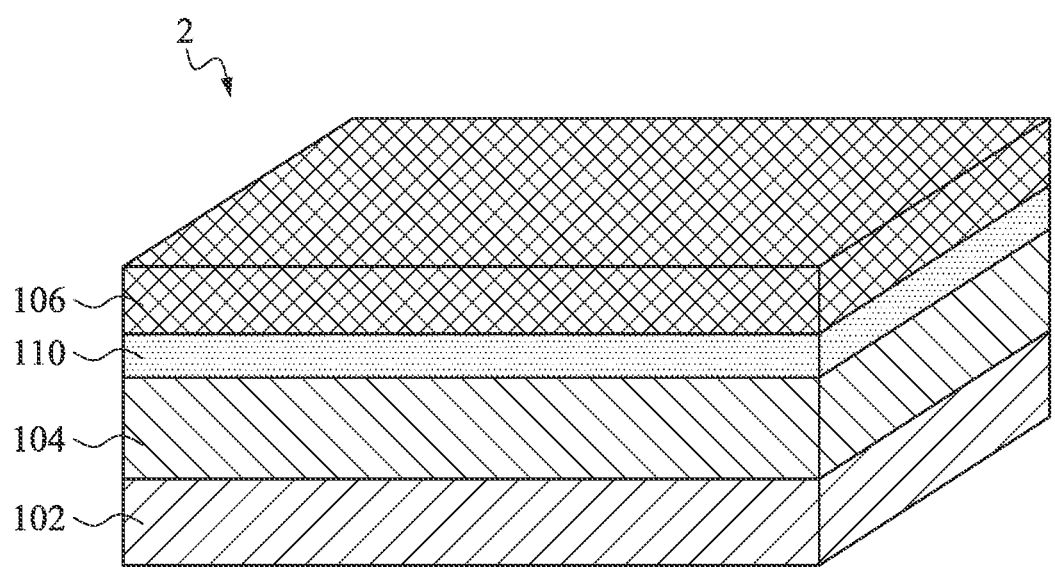
Figure 5C:
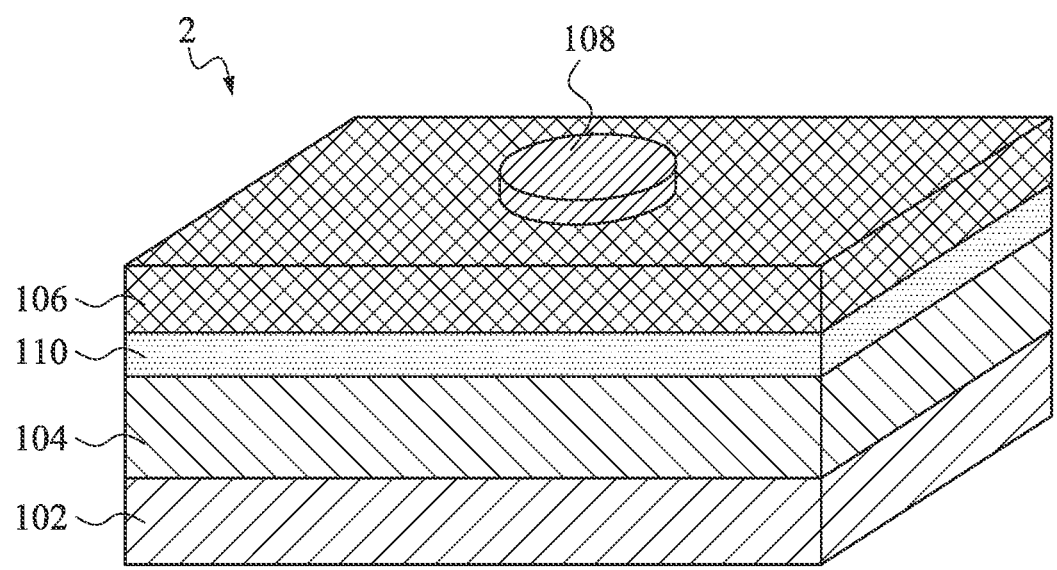

FIGS. 5A-5C illustrate fabrication of the semiconductor structure 2 of FIG. 4D in accordance with some embodiments of the present disclosure. As shown in FIG. 5A, the bottom electrode 104 is formed over the substrate 102, and the seed layer 110 is formed over the bottom electrode 104. In some embodiments, the bottom electrode 104 is made of Pt or other suitable conductive materials, and is formed using a suitable method such as plating, chemical vapor deposition (CVD), atomic layer deposition (ALD), physical vapor deposition (PVD), and/or combinations thereof.

In some embodiments where the seed layer 110 includes $HfO_2$, the $HfO_2$ seed layer 110 may be formed by plasma-enhanced atomic layer deposition (PEALD) utilizing a process temperature range from about 270° C. to about 500° C. If the process temperature is higher than about 500° C., the seed layer 110 may intermix with underlying materials (e.g., materials of the bottom electrode 104 and the substrate 102) due to interdiffusion of atoms at high temperature. If the process temperature is lower than about 270° C., the seed layer 110 may contain defects such as oxygen vacancies that will in turn degrade the performance and reliability of the ferroelectric devices. For example, the PEALD process uses tetrakis dimethyl amino hafnium (TDMAH or $Hf[N(CH_3)_2]_4$) and oxygen plasma as precursors for hafnium and oxygen, respectively.

As shown in FIG. 5B, the $ZrO_2$ layer 106 is formed over the as-deposited seed layer 110 using a suitable method, for example, chemical vapor deposition (CVD), atomic layer deposition (ALD), physical vapor deposition (PVD), and/or combinations thereof. In some embodiments, the $ZrO_2$ layer 106 may be formed by PEALD utilizing a process temperature range from about 270° C. to about 500° C. If the process temperature is higher than about 500° C., the seed layer 110 may intermix with $ZrO_2$ layer 106 due to interdiffusion of atoms at high temperature. If the process temperature is lower than about 270° C., the $ZrO_2$ layer 106 may be formed into crystalline phases that that will not contribute to ferroelectricity. For example, the PEALD process uses tetrakis (dimethylamino)zirconium (TDMAZ or $Zr[N(CH_3)_2]_4$) and oxygen plasma as precursors for zirconium and oxygen, respectively.

Deposition of the seed layer 110 and deposition of the $ZrO_2$ layer 106 are controlled such that the seed layer 110 has a thickness less than a thickness of the $ZrO_2$ layer 106, which in turn will be advantageous for scaling down the semiconductor structure 2 as well as improving the ferroelectricity of the $ZrO_2$ layer 106. For example, the seed layer 110 can be deposited on the bottom electrode 104 using ALD, and the resulting seed layer 110 has a thickness in a range from about 1 nm to about 5 nm. Moreover, the $ZrO_2$ layer 106 can be deposited on the seed layer 110 using ALD, and the $ZrO_2$ layer 106 has a thickness in a range from about 6.4 nm to about 10 nm.

As shown in FIG. 5C, the top electrode 108 is formed over the $ZrO_2$ layer 106. The top electrode 108 and the bottom electrode 104 may include the same material in some embodiments. For example, the top electrode 108 is made of Pt or other suitable conductive materials. The top electrode 108 is formed using a deposition process, followed by a patterning process. The deposition process includes chemical vapor deposition (CVD), atomic layer deposition (ALD), physical vapor deposition (PVD), and/or combinations thereof. The patterning process includes suitable lithography and etching techniques.

Figure 6A:
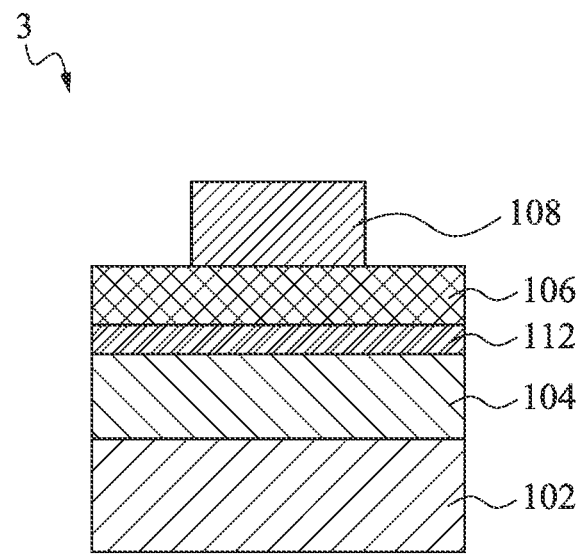
FIGS. 6A and 6C are examples of semiconductor structures in accordance with some embodiments of the present disclosure.
Figure 6B:
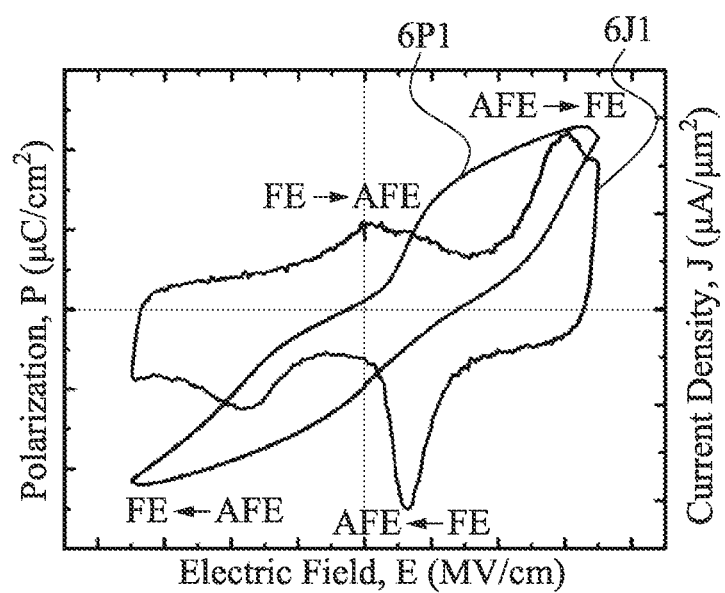
FIGS. 6B and 6D are charts of a polarization-electric field (P-E) hysteresis loop overlying a transient current-electric field (I-E) loop with respect to the semiconductor structures in FIGS. 6A and 6C, respectively.

FIG. 6A shows another semiconductor structure 3 similar to the semiconductor structure 2, except for a seed layer 112 made of $TiO_2$, instead of $HfO_2$. In greater detail, the semiconductor structure 3 includes the $ZrO_2$ layer 106 and the $TiO_2$ seed layer 112 over the $ZrO_2$ layer 106. The $ZrO_2$ layer 106 has a thickness of about 6.4 nm, and the $TiO_2$ seed layer 112 has a thickness of about 4.5 nm. FIG. 6B is a chart of a polarization-electric field (P-E) hysteresis loop overlying a transient current-electric field (I-E) loop with respect to semiconductor structure 3. The curves 6P1 and 6J1 in FIG. 6B show that a ferroelectric to antiferroelectric phase transition is induced in the $ZrO_2$ layer 106 by incorporating the $TiO_2$ seed layer 112. Therefore, the $ZrO_2$ layer 106 with the underlying $TiO_2$ seed layer 112 exhibits antiferroelectricity.

Figure 6C:
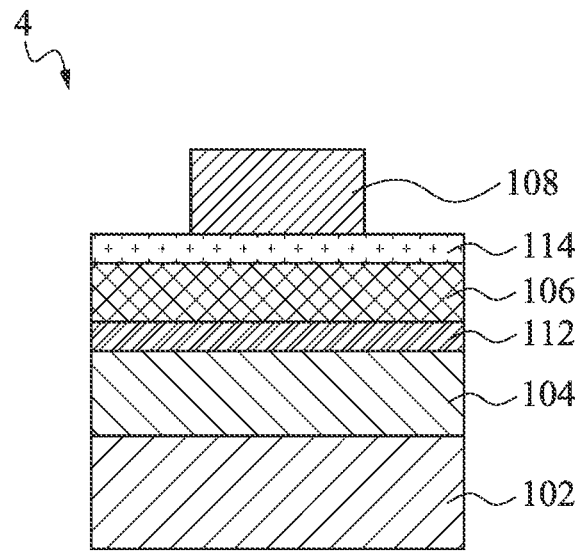
Figure 6D:
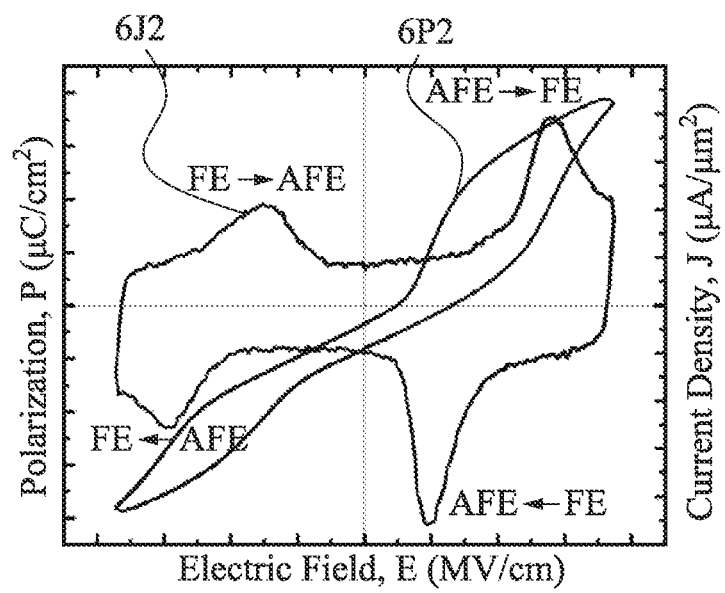

FIG. 6C shows another semiconductor structure 4 similar to the semiconductor structure 3, except for a capping layer 114 between the $ZrO_2$ layer 106 and the top electrode 108. In greater detail, the semiconductor structure 4 includes the capping layer 114 made of $TiO_2$ and having a thickness of about 2.7 nm. Moreover, the thickness of the $TiO_2$ seed layer 112 in the semiconductor structure 4 is substantially the same as the thickness of the $TiO_2$ capping layer 114. For example, the thickness of the $TiO_2$ seed layer 112 is about 2.7 nm. FIG. 6D is a chart of a polarization-electric field (P-E) hysteresis loop overlying a transient current-electric field (I-E) loop with respect to the semiconductor structure 4. The curves 6P2 and 6J2 in FIG. 6D show that a ferroelectric to antiferroelectric phase transition is induced in the $ZrO_2$ layer 106 by incorporating the $TiO_2$ capping layer. Stated differently, the $ZrO_2$ layer 106 between two $TiO_2$ layers 112 and 114 can exhibit antiferroelectricity.

Figure 6E:
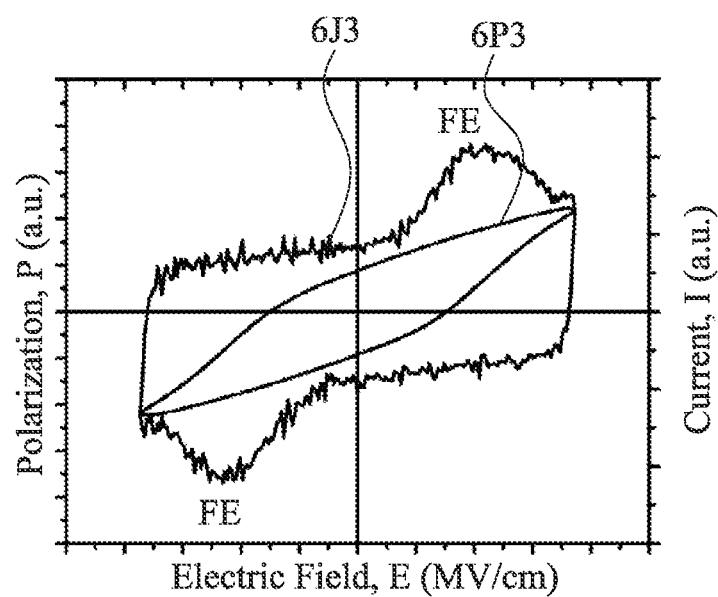
FIGS. 6E and 6F are a polarization-electric field (P-E) hysteresis loop overlying a transient current-electric field (I-E) loop with respect to the semiconductor structures in FIGS. 4A and 6C, respectively.
Figure 6F:
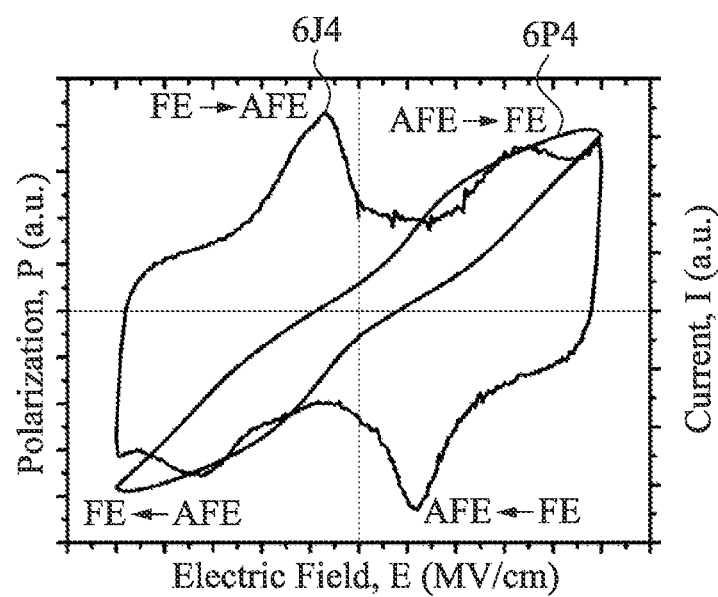

FIG. 6E is a chart of a polarization-electric field (P-E) hysteresis loop overlying a transient current-electric field (I-E) loop with respect to another example of the semiconductor structure 1 shown in FIG. 4A. In greater detail, the semiconductor structure 1 associated with the chart of FIG. 6E includes the $ZrO_2$ layer having a thickness of about 12 nm. FIG. 6F is a chart of a polarization-electric field (P-E) hysteresis loop overlying a transient current-electric field (I-E) loop with respect to another example of the semiconductor structure 4. In greater detail, the semiconductor structure 4 associated with FIG. 6F includes the $ZrO_2$ layer having a thickness of about 12 nm, the $TiO_2$ seed layer 112 having a thickness of about 5.7 nm, and the $TiO_2$ capping layer 114 having a thickness of about 5.7 nm. Comparing curves 6P3, 6J3 in FIG. 6E with curves 6P4, 6J4 in FIG. 6F, when the $ZrO_2$ layer has a thickness of about 12 nm, the $TiO_2$ seed layer having a thickness of about 5.7 nm and $TiO_2$ capping layer having a thickness of about 5.7 nm can enhance the ferroelectricity and the hysteresis behavior.

Figure 7A:
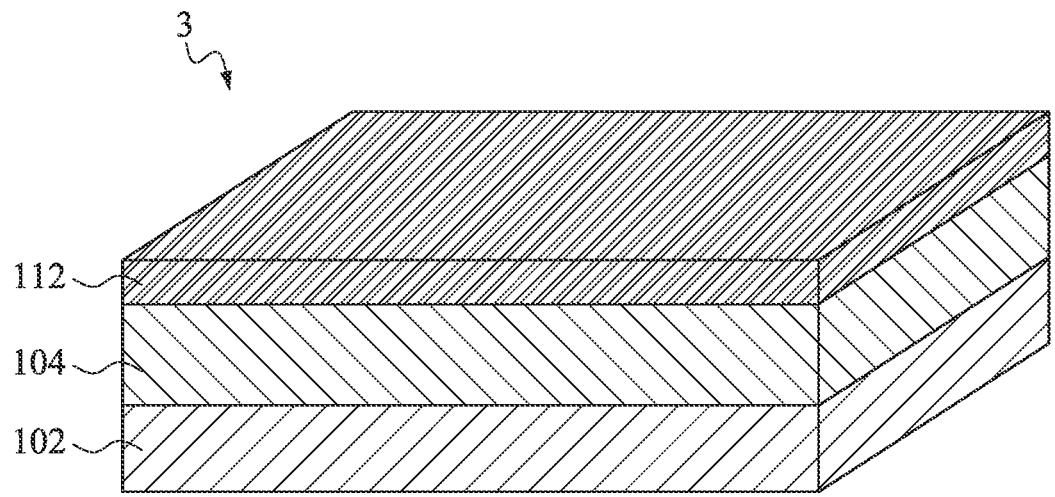
FIGS. 7A-7C illustrate fabrication of the semiconductor structure of FIG. 6A in accordance with some embodiments of the present disclosure.
Figure 7B:
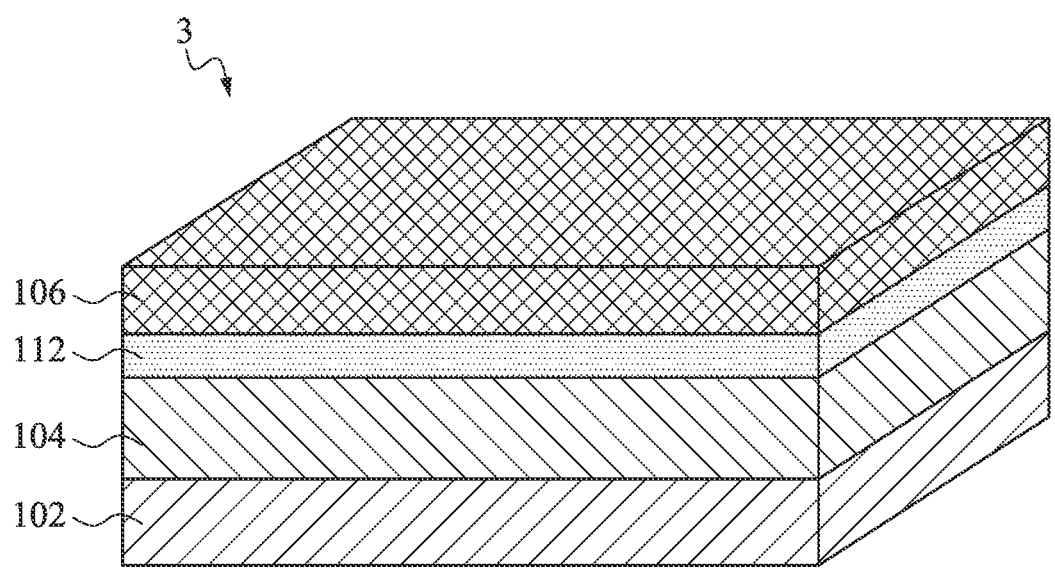
Figure 7C:
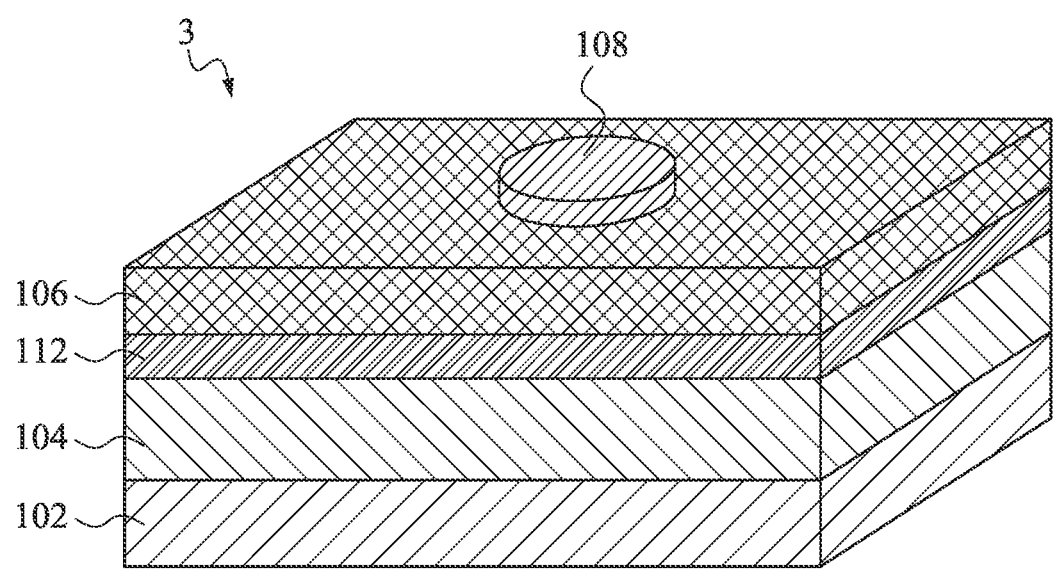

FIGS. 7A-7C illustrate fabrication of the semiconductor structure 3 of FIG. 6A in accordance with some embodiments of the present disclosure. As shown in FIG. 7A, the bottom electrode 104 is formed over the substrate 102, and the seed layer 112 is formed over the bottom electrode 104. In some embodiments, the bottom electrode 104 is made of Pt or other suitable conductive materials, and is formed using a suitable method, as discussed previously with respect to FIG. 5A.

In some embodiments where the seed layer 112 includes $TiO_2$, the $TiO_2$ seed layer 112 may be formed by PEALD utilizing a process temperature range from about 270° C. to about 500° C. If the process temperature is higher than about 500° C., the seed layer 112 may intermix with underlying materials (e.g., materials of the bottom electrode 104 and the substrate 102) due to interdiffusion of atoms at high temperature. If the process temperature is lower than about 270° C., the seed layer 112 may contain defects such as oxygen vacancies that will in turn degrade the performance and reliability of the ferroelectric devices. For example, in some embodiments, the PEALD process uses tetrakis-dimethyl-amino-titanium (TDMAT or $Ti[N(CH_3)_2]_4$), titanium tetrachloride ($TiCl_4$), titanium methoxide $(Ti(OMe)_4$ where Me is a methyl group) as a precursor for titanium, and uses oxygen plasma as a precursor for oxygen.

As shown in FIG. 7B, the $ZrO_2$ layer 106 is formed over the as-deposited $TiO_2$ seed layer 112 using a suitable method, as discussed previously with respect to FIG. 5B.

Deposition of the $TiO_2$ seed layer 112 and deposition of the $ZrO_2$ layer 106 are controlled such that the $TiO_2$ seed layer 112 has a thickness less than a thickness of the $ZrO_2$ layer 106, which in turn will be advantageous for scaling down the semiconductor structure 3 as well as improving the ferroelectricity.

As shown in FIG. 7C, the top electrode 108 is formed over the $ZrO_2$ layer 106. The top electrode 108 and the bottom electrode 104 may include the same material in some embodiments. For example, the top electrode 108 is made of Pt or other suitable conductive materials. The top electrode 108 is formed using a deposition process, followed by a patterning process, as discussed previously with respect to FIG. 5C.

Figure 8A:
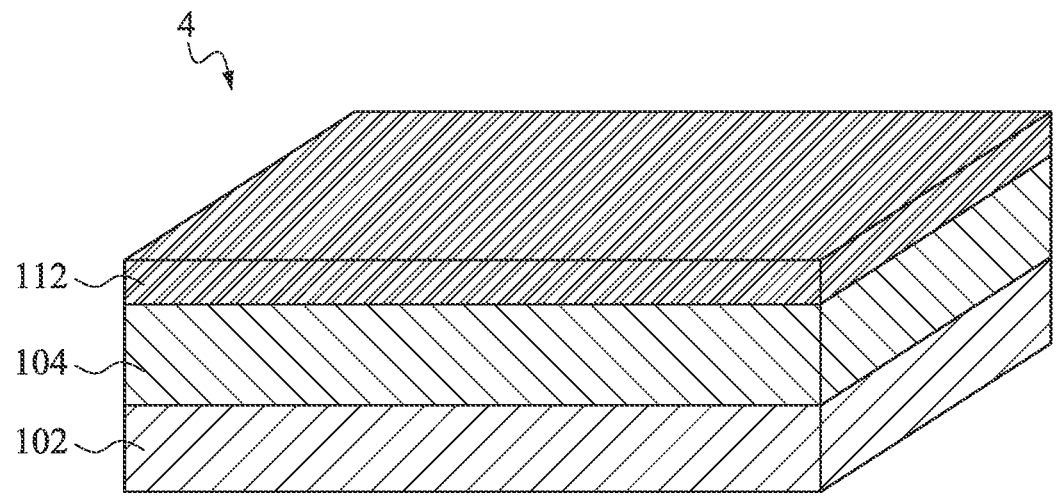
FIGS. 8A-8D illustrate fabrication of the semiconductor structure of FIG. 6C in accordance with some embodiments of the present disclosure.

FIGS. 8A-8D illustrate fabrication of the semiconductor structure 4 of FIG. 6C in accordance with some embodiments of the present disclosure. As shown in FIG. 8A, the bottom electrode 104 is formed over the substrate 102, and the seed layer 112 is formed over the bottom electrode 104. In some embodiments, the bottom electrode 104 is made of Pt or other suitable conductive materials, and is formed using a suitable method, as discussed previously with respect to FIG. 5A.

In some embodiments where the seed layer 112 includes $TiO_2$, the $TiO_2$ seed layer 112 may be formed by PEALD at a suitable temperature using suitable precursors, as discussed previously with respect to FIG. 7A.

Figure 8B:
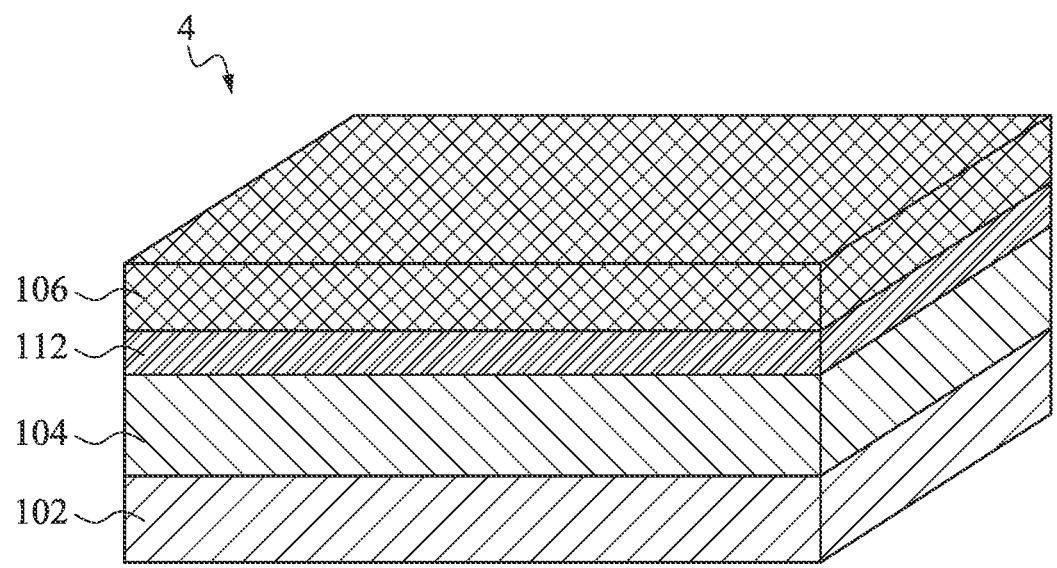

As shown in FIG. 8B, the $ZrO_2$ layer 106 is formed over the $TiO_2$ seed layer 112 using a suitable method, as discussed previously with respect to FIG. 5B.

Figure 8C:
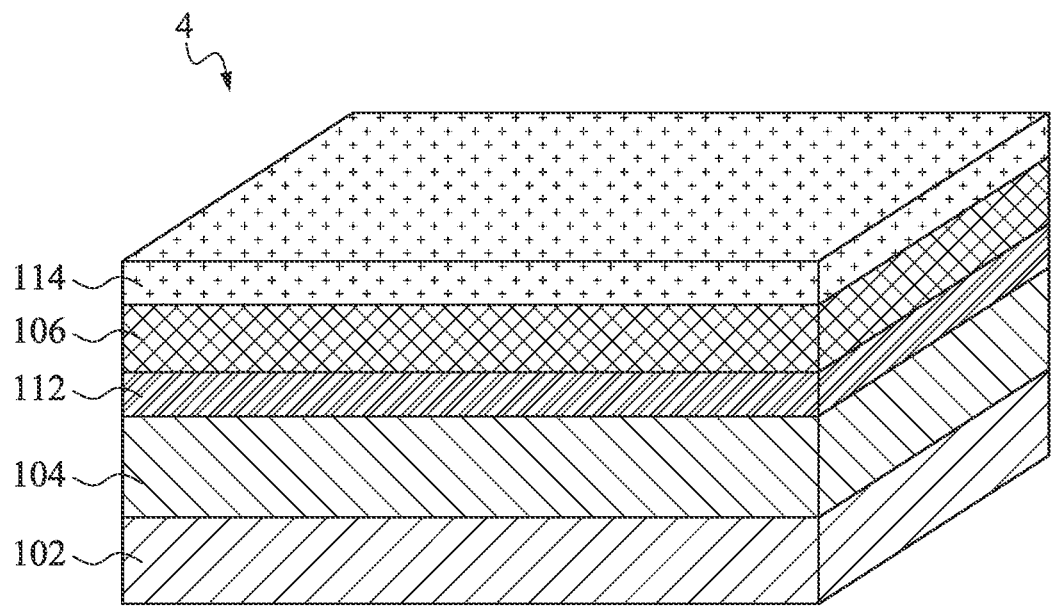

As shown in FIG. 8C, the capping layer 114 is then formed over the $ZrO_2$ layer 106. In some embodiments where the capping layer 114 includes $TiO_2$, the deposition condition (e.g., temperature and/or precursors) of the capping layer 114 is substantially the same as that of the $TiO_2$ seed layer 112. For example, the $TiO_2$ capping layer 114 may be formed by PEALD utilizing a process temperature range from about 270° C. to about 500° C. If the process temperature is higher than about 500° C., the $TiO_2$ capping layer 114 may intermix with the $ZrO_2$ layer 106 due to interdiffusion of atoms at high temperature. If the process temperature is lower than about 270° C., the $TiO_2$ capping layer 114 may contain defects such as oxygen vacancies that will in turn degrade the performance and reliability of the ferroelectric devices. For example, in some embodiments, the PEALD process uses tetrakis-dimethyl-amino-titanium (TDMAT or $Ti[N(CH_3)_2]_4$), titanium tetrachloride ($TiCl_4$), titanium methoxide ($Ti(OMe)_4$ where Me is a methyl group) as a precursor for titanium, and uses oxygen plasma as a precursor for oxygen.

Figure 8D:
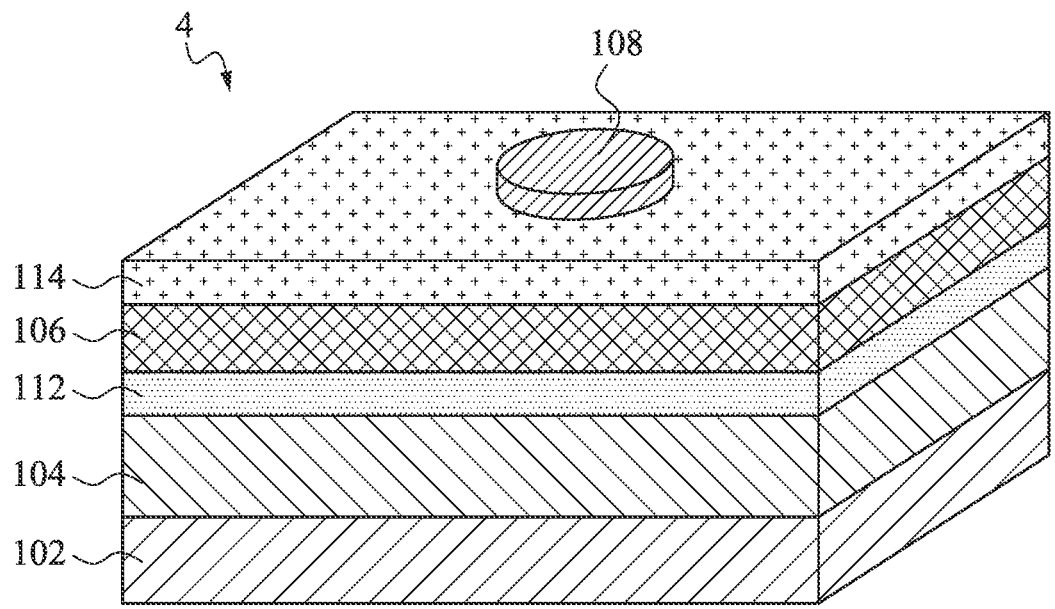

As shown in FIG. 8D, the top electrode 108 is formed over the $TiO_2$ capping layer 114. The top electrode 108 and the bottom electrode 104 may include the same material in some embodiments. For example, the top electrode 108 is made of Pt or other suitable conductive materials. The top electrode 108 is formed using a deposition process, followed by a patterning process, as discussed previously with respect to FIG. 5C.

Figure 9A:
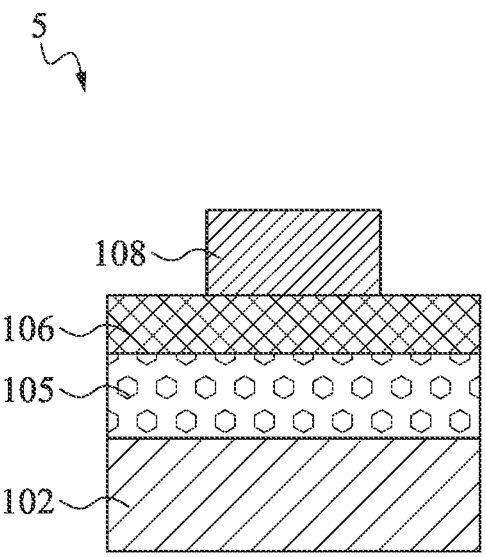
FIGS. 9A and 9C are examples of semiconductor structures in accordance with some embodiments of the present disclosure.
Figure 9B:
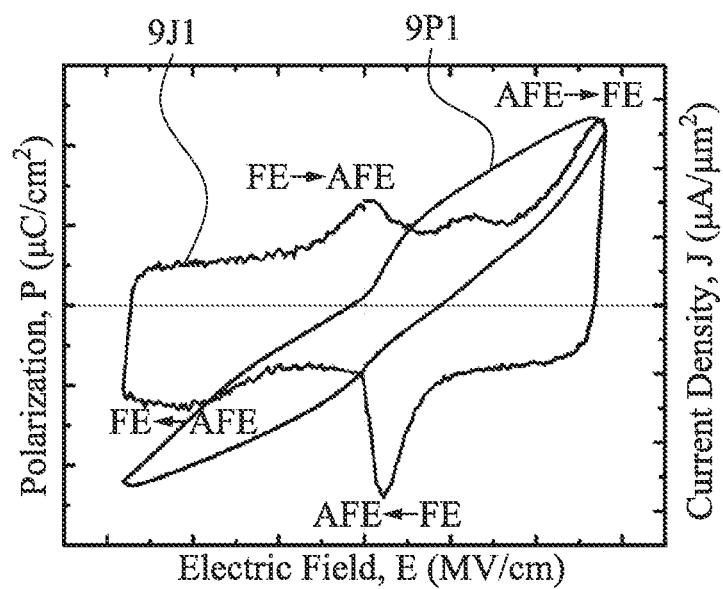
FIGS. 9B and 9D are charts of a polarization-electric field (P-E) hysteresis loop overlying a transient current-electric field (I-E) loop with respect to the semiconductor structures in FIGS. 9A and 9C, respectively.

FIG. 9A shows another semiconductor structure 5 similar to the semiconductor structure 1, except for the bottom electrode 105 made of TiN, instead of Pt. In greater detail, the semiconductor structure 5 includes the $ZrO_2$ layer 106 deposited on the TiN bottom electrode 105 and having a thickness of about 6.4 nm. FIG. 9B is a chart of a polarization-electric field (P-E) hysteresis loop overlying a transient current-electric filed (I-E) loop with respect to the semiconductor structure 5.

Figure 9C:
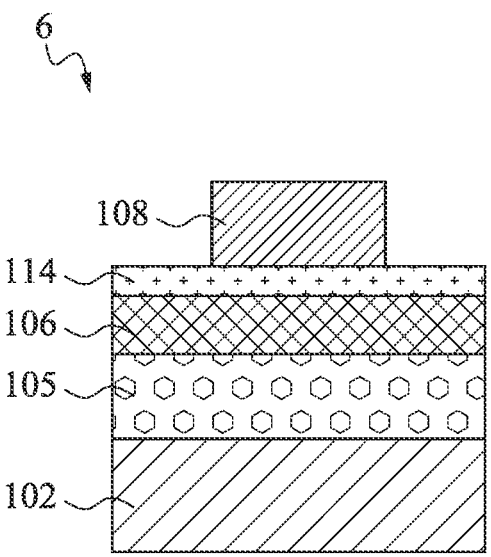
Figure 9D:
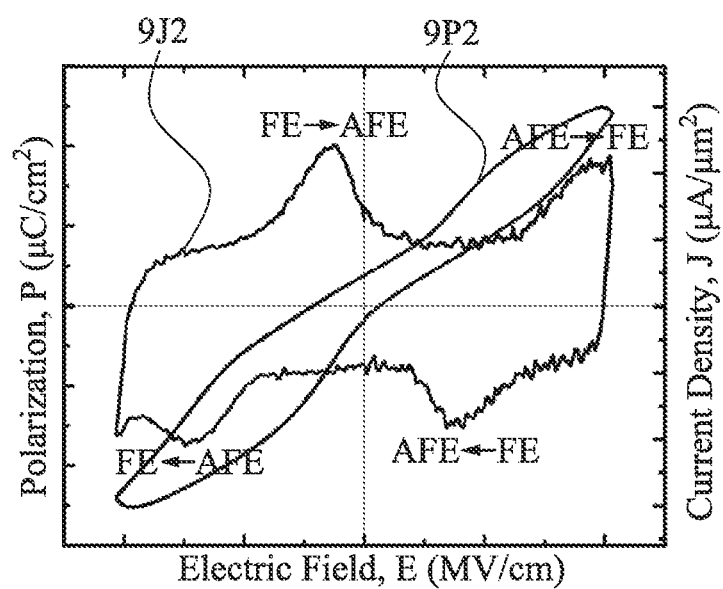

FIG. 9C shows another semiconductor structure 6 similar to the semiconductor structure 5, except for the capping layer 114 between the $ZrO_2$ layer 106 and the top electrode 108. In greater detail, the semiconductor structure 6 includes the $ZrO_2$ layer 106 and the capping layer 114 over the $ZrO_2$ layer 106. The $ZrO_2$ layer 106 has a thickness of about 6.4 nm. The capping layer 114 is made of $TiO_2$ and has a thickness of about 5.7 nm. FIG. 9D is a chart of a polarization-electric field (P-E) loop with respect to the semiconductor structure 6. Comparing curves 9P1, 9J1 in FIG. 9B with curves 9P2, 9J2 in FIG. 9D, by incorporating the $TiO_2$ capping layer 114, the antiferroelectricity and the hysteresis behavior of the semiconductor structure 6 are enhanced as compared to the semiconductor structure 5 without the $TiO_2$ capping layer 114.

Figure 10A:
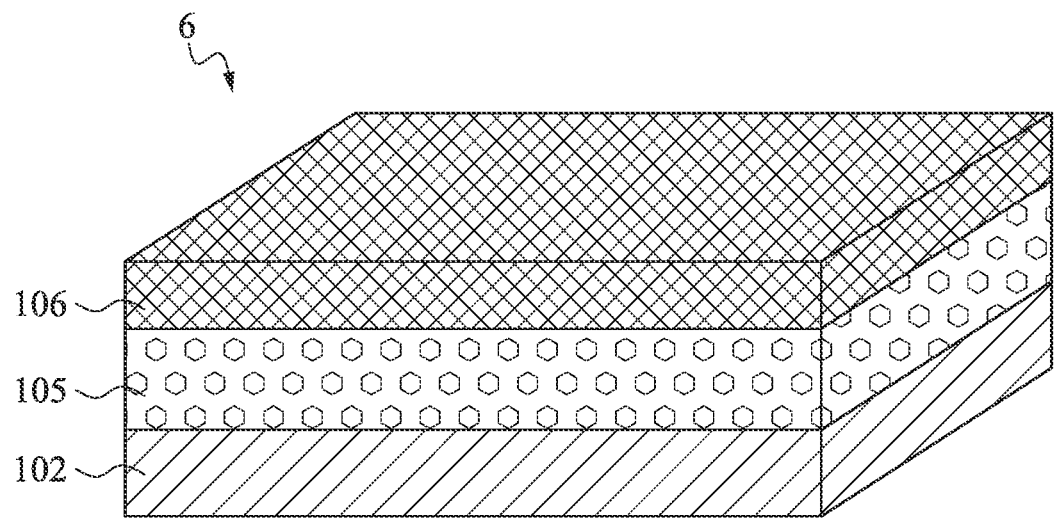
FIGS. 10A-10C illustrate fabrication of the semiconductor structure of FIG. 9C in accordance with some embodiments of the present disclosure.
Figure 10B:
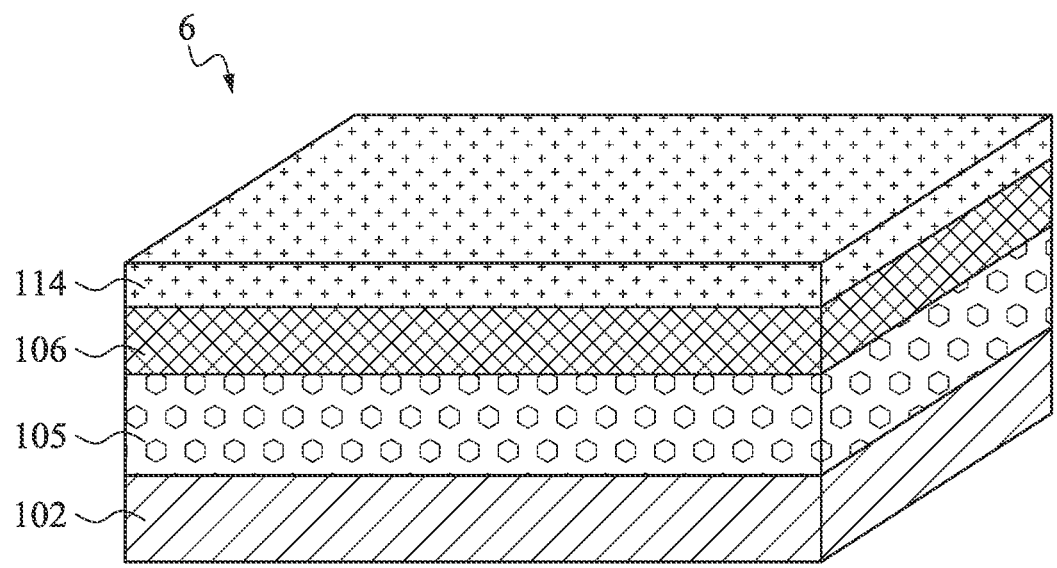
Figure 10C:
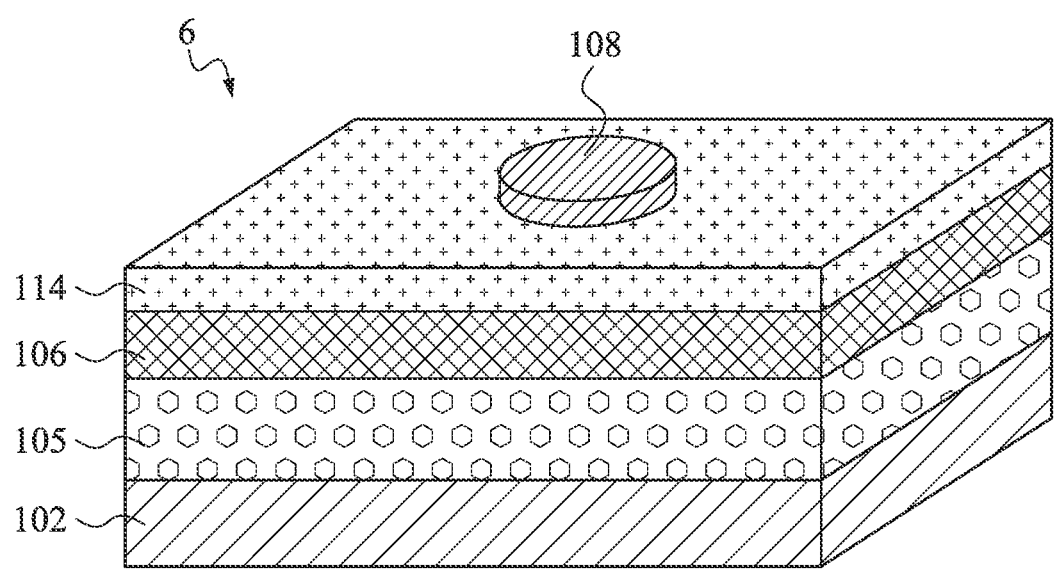

FIGS. 10A-10C illustrate fabrication of the semiconductor structure 6 of FIG. 9C in accordance with some embodiments of the present disclosure. As shown in FIG. 10A, the bottom electrode 105 is formed over the substrate 102, and the $ZrO_2$ layer 106 is formed over the bottom electrode 104. In this embodiment, the bottom electrode 105 is made of TiN and formed using a suitable method such as plating, chemical vapor deposition (CVD), atomic layer deposition (ALD), physical vapor deposition (PVD), and/or combinations thereof.

As shown in FIG. 10A, the $ZrO_2$ layer 106 is formed over the bottom electrode 105 using a suitable method, as discussed previously with respect to FIG. 5B.

As shown in FIG. 10B, the capping layer 114 is formed over the $ZrO_2$ layer 106. In some embodiments where the capping layer 114 includes $TiO_2$, the $TiO_2$ capping layer 114 may be formed by PEALD, as discussed previously with respect to FIG. 8C.

Deposition of the $TiO_2$ capping layer 114 and deposition of the $ZrO_2$ layer 106 are controlled such that the $TiO_2$ capping layer 114 has a thickness less than a thickness of the $ZrO_2$ layer 106, which in turn will be advantageous for scaling down the semiconductor structure 6 as well as improving the antiferroelectricity of the $ZrO_2$ layer 106. For example, the capping layer 114 and the $ZrO_2$ layer 106 can be deposited using ALD, the resulting capping layer 114 has a thickness in a range from about 1 nm to about 6 nm, and the $ZrO_2$ layer 106 has a thickness greater than 6 nm.

As shown in FIG. 10C, the top electrode 108 is formed over the capping layer 114. The top electrode 108 may include different material than the bottom electrode 105. For example, the top electrode 108 includes Pt and the bottom electrode 105 includes TiN. In other embodiments, the top electrode 108 may include same material as the bottom electrode 105. For example, the top electrode 108 includes TiN and the bottom electrode 105 also includes TiN. The top electrode 108 is formed using a deposition process, followed by a patterning process, as discussed previously with respect to FIG. 5C.

Figure 11A:
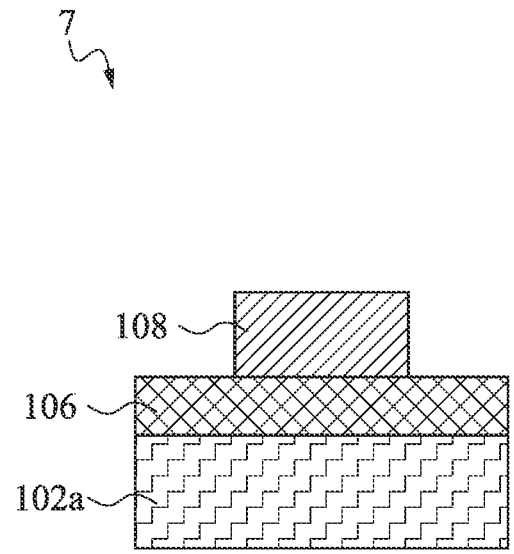
FIGS. 11A and 11C are examples of semiconductor structures in accordance with some embodiments of the present disclosure.
Figure 11B:
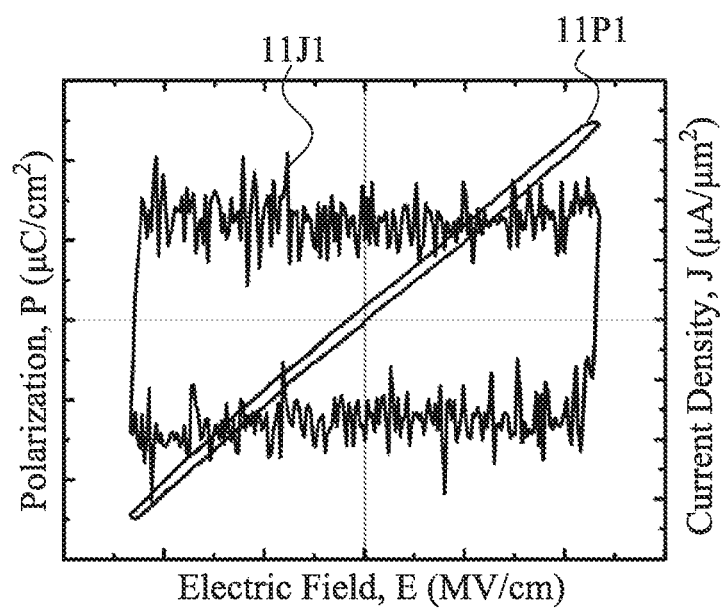
FIGS. 11B and 11D are charts of a polarization-electric field (P-E) hysteresis loop overlying a transient current-electric field (I-E) loop with respect to the semiconductor structures in FIGS. 11A and 11C, respectively.

FIG. 11A shows another semiconductor structure 7 similar to the semiconductor structure 1, except for omitting the bottom electrode 104. In greater detail, the semiconductor structure 7 includes a substrate 102a with heavily doped p-type dopants (e.g., boron) in contact with a bottom surface of the $ZrO_2$ layer 106. The heavily doped substrate 102a can act as a conductor and thus serve as a bottom electrode due to the heavy dopant concentration. In some embodiments, the $ZrO_2$ layer 106 has a thickness of about 6.4 nm. FIG. 11B is a chart of a polarization-electric field (P-E) hysteresis loop overlying a transient current-electric field (I-E) loop with respect to the semiconductor structure 7. The curves 11P1 and 11J1 in FIG. 11B show that the $ZrO_2$ layer 106 in contact with the heavily doped substrate 102a exhibits a paraelectric characteristic.

Figure 11C:
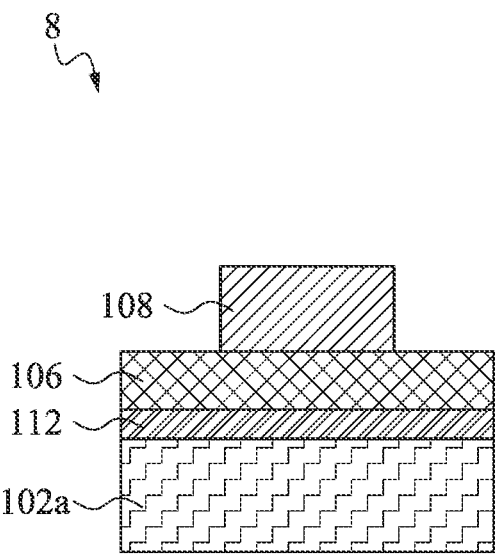
Figure 11D:
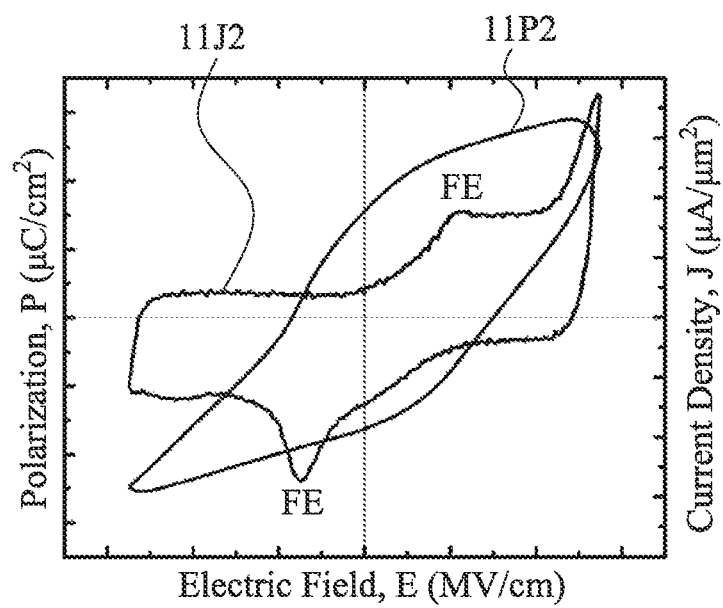

FIG. 11C shows another semiconductor structure 8 similar to the semiconductor structure 7, except for the seed layer 112 between the substrate 102a and the $ZrO_2$ layer 106. In some embodiments, the seed layer 112 is made of $TiO_2$ and has a thickness of about 2.7 nm. FIG. 11D is a chart of a polarization-electric field (P-E) hysteresis loop overlying a transient current-electric field (I-E) loop with respect to semiconductor structure 8. The curves 11P2 and 11J2 in FIG. 11D show that a paraelectric to ferroelectric phase transition is induced in the $ZrO_2$ layer 106 by incorporating the $TiO_2$ seed layer 112. That is, the $TiO_2$ seed layer 112 between the $ZrO_2$ layer 106 and the heavily doped substrate 102a can result in ferroelectricity for the $ZrO_2$ layer 106.

Figure 12A:
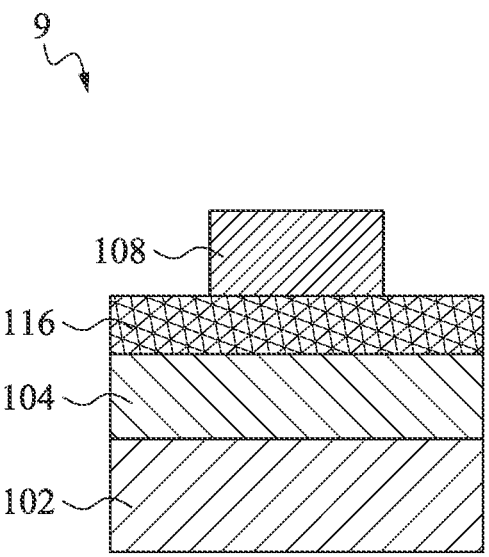
FIGS. 12A, 12C and 12E are examples of semiconductor structures in accordance with some embodiments of the present disclosure.
Figure 12B:
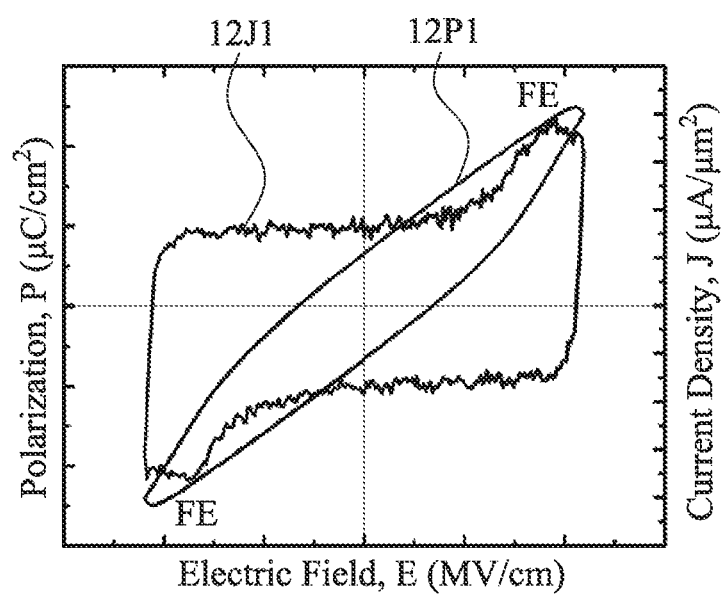
FIGS. 12B, 12D and 12F are charts of a polarization-electric field (P-E) hysteresis loop overlying a transient current-electric field (I-E) loop with respect to the semiconductor structures in FIGS. 12A, 12C and 12E, respectively.

FIG. 12A shows a semiconductor structure 9 in accordance with some embodiments. As shown in FIG. 12A, a bottom electrode 104, a $Hf_{0.5}Zr_{0.5}O_2$ layer 116 and a top electrode 108 are sequentially formed over a substrate 102. In some embodiments, the $Hf_{0.5}Zr_{0.5}O_2$ layer 116 has a thickness of about 11.9 nm. The bottom electrode 104, the $Hf_{0.5}Zr_{0.5}O_2$ layer 116, and the top electrode 108 are in combination serve as an MIM capacitor, wherein the $Hf_{0.5}Zr_{0.5}O_2$ layer 116 is a dielectric layer between the metal layers 104 and 108 and has ferroelectricity or antiferroelectricity. FIG. 12B is a chart of a polarization-electric field (P-E) hysteresis loop overlying a transient current-electric field (I-E) loop with respect to semiconductor structure 9.

Figure 12C:
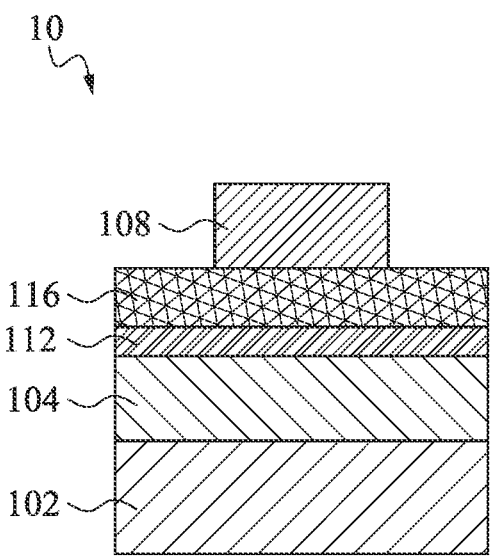
Figure 12D:
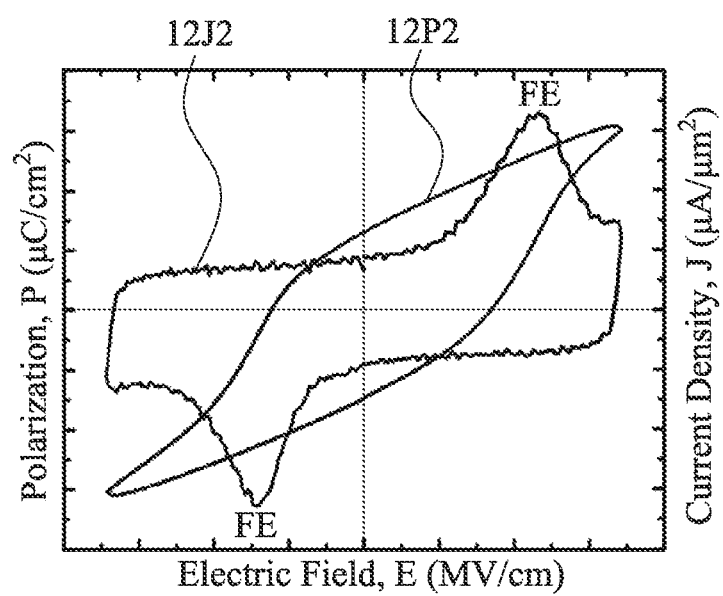

FIG. 12C shows another semiconductor structure 10 similar to the semiconductor structure 9, except for the $TiO_2$ seed layer 112 between the bottom electrode 104 and the $Hf_{0.5}Zr_{0.5}O_2$ layer 116. In greater detail, the $Hf_{0.5}Zr_{0.5}O_2$ layer 116 has a thickness of about 11.9 nm, and the $TiO_2$ seed layer 112 has a thickness of about 2.7 nm. FIG. 12D is a chart of a polarization-electric field (P-E) hysteresis loop overlying a transient current-electric field (I-E) loop with respect to semiconductor structure 10. Comparing curves 12P1, 12J1 in FIG. 12B with curves 12P2, 12J2 in FIG. 12D, the ferroelectricity and the hysteresis behavior of the semiconductor structure 10 with the $TiO_2$ seed layer 112 are enhanced as compared to the semiconductor structure 9 without the $TiO_2$ seed layer.

Figure 12E:
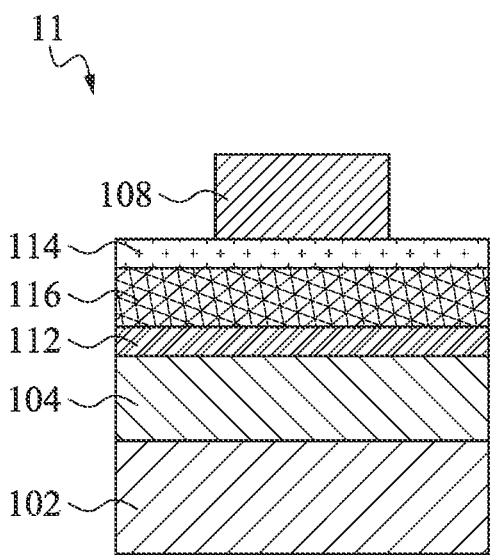
Figure 12F:
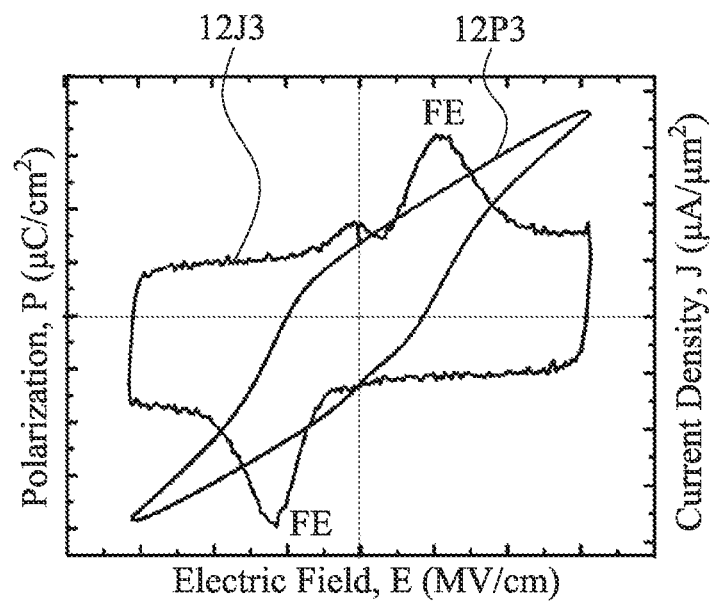

FIG. 12E shows another semiconductor structure 11 similar to the semiconductor structure 10, except for the $TiO_2$ capping layer 114 between the $Hf_{0.5}Zr_{0.5}O_2$ layer 116 and the top electrode 108. In greater detail, the $Hf_{0.5}Zr_{0.5}O_2$ layer 116 has a thickness of about 11.9 nm, the $TiO_2$ seed layer 112 has a thickness of about 2.7 nm, and the $TiO_2$ capping layer 114 has a thickness of about 2.7 nm. FIG. 12F is a chart of a polarization-electric field (P-E) hysteresis loop overlying a transient current-electric field (I-E) loop with respect to semiconductor structure 11. Comparing curves 12P1, 12J1 in FIG. 12B with curves 12P3, 12J3 in FIG. 12F, the ferroelectricity and the hysteresis behavior of the semiconductor structure 11 with the $TiO_2$ capping layer 114 and the $TiO_2$ seed layer 112 are enhanced as compared to the semiconductor structure 9 without the $TiO_2$ capping and seed layers.

Figure 13A:
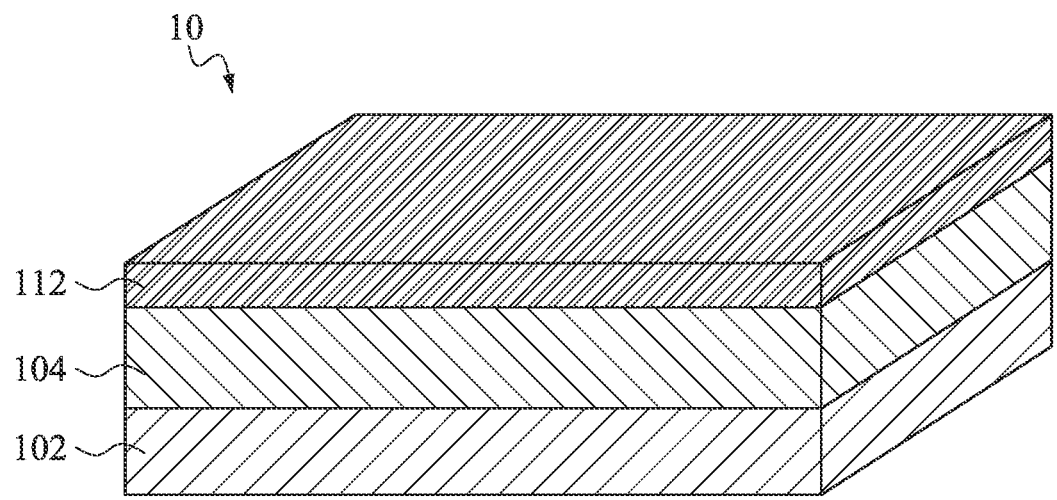
FIGS. 13A-13C illustrate fabrication of the semiconductor structure of FIG. 12C in accordance with some embodiments of the present disclosure.
Figure 13B:
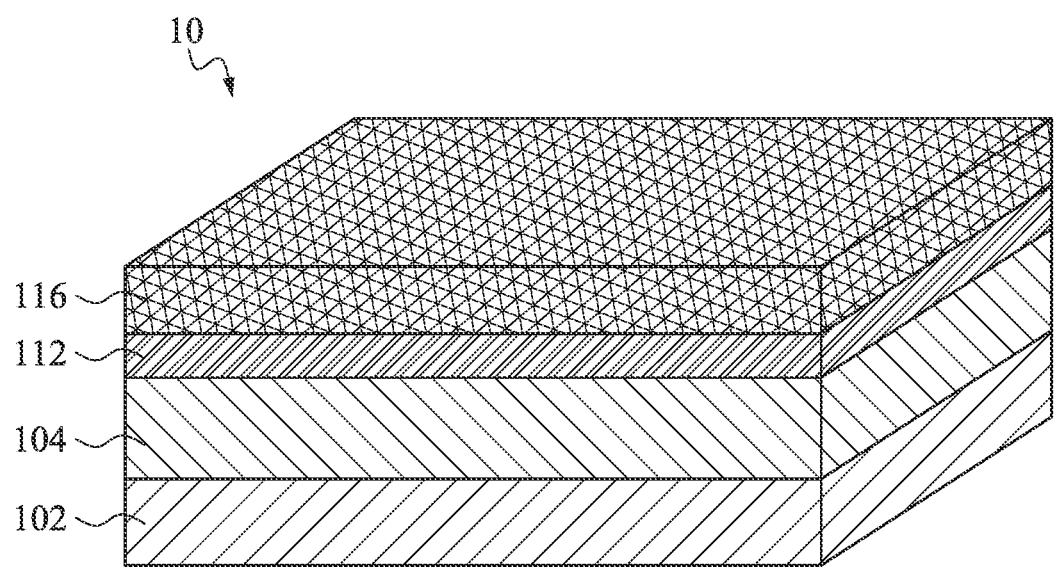
Figure 13C:
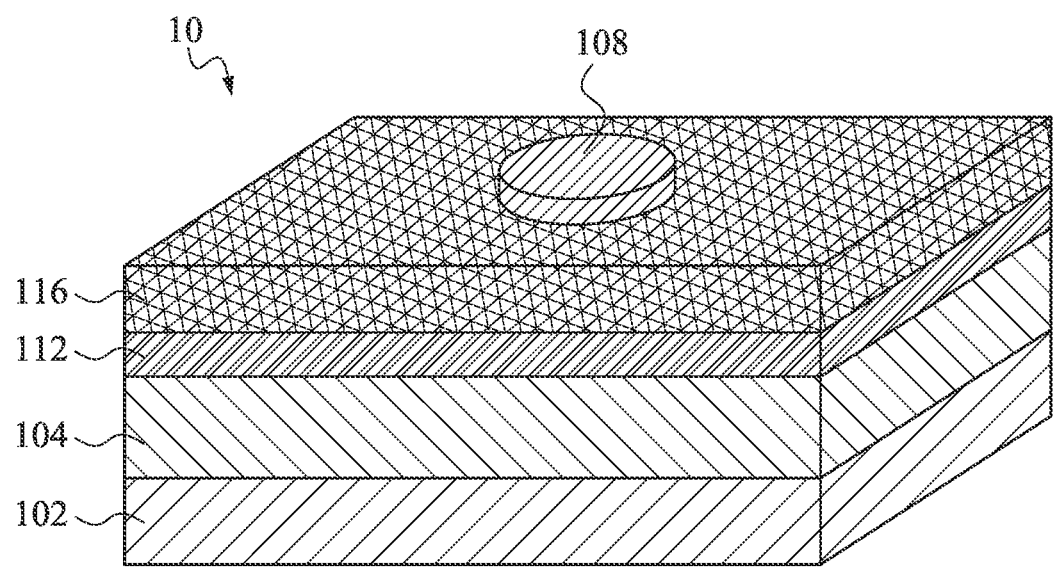

FIGS. 13A-13C illustrate fabrication of the semiconductor structure 10 of FIG. 12C in accordance with some embodiments of the present disclosure. As shown in FIG. 13A, the bottom electrode 104 is formed over the substrate 102, and the seed layer 112 is formed over the bottom electrode 104. In some embodiments, the bottom electrode 104 is made of Pt or other suitable conductive materials, and is formed using a suitable method, as discussed previously with respect to FIG. 5A.

In some embodiments where the seed layer 112 includes $TiO_2$, the $TiO_2$ seed layer 112 may be formed by PEALD at a suitable temperature using suitable precursors, as discussed previously with respect to FIG. 7A.

As shown in FIG. 13B, the $Hf_{0.5}Zr_{0.5}O_2$ layer 116 is formed over the as-deposited seed layer 112 using a suitable method, for example, chemical vapor deposition (CVD), atomic layer deposition (ALD), physical vapor deposition (PVD), and/or combinations thereof. In some embodiments, the $Hf_{0.5}Zr_{0.5}O_2$ layer 116 may be formed by PEALD utilizing a process temperature range from about 270° C. to about 500° C. If the process temperature is higher than about 500° C., the $Hf_{0.5}Zr_{0.5}O_2$ layer 116 may be formed into crystalline phases that will not contribute to ferroelectricity. If the process temperature is lower than about 270° C., the $Hf_{0.5}Zr_{0.5}O_2$ layer 116 will not have sufficient crystallinity to show ferroelectric properties. For example, in some embodiments, the PEALD process uses tetrakis(dimethylamino) zirconium (TDMAZ, $Zr[N(CH_3)_2]_4$) as a precursor for zirconium, tetrakis dimethyl amino hafnium (TDMAH or $Hf[N(CH_3)_2]_4$) as a precursor for hafnium, and oxygen plasma as a precursor for oxygen.

Deposition of the $TiO_2$ seed layer 112 and deposition of the $Hf_{0.5}Zr_{0.5}O_2$ layer 116 are controlled such that the seed layer 112 has a thickness less than a thickness of the $Hf_{0.5}Zr_{0.5}O_2$ layer 116, which in turn will be advantageous for scaling down the semiconductor structure 10 as well as improving the ferroelectricity. For example, the seed layer 112 and the bottom electrode 104 can be deposited using ALD, and the resulting seed layer 112 has a thickness in a range from about 1 nm to about 5 nm, and the $Hf_{0.5}Zr_{0.5}O_2$ layer 116 has a thickness in a range from about 5 nm to about 12 nm.

As shown in FIG. 13C, the top electrode 108 is formed over the $Hf_{0.5}Zr_{0.5}O_2$ layer 116. The top electrode 108 and the bottom electrode 104 may include the same material in some embodiments. For example, the top electrode 108 includes or is made of Pt or other suitable conductive materials. The top electrode 108 is formed using a deposition process, followed by a patterning process, as discussed previously with respect to FIG. 5C.

Figure 14A:
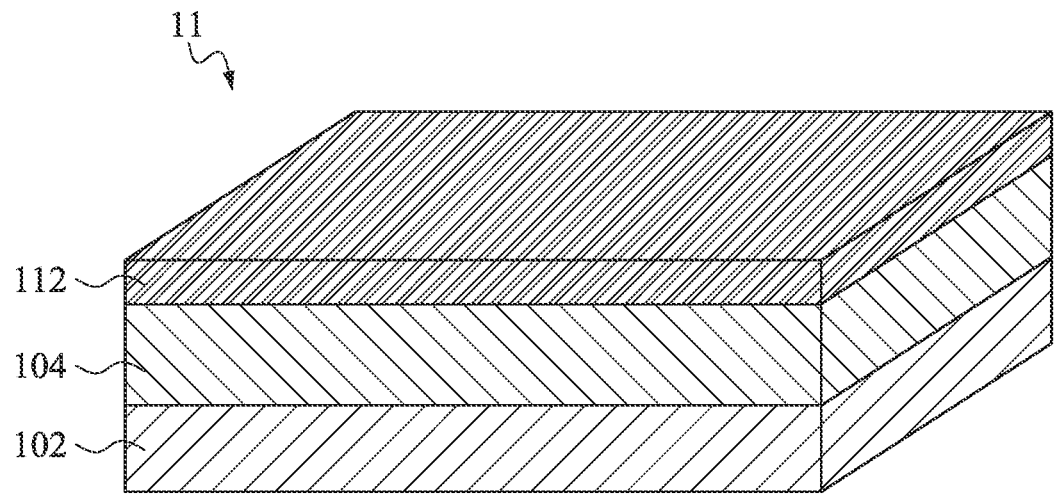
FIGS. 14A-14D illustrate fabrication of the semiconductor structure of FIG. 12E in accordance with some embodiments of the present disclosure.

FIGS. 14A-14D illustrate fabrication of the semiconductor structure 11 of FIG. 12E in accordance with some embodiments of the present disclosure. As shown in FIG. 14A, the bottom electrode 104 is formed over the substrate 102, and the seed layer 112 is formed over the bottom electrode 104. In some embodiments, the bottom electrode 104 is made of Pt or other suitable conductive materials, and is formed using a suitable method, as discussed previously with respect to FIG. 5A.

In some embodiments where the seed layer 112 includes $TiO_2$, the $TiO_2$ seed layer 112 may be formed by PEALD at a suitable temperature using suitable precursors, as discussed previously with respect to FIG. 7A.

Figure 14B:
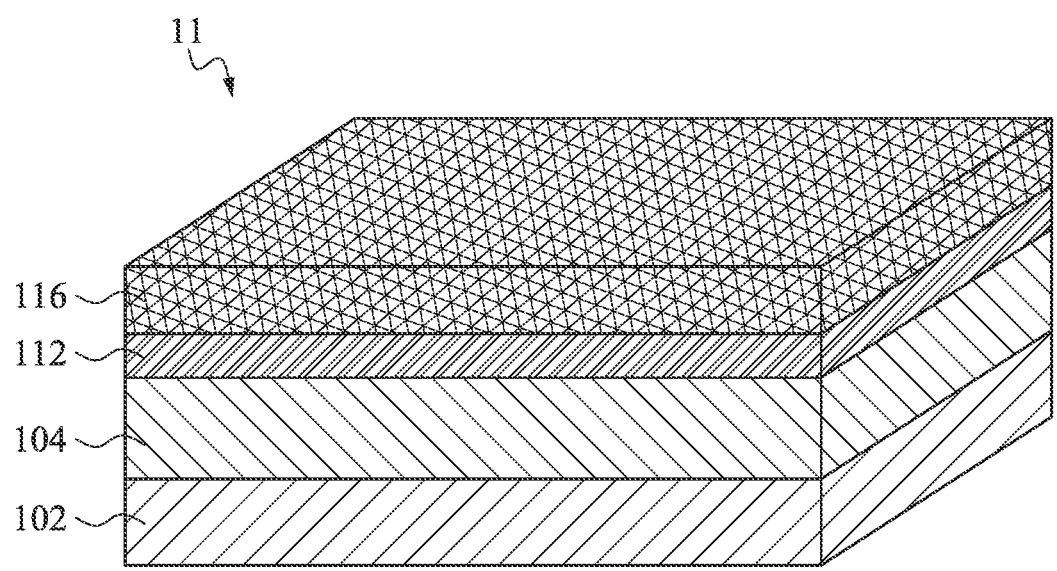

As shown in FIG. 14B, the $Hf_{0.5}Zr_{0.5}O_2$ layer 116 is formed over the as-deposited seed layer 112 using PEALD at a suitable temperature using suitable precursors, as discussed previously with respect to FIG. 13B.

Figure 14C:
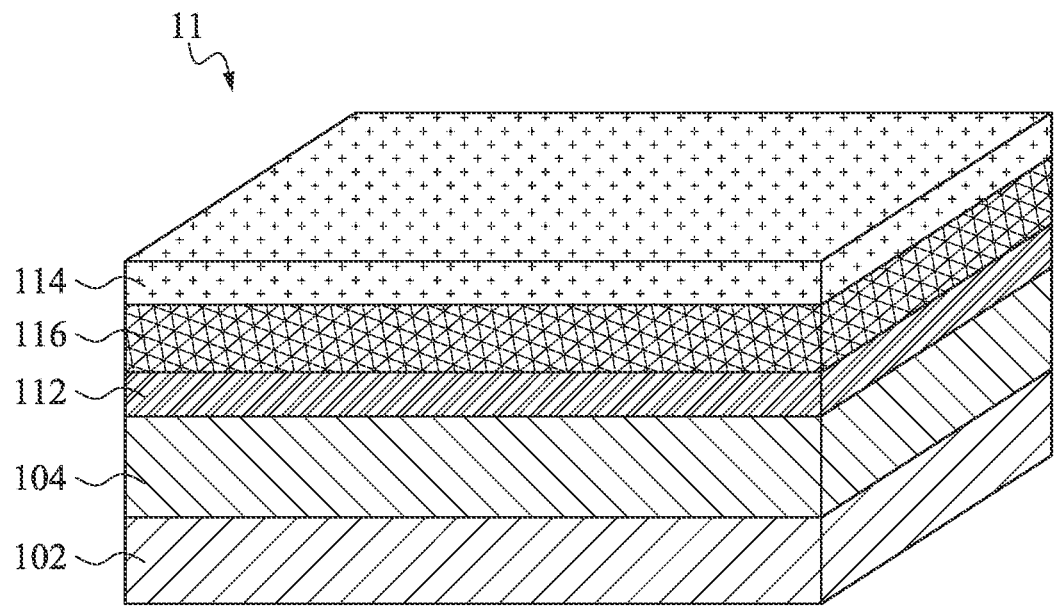

As shown in FIG. 14C, the capping layer 114 is formed over the $Hf_{0.5}Zr_{0.5}O_2$ layer 116. In some embodiments where the capping layer 114 includes $TiO_2$, the $TiO_2$ capping layer 114 may be formed by PEALD at a suitable temperature using suitable precursors, as discussed previously with respect to FIG. 8C.

Deposition of the seed layer 112, capping layer 114 and deposition of the $Hf_{0.5}Zr_{0.5}O_2$ layer 116 are controlled such that the $TiO_2$ seed layer 112 and the $TiO_2$ capping layer 114 have thicknesses less than a thickness of the $Hf_{0.5}Zr_{0.5}O_2$ layer 116, which in turn will be advantageous for scaling down the semiconductor structure 11 as well as improving the ferroelectricity.

Figure 14D:
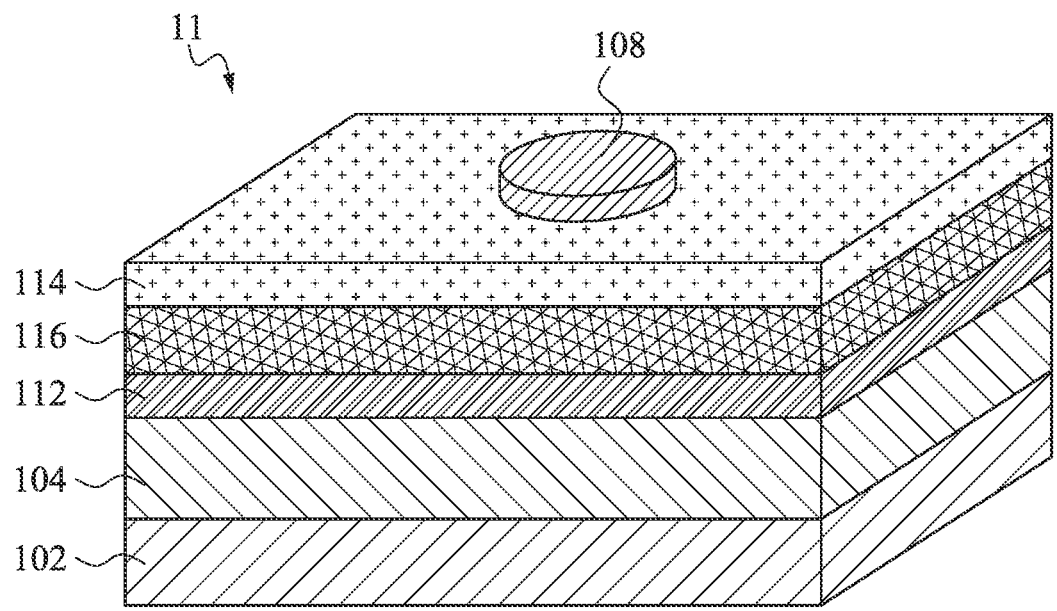

As shown in FIG. 14D, the top electrode 108 is formed over $TiO_2$ capping layer 114. The top electrode 108 and the bottom electrode 104 may include the same material in some embodiments. For example, the top electrode 108 is made of Pt or other suitable conductive materials. The top electrode 108 is formed using a deposition process, followed by a patterning process, as discussed previously with respect to FIG. 5C.

Figure 15A:
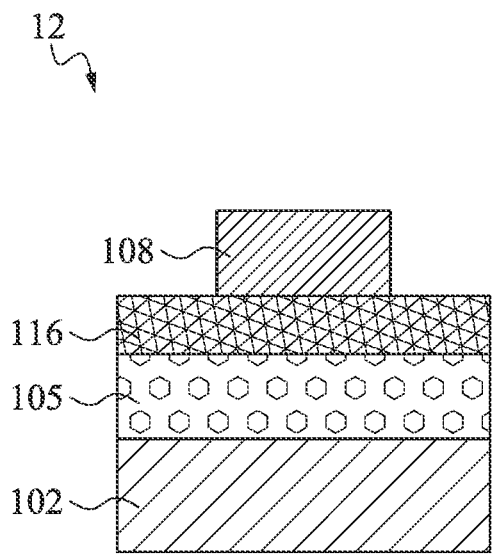
FIGS. 15A and 15C are examples of semiconductor structures in accordance with some embodiments of the present disclosure.
Figure 15B:
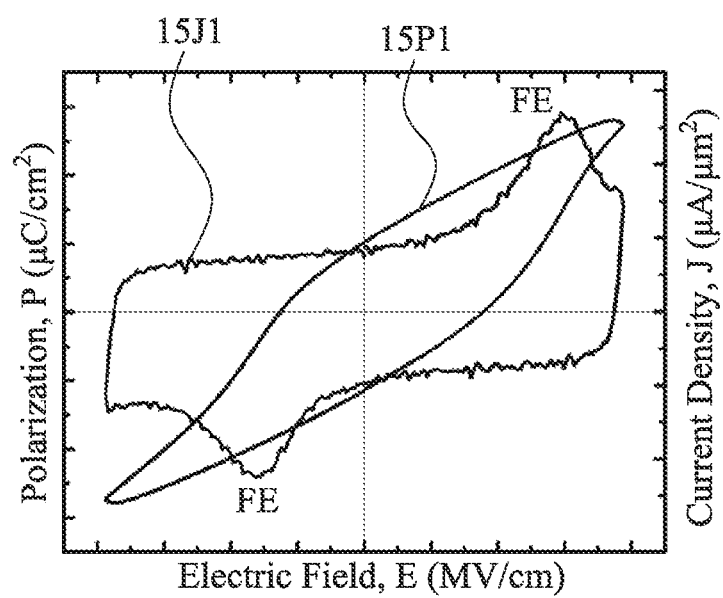
FIGS. 15B and 15D are charts of a polarization-electric field (P-E) hysteresis loop overlying a transient current-electric field (I-E) loop with respect to the semiconductor structures in FIGS. 15A and 15C, respectively.

FIG. 15A shows another semiconductor structure 12 similar to the semiconductor structure 9, except for the bottom electrode 105 made of TiN, instead of Pt. FIG. 15B is a chart of a polarization-electric field (P-E) hysteresis loop overlying a transient current-electric field (I-E) loop with respect to semiconductor structure 12.

Figure 15C:
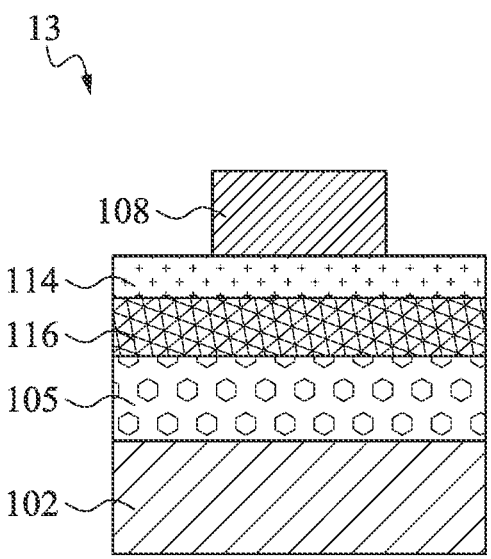
Figure 15D:
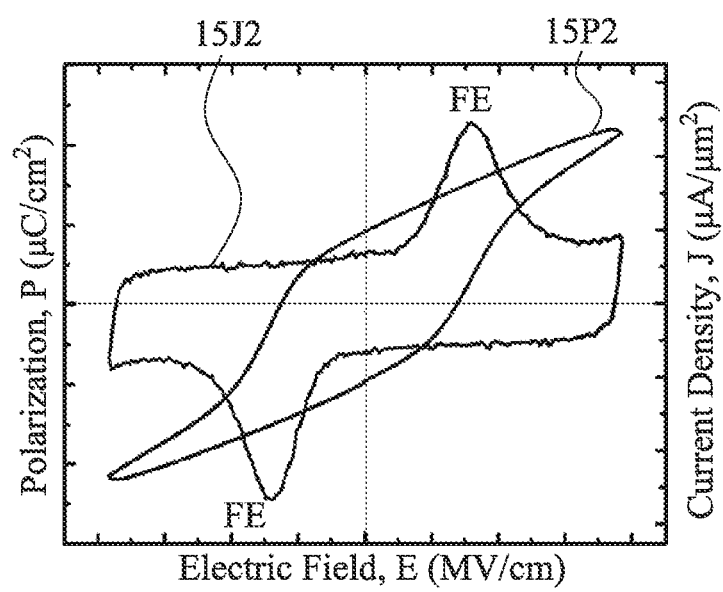

FIG. 15C shows another semiconductor structure 13 similar to the semiconductor structure 12, except for the $TiO_2$ capping layer 114 between the $Hf_{0.5}Zr_{0.5}O_2$ layer 116 and the top electrode 108. In some embodiments, the $Hf_{0.5}Zr_{0.5}O_2$ layer 116 has a thickness of about 11.9 nm, and the $TiO_2$ capping layer 114 has a thickness of about 2.7 nm. FIG. 15D is a chart of a polarization-electric field (P-E) hysteresis loop overlying a transient current-electric field (I-E) loop with respect to semiconductor structure 13. Comparing curves 15P1, 15J1 in FIG. 15B with curves 15P2, 15J2 in FIG. 15D, the ferroelectricity and the hysteresis behavior of the semiconductor structure 13 with the $TiO_2$ capping layer 114 are enhanced as compared to the semiconductor structure 12 without the $TiO_2$ capping layer.

Figure 16A:
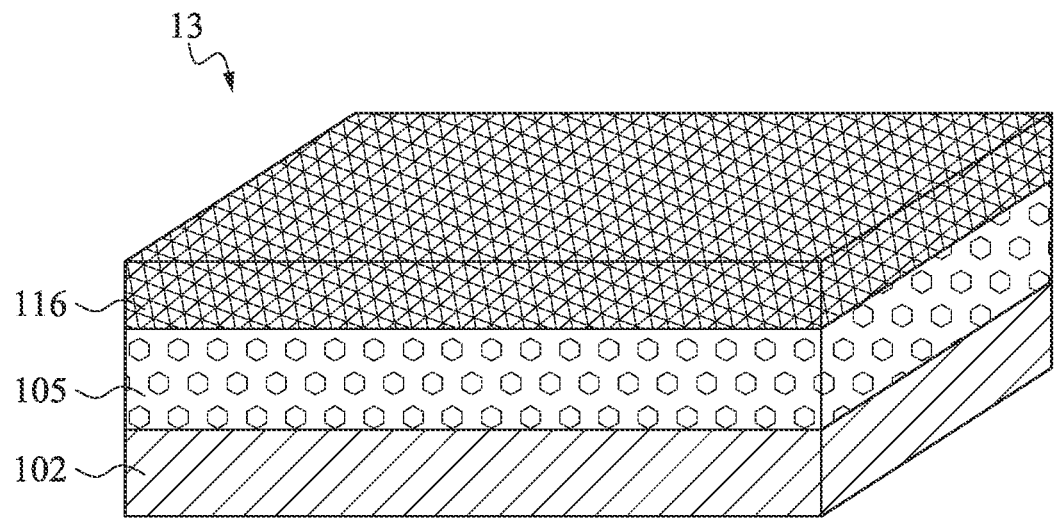
FIGS. 16A-16C illustrate fabrication of the semiconductor structure of FIG. 15C in accordance with some embodiments of the present disclosure.
Figure 16B:
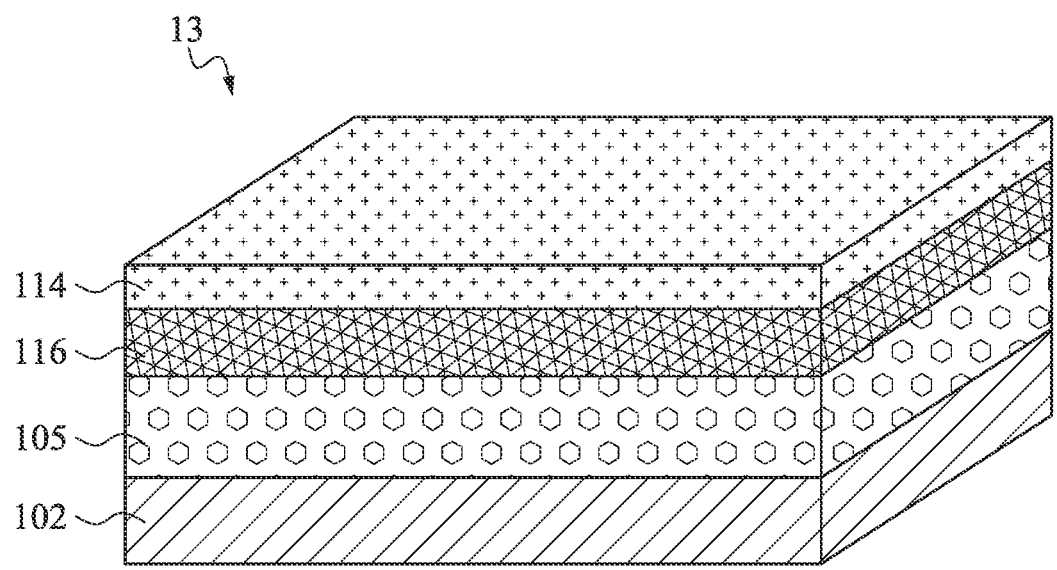
Figure 16C:
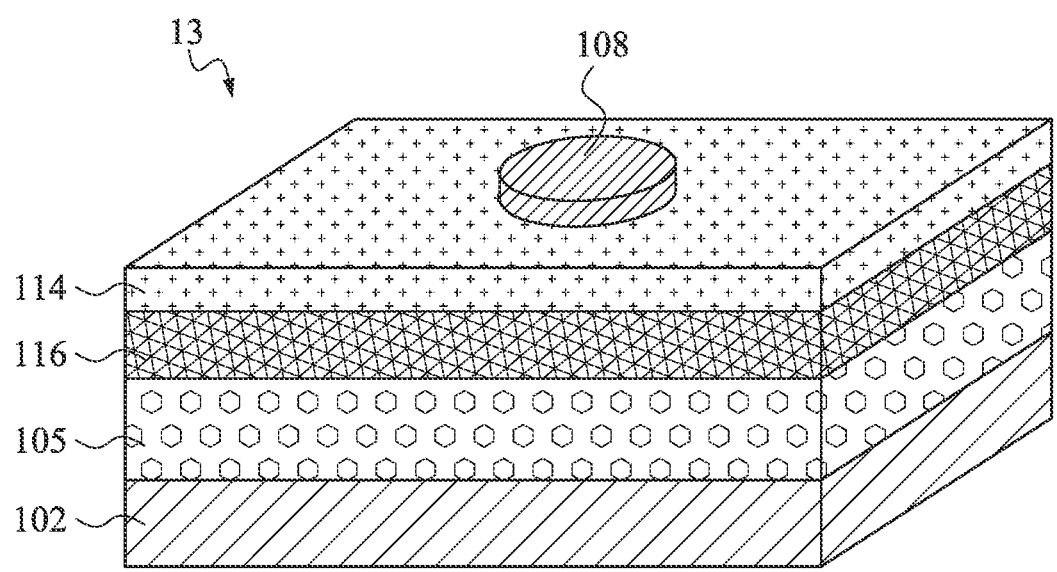

FIGS. 16A-16C illustrate fabrication of the semiconductor structure 13 of FIG. 15C in accordance with some embodiments of the present disclosure. As shown in FIG. 16A, the bottom electrode 105 is formed over the substrate 102. In some embodiments, the bottom electrode 105 is made of TiN and formed using a suitable method such as plating, chemical vapor deposition (CVD), atomic layer deposition (ALD), physical vapor deposition (PVD), and/or combinations thereof.

The $Hf_{0.5}Zr_{0.5}O_2$ layer 116 is formed over the TiN bottom electrode 105 using PEALD at a suitable temperature using suitable precursors, as discussed previously with respect to FIG. 13B.

As shown in FIG. 16B, the capping layer 114 is formed over the $Hf_{0.5}Zr_{0.5}O_2$ layer 116. In some embodiments where the capping layer 114 includes $TiO_2$, the $TiO_2$ capping layer 114 may be formed by PEALD at a suitable temperature using suitable precursors, as discussed previously with respect to FIG. 8C.

Deposition of the $TiO_2$ capping layer 114 and deposition of the $Hf_{0.5}Zr_{0.5}O_2$ layer 116 are controlled such that the $TiO_2$ capping layer 114 have thicknesses less than a thickness of the $Hf_{0.5}Zr_{0.5}O_2$ layer 116, which in turn will be advantageous for scaling down the semiconductor structure 13 as well as improving the ferroelectricity.

As shown in FIG. 16C, the top electrode 108 is formed over the $TiO_2$ capping layer 114. The top electrode 108 and the bottom electrode 105 may include the same material in some embodiments. For example, the top electrode 108 is made of TiN and the bottom electrode 105 is made of TiN. In other embodiments, the top electrode 108 may include different material than the bottom electrode 105. For example, the top electrode 108 includes Pt and the bottom electrode 105 includes TiN. In other embodiments, the top electrode 108 may include other suitable conductive materials. The top electrode 108 is formed using a deposition process, followed by a patterning process, as discussed previously with respect to FIG. 5C.

Figure 17A:
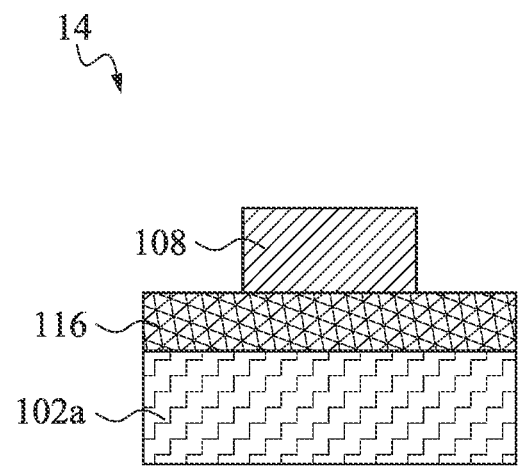
FIGS. 17A and 17C are examples of semiconductor structures in accordance with some embodiments of the present disclosure.
Figure 17B:
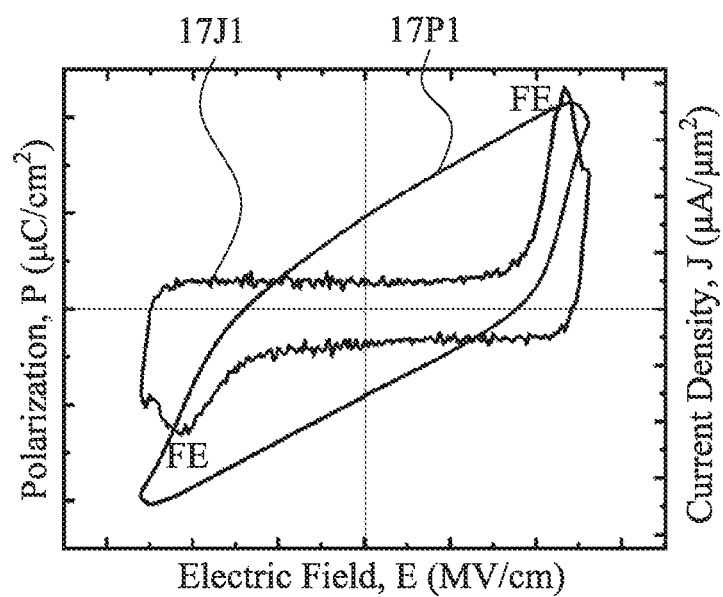
FIGS. 17B and 17D are charts of a polarization-electric field (P-E) hysteresis loop overlying a transient current-electric field (I-E) loop with respect to the semiconductor structures in FIGS. 17A and 17C, respectively.

FIG. 17A shows another semiconductor structure 14 similar to the semiconductor structure 12 shown in FIG. 15A, except for omitting the bottom electrode 105. In greater detail, the semiconductor structure 14 includes the substrate 102a with heavily doped p-type dopants (e.g., boron) in contact with a bottom surface of the $Hf_{0.5}Zr_{0.5}O_2$ layer 116. The heavily doped substrate 102a can act as a conductor and thus serve as a bottom electrode due to the heavy dopant concentration. In some embodiments, the $Hf_{0.5}Zr_{0.5}O_2$ layer 116 has a thickness of about 11.9 nm. FIG. 17B is a chart of a polarization-electric field (P-E) hysteresis loop overlying a transient current-electric field (I-E) loop with respect to the semiconductor structure 14.

Figure 17C:
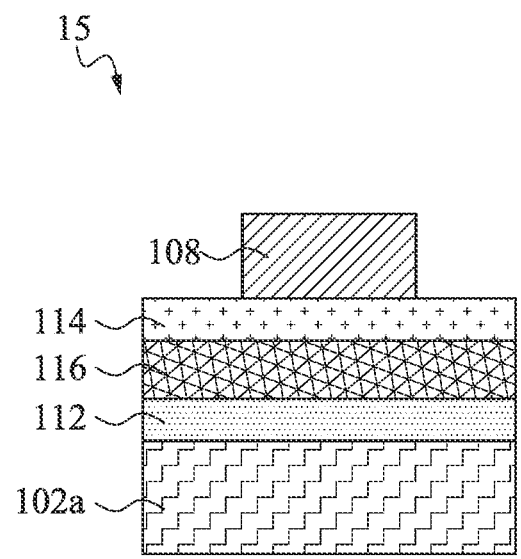
Figure 17D:
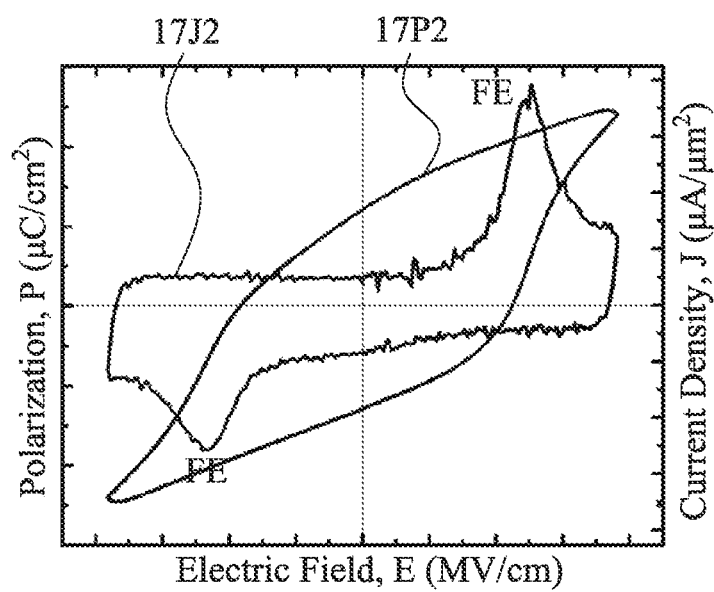

FIG. 17C shows another semiconductor structure 15 similar to the semiconductor structure 14, except for the $TiO_2$ seed layer 112 made of $TiO_2$ and the $TiO_2$ capping layer 114 on opposite sides of the $Hf_{0.5}Zr_{0.5}O_2$ layer 116. In greater detail, the $TiO_2$ seed and capping layers 112 and 114 have substantially the same thickness (e.g., about 2.7 nm). FIG. 17D is a chart of a polarization-electric field (P-E) hysteresis loop overlying a transient current-electric field (I-E) loop with respect to the semiconductor structure 15. Comparing curves 17P1, 17J1 in FIG. 17B with curves 17P2, 17J2 in FIG. 17D, the ferroelectricity and the hysteresis behavior of the semiconductor structure 15 with $TiO_2$ seed and capping layers 112 and 114 are enhanced as compared to the semiconductor structure 14 without $TiO_2$ seed and capping layers.

Figure 17E:
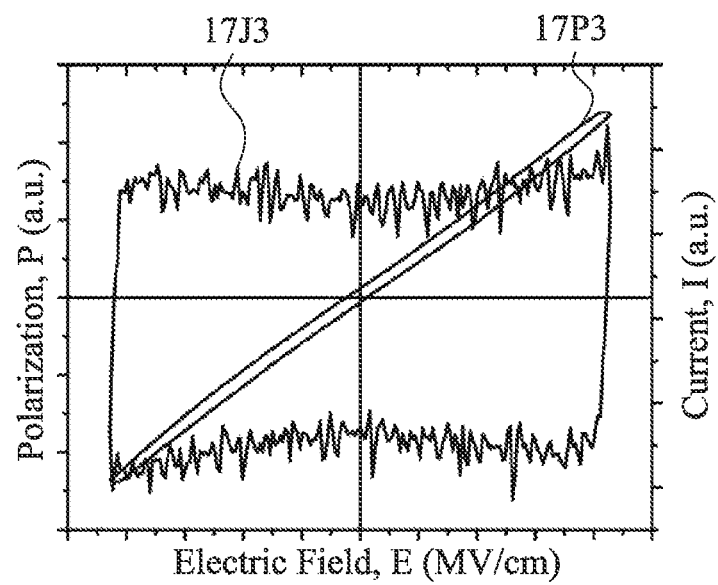
FIGS. 17E and 17F are a polarization-electric field (P-E) hysteresis loop overlying a transient current-electric field (I-E) loop with respect to the semiconductor structures in FIGS. 17A and 17C, respectively.

FIG. 17E is a chart of a polarization-electric field (P-E) hysteresis loop overlying a transient current-electric field (I-E) loop with respect to another example of the semiconductor structure 14. In greater detail, the semiconductor structure 14 associated with the chart of FIG. 17E includes the $Hf_{0.5}Zr_{0.5}O_2$ layer 116 having a thickness of about 7 nm.

Figure 17F:
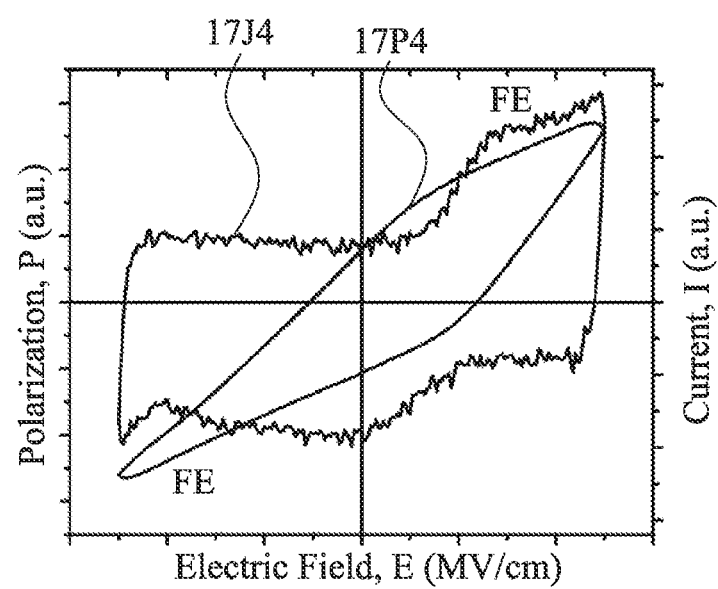

The curves 17P3 and 17J3 in FIG. 17E show that the $Hf_{0.5}Zr_{0.5}O_2$ layer 116 with 7 nm thickness and in contact with heavily doped substrate 102a exhibits a paraelectric characteristic. FIG. 17F is a chart of a polarization-electric field (P-E) hysteresis loop overlying a transient current-electric field (I-E) loop with respect to another example of the semiconductor structure 15. In greater detail, the semiconductor structure 15 associated with FIG. 17F includes the $Hf_{0.5}Zr_{0.5}O_2$ layer 116 having a thickness of about 7 nm, the $TiO_2$ seed layer 112 having a thickness of about 2.7 nm, and the $TiO_2$ capping layer 114 having a thickness of about 2.7 nm. Comparing curves 17P3, 17J3 in FIG. 17E with curves 17P4, 17J4 in FIG. 17F, a paraelectric to ferroelectric phase transition is induced in the $Hf_{0.5}Zr_{0.5}O_2$ layer 116 due to the $TiO_2$ layers 112 and 114 on opposite sides of the $Hf_{0.5}Zr_{0.5}O_2$ layer 116.

Based on the above discussion, it can be seen that the ferroelectricity or antiferroelectricity of the zirconium-containing oxide layer (e.g., $ZrO_2$ layer or $Hf_{0.5}Zr_{0.5}O_2$ layer) can be enhanced or otherwise modified by forming a zirconium-free metal oxide layer (e.g., $HfO_2$ or $TiO_2$ layer) in contact with a bottom surface and/or a top surface of the zirconium-containing oxide layer. Moreover, the thickness of the zirconium-free metal oxide layer can be less than the thickness of the zirconium-containing oxide layer, so as to facilitate scaling down the semiconductor structure. Furthermore, because the ferroelectricity or antiferroelectricity can be satisfied by incorporating the zirconium-free metal oxide layer, annealing or other thermal treatment to the as-deposited zirconium-containing oxide layer for improving the ferroelectricity or antiferroelectricity can be omitted. The concept of improving the ferroelectricity or antiferroelectricity of the zirconium-containing oxide layer by the thin zirconium-free metal oxide layer can be used in various devices, such as an NC-FET, a ferroelectric random access memory (FeRAM) device, a ferroelectric tunnel junction (FTJ) device or the like. Embodiments below are about an NC-FET employing the foregoing concept.

A field effect transistor (FET) and a method of forming the same are provided in accordance with various exemplary embodiments. The intermediate stages of forming the FET are illustrated. The variations of the embodiments are discussed. Throughout the various views and illustrative embodiments, like reference numbers are used to designate like elements.

Figure 19:
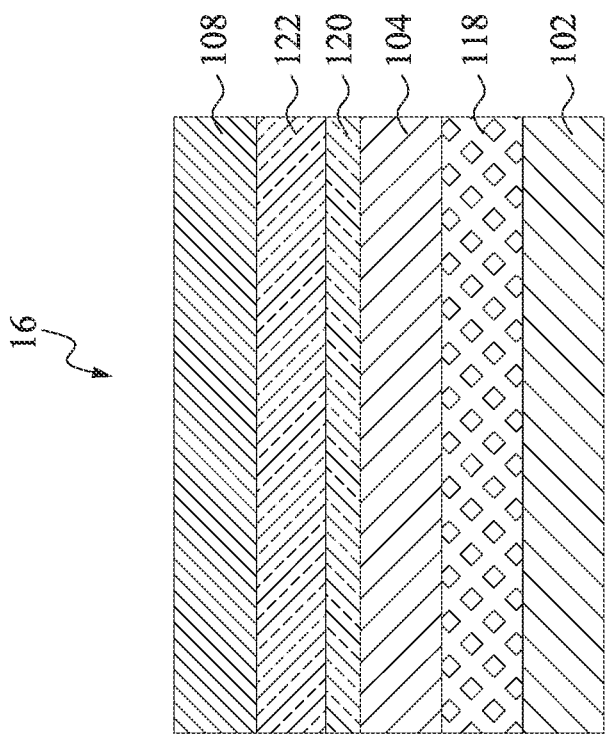
FIGS. 19-21 illustrate schematic cross-sectional views of the semiconductor structure associated with the method of FIG. 18 in accordance with some embodiments of the present disclosure.
Figure 18:
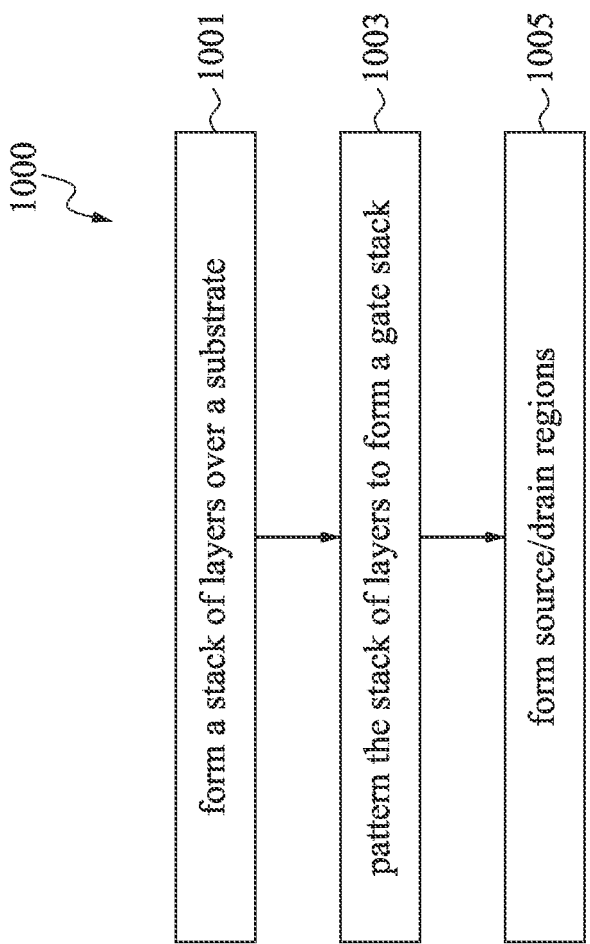
FIG. 18 is a flow chart diagram of a method of fabricating a semiconductor structure according to various aspects of the present disclosure.
Figure 21:
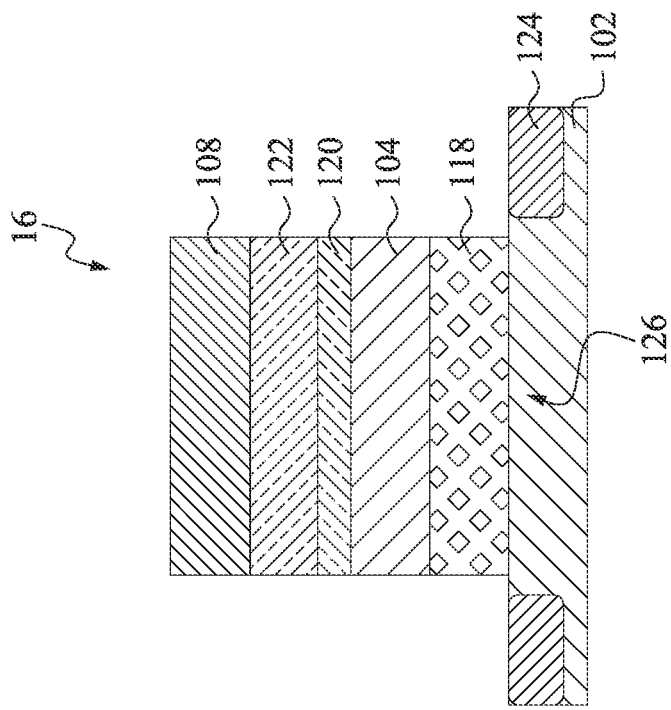
Figure 20:
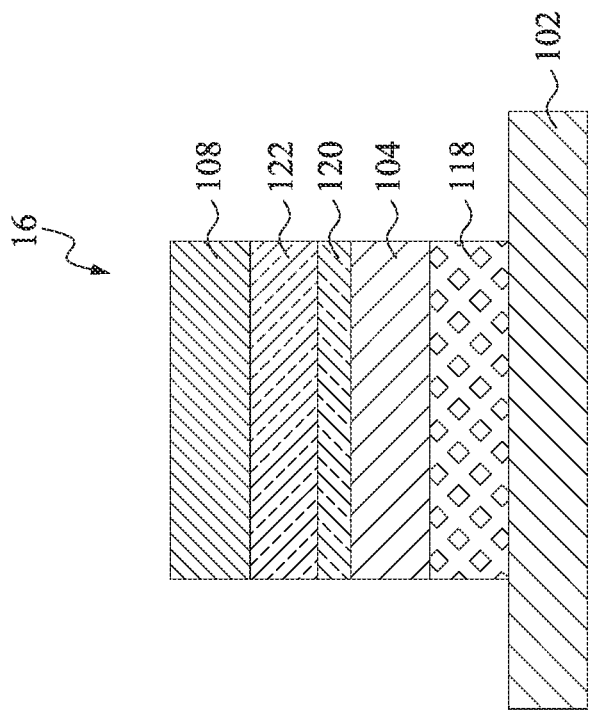

Examples of an NCFET and a method of forming the same are described with reference to FIGS. 18-21. In particular, FIG. 18 is a flow chart diagram of a method 1000 of fabricating semiconductor structures with a negative capacitance gate stack according to various aspects of the present disclosure. Additional steps can be provided before, during, and after the method 1000, and some of the steps described can be replaced or eliminated for other embodiments of the method 1000. FIGS. 19-21 illustrate schematic cross-sectional views of the semiconductor structure corresponding to the flow chart in FIG. 18 in accordance with some embodiments.

Referring to block 1001 of FIG. 18 and to FIG. 19, the semiconductor structure 16 is received. The semiconductor structure 16 includes a substrate 102 upon which devices are to be formed. In various examples, the substrate 102 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof.

The substrate 102 may be uniform in composition or may include various layers. The layers may have similar or different compositions, and in various embodiments, some substrate layers have non-uniform compositions to induce device strain and thereby tune device performance. Examples of layered substrates include silicon-on-insulator (SOI) substrates 102. In some such examples, a layer of the substrate 102 may include an insulator such as a semiconductor oxide, a semiconductor nitride, a semiconductor oxynitride, a semiconductor carbide, and/or other suitable insulator materials. In some embodiments, the substrate 102 may also include various p-type doped regions and/or n-type doped regions, implemented by a process such as ion implantation and/or diffusion.

The semiconductor structure 16 includes a gate dielectric layer 118 formed over the substrate 102. The gate dielectric layer 118 is made of oxide, such as silicon oxide in some embodiments. In other embodiments, the gate dielectric layer 118 includes one or more high-k dielectric layers (e.g., having a dielectric constant greater than 3.9). For example, the one or more gate dielectric layers 118 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, $GeO_2$, $ZrO_2$, $HfZrO_2$, $Ga_2O_3$, $Gd_2O_3$, $TaSiO_2$, $TiO_2$, HfSiON, $YGe_xO_y$, $YSi_xO_y$, $LaAlO_3$, and the like. The formation methods of the gate dielectric layer 118 include molecular-beam deposition (MBD), atomic layer deposition (ALD), physical vapor deposition (PVD), and the like.

A bottom electrode 104 is disposed on the gate dielectric layer 118. In some embodiments, the bottom electrode 104 serves as an internal gate or floating gate to average out a non-uniform charge in the subsequently formed layers and non-uniform potential profile along a source/drain direction. The bottom electrode 104 may be a metal selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the bottom electrode 104 includes a metal selected from the group consisting of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may be used.

Subsequently, a first seed layer 120, a first zirconium-containing oxide layer 122 and a top electrode 108 are sequentially formed over the bottom electrode 104, as shown in FIG. 19. The first seed layer 120 can be a zirconium-free metal oxide layer that is capable of enhancing or modifying ferroelectricity or antiferroelectricity of the first zirconium-containing oxide layer 122. Suitable materials for the first seed layer 120 may be $HfO_2$, $TiO_2$ or combinations thereof. The capability of $HfO_2$ or $TiO_2$ to enhance or modify the ferroelectricity or antiferroelectricity of zirconium-containing oxide is discussed previously with respect to FIGS. 4B, 4C, 4E, 6B, 6D-6F, 9B, 9D, 11B, 11D, 12B, 12D, 12F, 15B, 15D, 17B, and 17D-17F.

The first seed layer 120 may be formed by any suitable technique, such as chemical vapor deposition (CVD), ALD, plasma enhanced CVD (PECVD), or plasma enhanced ALD (PEALD). In some embodiments where the first seed layer 120 includes $TiO_2$, the $TiO_2$ seed layer 120 may be formed by PEALD at a suitable temperature using suitable precursors, as discussed previously with respect to FIG. 7A. In some embodiments where the first seed layer 120 includes $HfO_2$, the $HfO_2$ seed layer 120 may be formed by PEALD at a suitable temperature using suitable precursors, as discussed previously with respect to FIG. 5A. In some embodiments, the thickness of the first seed layer 120 is less than the thickness of the first zirconium-containing oxide layer 122. For example, the thickness of the first seed layer 120 is in a range from about 1 nm to about 6 nm.

In some embodiment, the first zirconium-containing oxide layer 122 is made of $ZrO_2$ or $Hf_{0.5}Zr_{0.5}O_2$. The first zirconium-containing oxide layer 122 may be formed by any suitable technique, such as chemical vapor deposition (CVD), ALD, plasma enhanced CVD (PECVD), or plasma enhanced ALD (PEALD). In some embodiments where the first zirconium-containing oxide layer 122 includes $ZrO_2$, the $ZrO_2$ layer 122 may be formed by PEALD at a suitable temperature using suitable precursors, as discussed previously with respect to FIG. 5B. In some embodiments where the first zirconium-containing oxide layer 120 includes $Hf_{0.5}Zr_{0.5}O_2$, the $Hf_{0.5}Zr_{0.5}O_2$ layer 122 may be formed by PEALD at a suitable temperature using suitable precursors, as discussed previously with respect to FIG. 13B. In some embodiments, the thickness of the first zirconium-containing oxide layer 122 is in a range from about 6 nm to about 100 nm. In some embodiments, the thickness of the first zirconium-containing oxide layer 122 is in a range from about 6 nm to about 20 nm to facilitate scaling down of the semiconductor structure 16.

The top electrode 108 may have the same material as the bottom electrode 104. Alternatively, the top electrode 108 may have a different material as the bottom electrode 104. The top electrode 108 may be formed by plating, chemical vapor deposition (CVD), atomic layer deposition (ALD), physical vapor deposition (PVD), combinations thereof, and/or other suitable techniques.

Referring to block 1003 of FIG. 18 and to FIG. 20, the gate dielectric layer 118, the bottom electrode 104, the first seed layer 120, the first zirconium-containing oxide layer 122 and the top electrode 108 are patterned using suitable lithography and etching techniques. The gate dielectric layer 118, the bottom electrode 104, the first seed layer 120, the first zirconium-containing oxide layer 122 and the top electrode 108 may be referred to as a negative capacitance gate stack of the semiconductor structure 16 because of the ferroelectricity or antiferroelectricity of the first zirconium-containing oxide layer 122.

Referring to block 1005 of FIG. 18 and to FIG. 21, portions 124 in the substrate 102 may be doped to with an n-type dopant (e.g., phosphorus) and serve as source/drain regions 124 in some embodiments. A portion of the substrate 102 between the source/drain regions 124 may be referred to as a channel region 126. The opposing source/drain regions 124 are laterally separated by the channel region 126. The flow of carriers through the channel region 126 is controlled by a voltage applied to the top electrode 108. In some embodiments, for straining effect or other performance enhancement, the source/drain regions 124 may be formed by epitaxy growth of different semiconductor materials. For example, the substrate 102 is recessed by etching, and a semiconductor material is epitaxially grown on the recessed region with in-situ doping to form the source/drain regions 124. In alternative embodiments, the method 1000 may form the gate stack after the formation of the source/drain regions 124, such as in a gate-last procedure. For examples, a dummy gate is formed; the source/drain regions 124 are formed on sides of the dummy gate; and thereafter, the gate stack comprising layers 118, 104, 120, 122 and 108 is formed to replace the dummy gate by a gate replacement process.

Combination of the first seed layer 120 and the first zirconium-containing oxide layer 122 provide negative capacitance. Also, the ferroelectric phase of the first zirconium-containing oxide layer 122 may be enhanced or changed to be antiferroelectric phase by the first seed layer 120. Therefore, the semiconductor structure 16 may act as an NC-FET.

Figure 22:
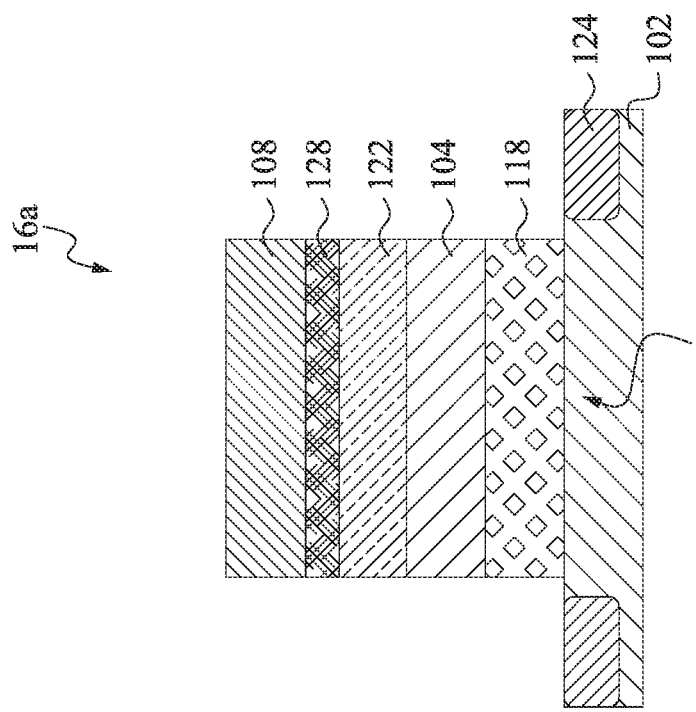

FIG. 22 shows another semiconductor structure 16a similar to the semiconductor structure 16, except for addition of the first capping layer 128 and omission of the first seed layer 120. The first capping layer 128 is between top electrode 108 and the first zirconium-containing oxide layer 122. The first capping layer 128 can be a zirconium-free metal oxide layer that is capable of enhancing or modifying ferroelectricity or antiferroelectricity of the first zirconium-containing oxide layer 122. Suitable materials for the first capping layer 128 may be $HfO_2$, $TiO_2$ or combinations thereof.

The first capping layer 128 may be formed by any suitable technique, such as chemical vapor deposition (CVD), ALD, plasma enhanced CVD (PECVD), or plasma enhanced ALD (PEALD). In some embodiments where the first capping layer 128 includes $TiO_2$, the $TiO_2$ capping layer 128 may be formed by PEALD at a suitable temperature using suitable precursors, as discussed previously with respect to FIG. 8C. In some embodiments where the first capping layer 128 includes $HfO_2$, the $HfO_2$ capping layer 128 may be formed by PEALD at a suitable temperature using suitable precursors, as discussed previously with respect to FIG. 5A. In some embodiments, the thickness of the first capping layer 128 is less than the thickness of the first zirconium-containing oxide layer 122. For example, the thickness of the first capping layer 128 is in a range from about 1 nm to about 6 nm.

Combination of the first seed layer 120 and the first zirconium-containing oxide layer 122 provide negative capacitance. Also, the ferroelectric phase of the first zirconium-containing oxide layer 122 may be enhanced or changed to be antiferroelectric phase by the first capping layer 128. Therefore, the semiconductor structure 16a can act as an NC-FET.

Figure 23:
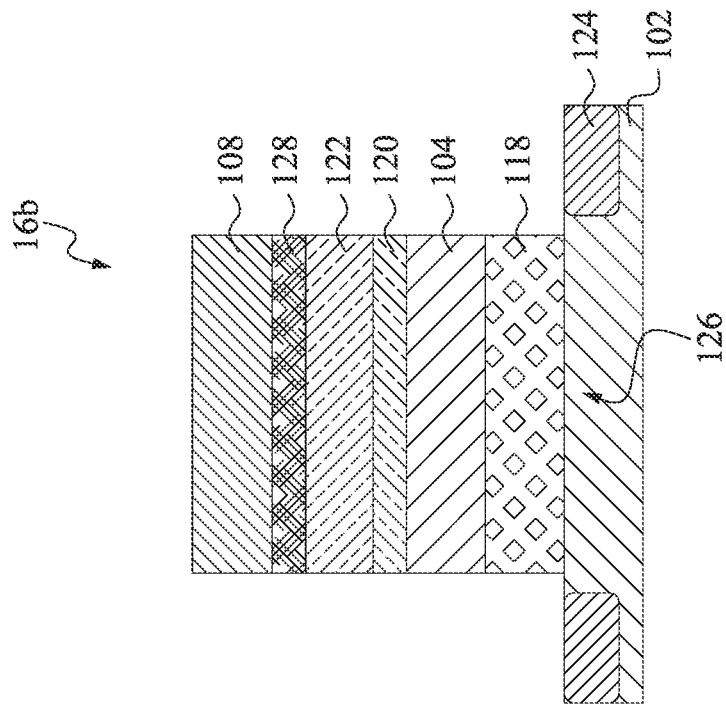

FIG. 23 shows another semiconductor structure 16b similar to the semiconductor structure 16, except for the first seed layer 120 between the first zirconium-containing oxide layer 122 and the bottom electrode 104. Combination of the first seed layer 120, the first zirconium-containing oxide layer 122 and the first capping layer 128 provide negative capacitance. Also, the ferroelectric phase of the first zirconium-containing oxide layer 122 may be enhanced or changed to be antiferroelectric phase by the first seed layer 120 and the first capping layer 128. Therefore, the semiconductor structure 16b may act as an NC-FET.

FIG. 24 shows another semiconductor structure 17 similar to the semiconductor structure 16, except for omission of the bottom electrode 104. The first seed layer 120 is in contact with the gate dielectric layer 118 due to omission of the bottom electrode 104. Combination of the first seed layer 120 and the first zirconium-containing oxide layer 122 provide negative capacitance. Also, the ferroelectric phase of the first zirconium-containing oxide layer 122 may be enhanced or changed to be antiferroelectric phase by the first seed layer 120. Therefore, the semiconductor structure 17 can act as an NC-FET.

FIG. 25 shows another semiconductor structure 17a similar to the semiconductor structure 16a, except for omission of the bottom electrode 104. Combination of the first zirconium-containing oxide layer 122 and the first capping layer 128 provide negative capacitance. Also, the ferroelectric phase of the first zirconium-containing oxide layer 122 may be enhanced or changed to be antiferroelectric phase by the first capping layer 128. Therefore, the semiconductor structure 17a can act as an NC-FET.

FIG. 26 shows another semiconductor structure 17b similar to the semiconductor structure 16b, except for omission of the bottom electrode 104. Combination of the first seed layer 120, the first zirconium-containing oxide layer 122 and the first capping layer 128 provide negative capacitance. Also, the ferroelectric phase of the first zirconium-containing oxide layer 122 may be enhanced or changed to be antiferroelectric phase by the first seed layer 120 and the first capping layer 128. Therefore, the semiconductor structure 17b may act as an NC-FET.

FIG. 27 shows another semiconductor structure 18 similar to the semiconductor structure 17, except for omission of the gate dielectric layer 118. The first seed layer 120 is in contact with the channel region 126 due to omission of the gate dielectric layer 118. Combination of the first seed layer 120 and the first zirconium-containing oxide layer 122 provide negative capacitance. Also, the ferroelectric phase of the first zirconium-containing oxide layer 122 may be enhanced or changed to be antiferroelectric phase by the first seed layer 120. Therefore, the semiconductor structure 18 may act as an NC-FET.

FIG. 28 shows another semiconductor structure 18a similar to the semiconductor structure 17a, except for omission of the gate dielectric layer 118. Combination of the first zirconium-containing oxide layer 122 and the first capping layer 128 provide negative capacitance. Also, the ferroelectric phase of the first zirconium-containing oxide layer 122 may be enhanced or changed to be antiferroelectric phase by the first capping layer 128. Therefore, the semiconductor structure 18a can act as an NC-FET.

FIG. 29 shows another semiconductor structure 18b similar to the semiconductor structure 17b, except for omission of the bottom electrode 104. Combination of the first seed layer 120, the zirconium-containing oxide layer 122 and the first capping layer 128 provide negative capacitance. Also, the ferroelectric phase of the first zirconium-containing oxide layer 122 may be enhanced or changed to be antiferroelectric phase by the first seed layer 120 and the first capping layer 128. Therefore, the semiconductor structure 18b may act as an NC-FET.

Figure 30:
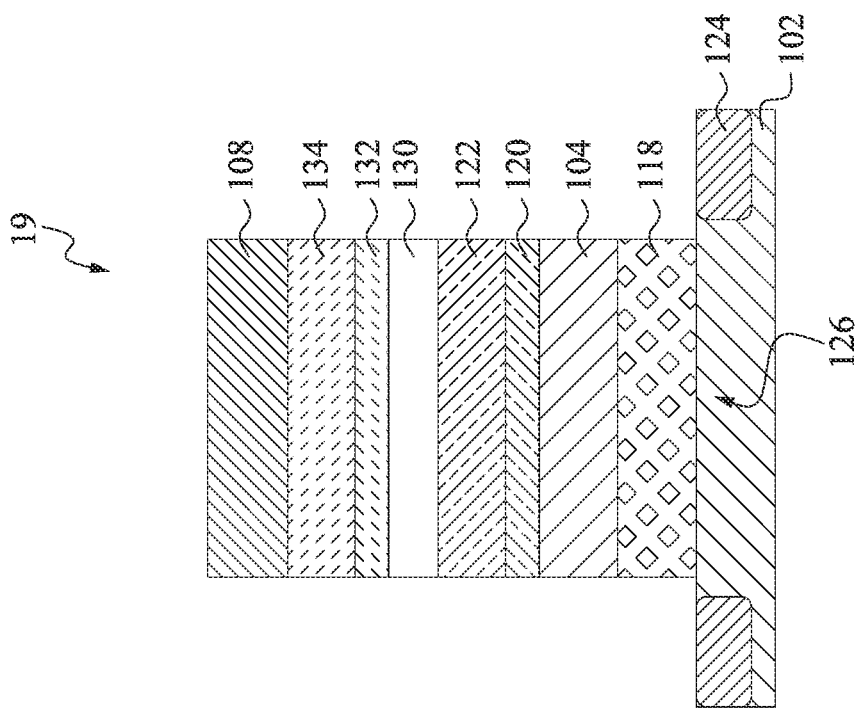

FIG. 30 shows another semiconductor structure 19 similar to the semiconductor structure 16, except for the middle electrode 130, the second seed layer 132 and the second zirconium-containing oxide layer 134. In greater detail, the middle electrode 130, the second seed layer 132 and the second zirconium-containing oxide layer 134 are sequentially formed over the first zirconium-containing oxide layer 122. The top electrode 108 is over the second zirconium-containing oxide layer 134. The middle electrode 130 may have the same material as the top electrode 108 and the bottom electrode 104. Alternatively, the middle electrode 130 may have a different material than the top electrode 108 and the bottom electrode 104. The middle electrode 130 may be formed by plating, chemical vapor deposition (CVD), atomic layer deposition (ALD), physical vapor deposition (PVD), combinations thereof, and/or other suitable techniques. The middle electrode 130 may be a metal selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the bottom electrode 104 includes a metal selected from the group consisting of TiN, WN, TaN, and Ru. Metal alloys such as Ti—Al, Ru—Ta, Ru—Zr, Pt—Ti, Co—Ni and Ni—Ta may be used and/or metal nitrides, such as $WN_x$, $TiN_x$, $MoN_x$, $TaN_x$, and $TaSi_xN_y$ may be used. The middle electrode 130 serves as an internal gate or floating gate to average out a non-uniform charge in the subsequently formed layers and non-uniform potential profile along a source/drain direction.

The second seed layer 132 can be a zirconium-free metal oxide layer that is capable of enhancing or modifying ferroelectricity or antiferroelectricity of the second zirconium-containing oxide layer 134. Suitable materials for the second seed layer 132 may be $HfO_2$, $TiO_2$ or combinations thereof. The capability of $HfO_2$ or $TiO_2$ to enhance or modify the ferroelectricity or antiferroelectricity of zirconium-containing oxide is discussed previously with respect to FIGS. 4B, 4C, 4E, 6B, 6D-6F, 9B, 9D, 11B, 11D, 12B, 12D, 12F, 15B, 15D, 17B, 17D-17F.

The second seed layer 132 may be formed by any suitable technique, such as chemical vapor deposition (CVD), ALD, plasma enhanced CVD (PECVD), or plasma enhanced ALD (PEALD). In some embodiments where the second seed layer 132 includes $TiO_2$, the $TiO_2$ seed layer 132 may be formed by PEALD at a suitable temperature using suitable precursors, as discussed previously with respect to FIG. 7A. In some embodiments where the second seed layer 132 includes $HfO_2$, the $HfO_2$ seed layer 132 may be formed by PEALD at a suitable temperature using suitable precursors, as discussed previously with respect to FIG. 5A. In some embodiments, the thickness of the second seed layer 132 is less than the thickness of the second zirconium-containing oxide layer 134. For example, the thickness of the second seed layer 132 is in a range from about 1 nm to about 6 nm.

In some embodiment, the second zirconium-containing oxide layer 134 is made of $ZrO_2$ or $Hf_{0.5}Zr_{0.5}O_2$. The second zirconium-containing oxide layer 134 may be formed by any suitable technique, such as chemical vapor deposition (CVD), ALD, plasma enhanced CVD (PECVD), or plasma enhanced ALD (PEALD). In some embodiments where the second zirconium-containing oxide layer 134 includes $ZrO_2$, the $ZrO_2$ layer 134 may be formed by PEALD at a suitable temperature using suitable precursors, as discussed previously with respect to FIG. 5B. In some embodiments where the second zirconium-containing oxide layer 134 includes $Hf_{0.5}Zr_{0.5}O_2$, the $Hf_{0.5}Zr_{0.5}O_2$ layer 134 may be formed by PEALD at a suitable temperature using suitable precursors, as discussed previously with respect to FIG. 13B. In some embodiments, the thickness of the second zirconium-containing oxide layer 134 is in a range from about 6 nm to about 100 nm. In some embodiments, the thickness of the second zirconium-containing oxide layer 134 is in a range from about 6 nm to about 20 nm to facilitate scaling down of the semiconductor structure 16.

Combination of the second zirconium-containing oxide layer 134 and the second seed layer 132 provide negative capacitance. Also, the ferroelectric phase of the second zirconium-containing oxide layer 134 may be enhanced or changed to be antiferroelectric phase by the second seed layer 132. Therefore, the semiconductor structure 19 can act as an in NC-FET.

In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132. In other words, the first seed layer 120 and the first zirconium-containing oxide layer 122 provide ferroelectric negative capacitance (NC-FE) and the second seed layer 132 and the second zirconium-containing oxide layer 134 provide antiferroelectric negative capacitance (NC-AFE) in some embodiments. In other embodiments, the first seed layer 120 and the first zirconium-containing oxide layer 122 provide antiferroelectric negative capacitance (NC-AFE) and the second seed layer 132 and the second zirconium-containing oxide layer 134 provide ferroelectric negative capacitance (NC-FE). The stack of gate dielectric layer 118, the bottom electrode 104, the first seed layer 120, the first zirconium-containing oxide layer 122, the middle electrode 130, the second seed layer 132, the second zirconium-containing oxide layer 134 and the top electrode 108 may serve as a gate stack for an NC-FET. Such AFE-FE hybrid NC-FET can tune the threshold of steep slope Landau switches and enable achieving the steep sub-threshold to achieve high $I_{on}$ (on-current) of the NC-FET.

In some embodiments, the ferroelectricity or antiferroelectricity of the zirconium-containing oxide layers 122 and 134 can be achieved by choosing suitable materials of the zirconium-containing oxide layers 122 and 134 and suitable materials of the associated seed layers 120 and 132, as discussed previously with respect to FIGS. 4B, 4C, 4E, 6B, 6D-6F, 9B, 9D, 11B, 11D, 12B, 12D, 12F, 15B, 15D, 17B, and 17D-17F.

Figure 31:
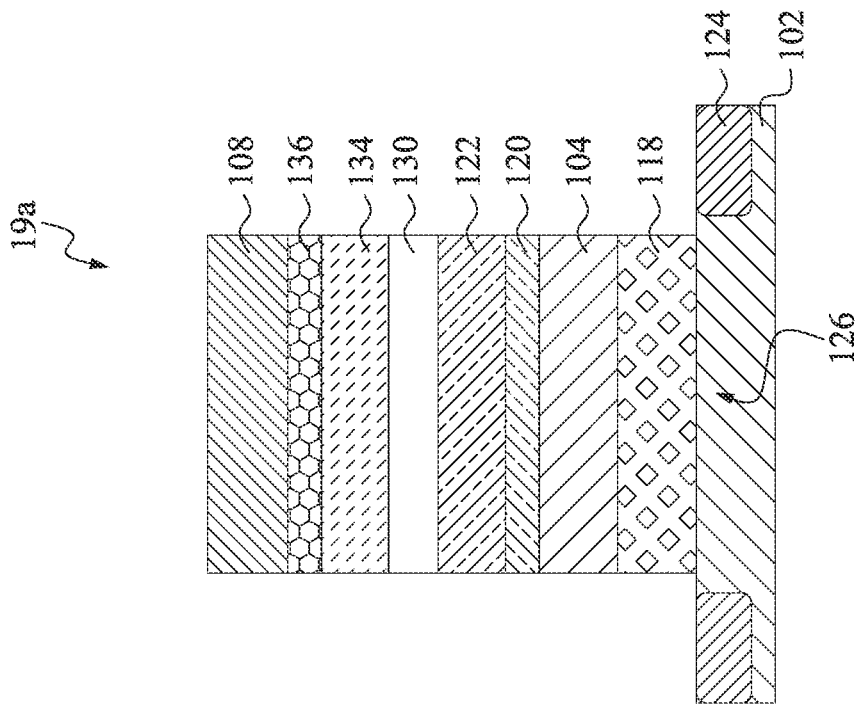

FIG. 31 shows another semiconductor structure 19a similar to the semiconductor structure 19, except for addition of a second capping layer 136 and omission of the second seed layer 132. In greater detail, the second capping layer 136 is between the top electrode 108 and the second zirconium-containing oxide layer 134. The second capping layer 136 can be a zirconium-free metal oxide layer that is capable of enhancing or modifying ferroelectricity or antiferroelectricity of the second zirconium-containing oxide layer 134. Suitable materials for the second capping layer 136 may be $HfO_2$, $TiO_2$ or combinations thereof.

The second capping layer 136 may be formed by any suitable technique, such as chemical vapor deposition (CVD), ALD, plasma enhanced CVD (PECVD), or plasma enhanced ALD (PEALD). In some embodiments where the second capping layer 136 includes $TiO_2$, the $TiO_2$ capping layer 136 may be formed by PEALD at a suitable temperature using suitable precursors, as discussed previously with respect to FIG. 8C. In some embodiments where the second capping layer 136 includes $HfO_2$, the $HfO_2$ capping layer 136 may be formed by PEALD at a suitable temperature using suitable precursors, as discussed previously with respect to FIG. 5A. In some embodiments, the thickness of the second capping layer 136 is less than the thickness of the second zirconium-containing oxide layer 134. For example, the thickness of the second capping layer 136 is in a range from about 1 nm to about 6 nm. Combination of the second zirconium-containing oxide layer 134 and the second capping layer 136 provide negative capacitance due to the ferroelectricity or antiferroelectricity of the second zirconium-containing oxide layer 134 modified or enhanced by the second capping layer 136. In some embodiments, the first zirconium-containing oxide layer 122 has ferroelectricity enhanced or modified by the first seed layer 120, and the second zirconium-containing oxide layer 134 has antiferroelectricity enhanced or modified by the second capping layer 136. In other embodiments, the first zirconium-containing oxide layer 122 has antiferroelectricity enhanced or modified by the first seed layer 120, and the second zirconium-containing oxide layer 134 has ferroelectricity enhanced or modified by the second capping layer 136.

Figure 32:
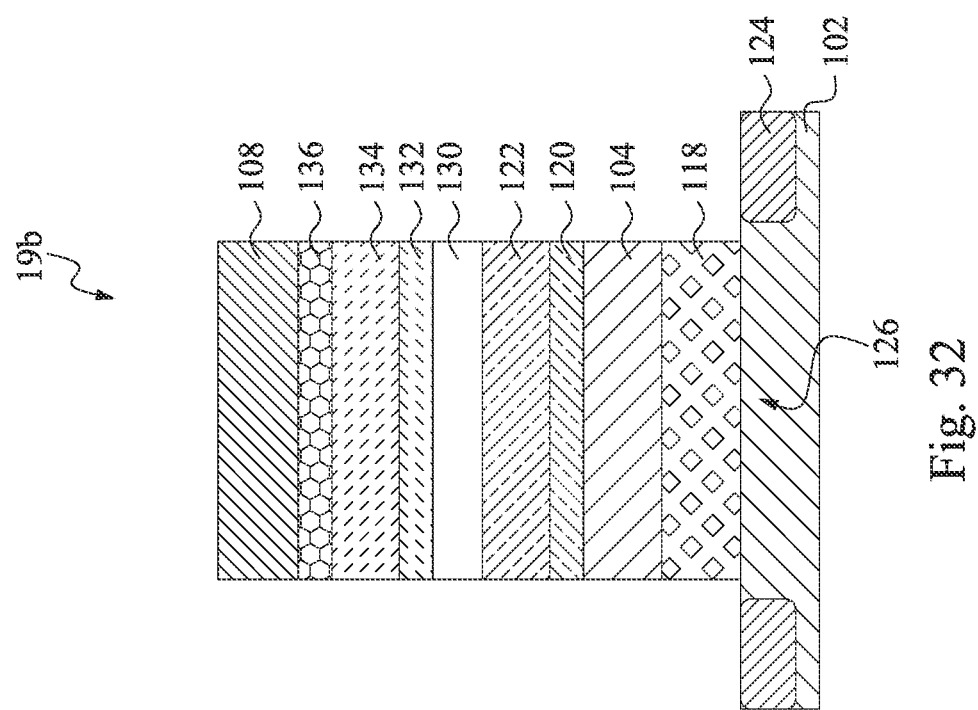

FIG. 32 shows another semiconductor structure 19b similar to the semiconductor structure 19, except for addition of the second capping layer 136. In greater detail, the second capping layer 136 is between the top electrode 108 and the second zirconium-containing oxide layer 134, and the second seed layer 132 is between the second zirconium-containing oxide layer 134 and the middle electrode 130. Combination of the second seed layer 132, the second zirconium-containing oxide layer 134 and the second capping layer 136 provide negative capacitance due to the ferroelectricity or antiferroelectricity of the second zirconium-containing oxide layer 134 modified or enhanced by the layers 132 and 136. In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first seed layer 120, and the second zirconium-containing oxide layer 134 has ferroelectricity enhanced or modified by the second seed layer 132 and the second capping layer 136.

Figure 33:
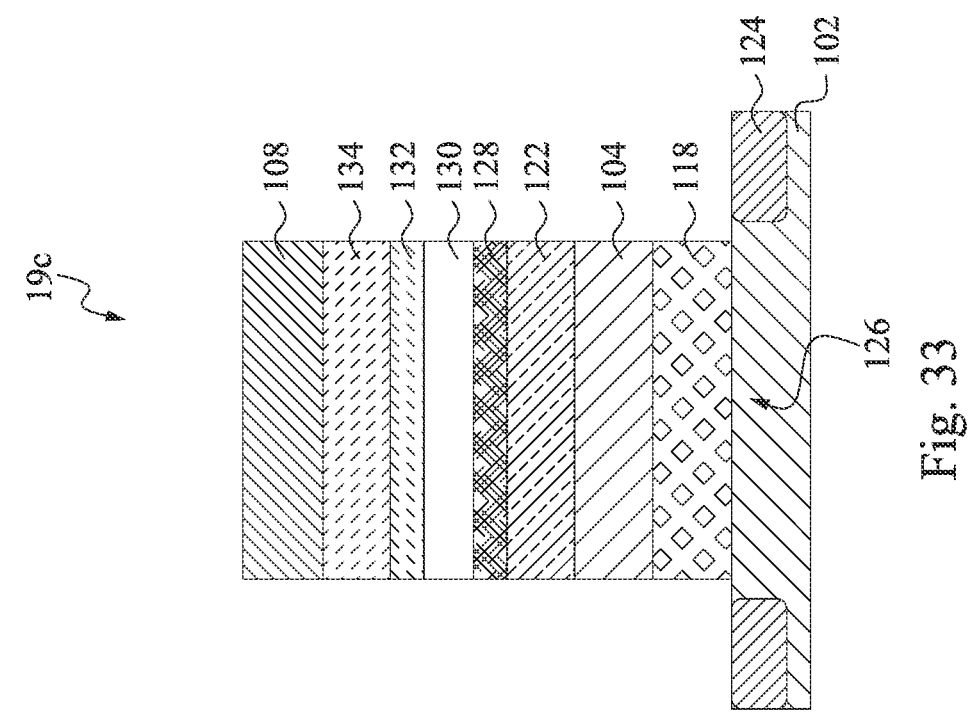

FIG. 33 shows another semiconductor structure 19c similar to the semiconductor structure 19, except for addition of the first capping layer 128 and omission of the first seed layer 120. The first capping layer 128 is between middle electrode 130 and the first zirconium-containing oxide layer 122. The first capping layer 128 can be a zirconium-free metal oxide layer that is capable of enhancing or modifying ferroelectricity or antiferroelectricity of the first zirconium-containing oxide layer 122. Suitable materials for the first capping layer 129 may be $HfO_2$, $TiO_2$ or combinations thereof. Combination of the first zirconium-containing oxide layer 122 and the first capping layer 128 provide negative capacitance due to the ferroelectricity or antiferroelectricity of the first zirconium-containing oxide layer 122 modified or enhanced by the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132. In other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132.

Figure 34:
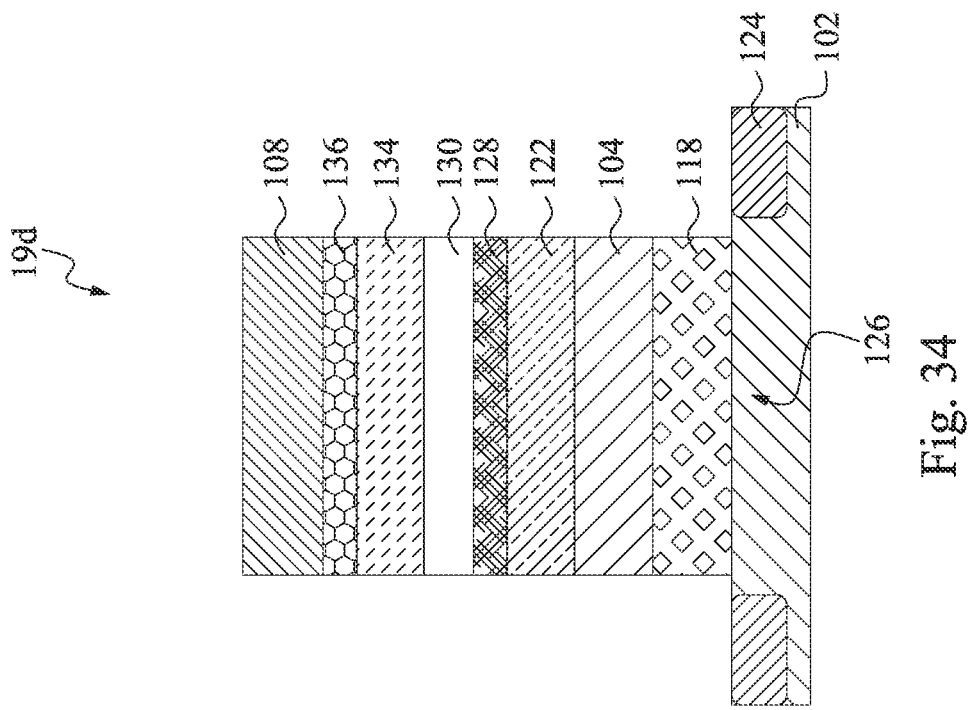

FIG. 34 shows another semiconductor structure 19d similar to the semiconductor structure 19a, except for addition of the first capping layer 128 and omission of the first seed layer 120. Combination of the first zirconium-containing oxide layer 122 and the first capping layer 128 provide negative capacitance due to the ferroelectricity or antiferroelectricity of the first zirconium-containing oxide layer 122 modified or enhanced by the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second capping layer 136. In other embodiments, the first zirconium-containing oxide layer 122 has antiferroelectricity enhanced or modified by the first capping layer 128, and the second zirconium-containing oxide layer 134 has ferroelectricity enhanced or modified by the second capping layer 136.

Figure 35:
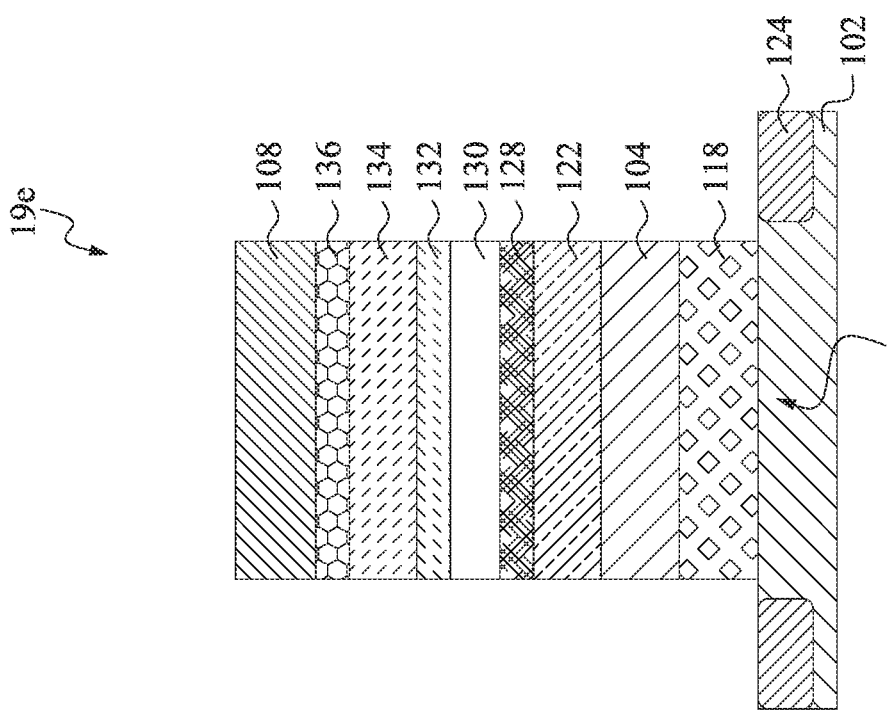

FIG. 35 shows another semiconductor structure 19e similar to the semiconductor structure 19b, except for addition of the first capping layer 128 and omission of the first seed layer 120. Combination of the first zirconium-containing oxide layer 122 and the first capping layer 128 provide negative capacitance due to the ferroelectricity or antiferroelectricity of the first zirconium-containing oxide layer 122 modified or enhanced by the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132 and the second capping layer 136.

Figure 36:
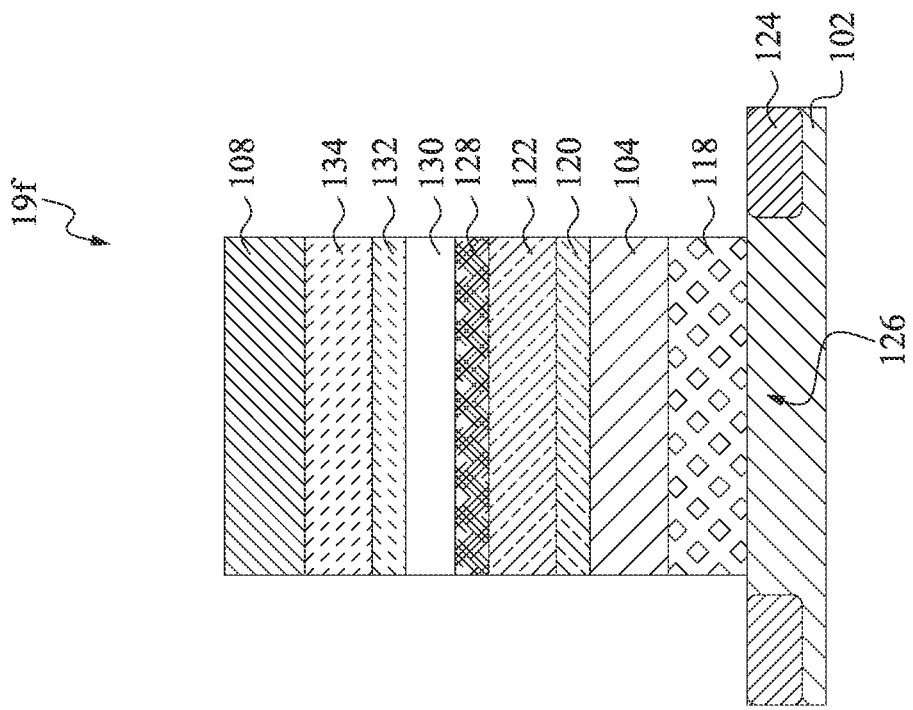

FIG. 36 shows another semiconductor structure 19f similar to the semiconductor structure 19, except for addition of the first capping layer 128. Combination of the first seed layer 120, the first zirconium-containing oxide layer 122 and the first capping layer 128 provide negative capacitance due to the ferroelectricity or antiferroelectricity of the first zirconium-containing oxide layer 122 modified or enhanced by the layers 120 and 128 on opposite sides of the first zirconium-containing oxide layer 122. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second seed layer 132. In other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second seed layer 132.

Figure 37:
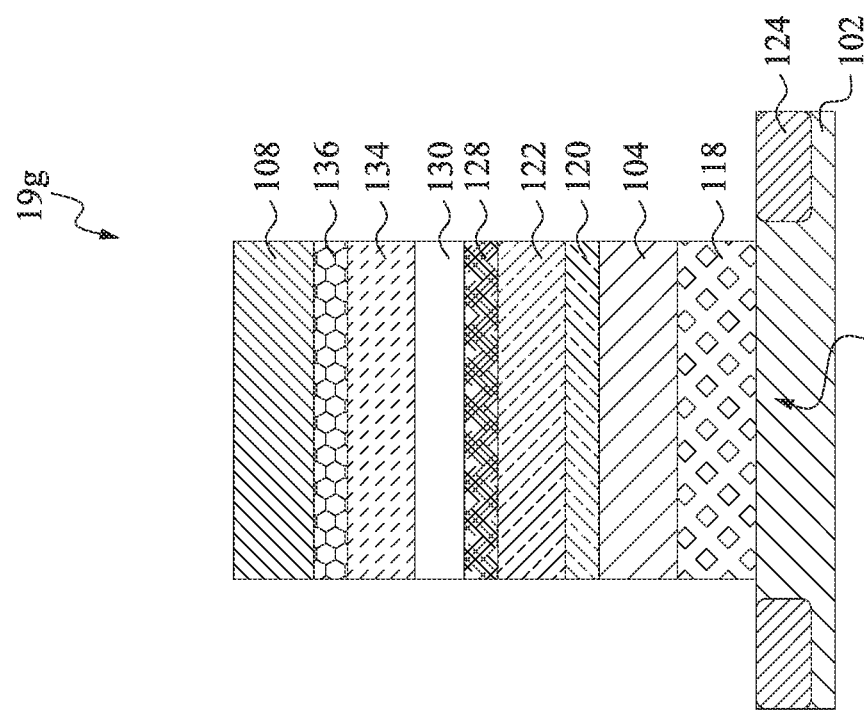

FIG. 37 shows another semiconductor structure 19g similar to the semiconductor structure 19a, except for addition of the first capping layer 128. Combination of the first seed layer 120, the first zirconium-containing oxide layer 122 and the first capping layer 128 provide negative capacitance due to the ferroelectricity or antiferroelectricity of the first zirconium-containing oxide layer 122 modified or enhanced by the layers 120 and 128 on opposite sides of the first zirconium-containing oxide layer 122. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second capping layer 136. In other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second capping layer 136.

Figure 38:
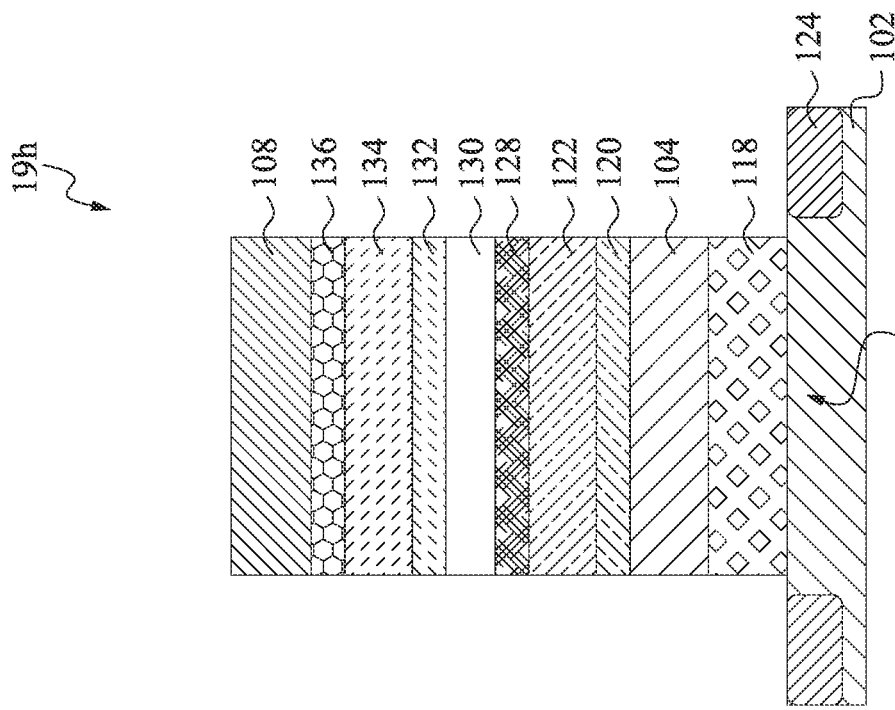

FIG. 38 shows another semiconductor structure 19h similar to the semiconductor structure 19b, except for addition of the first capping layer 128. Combination of the first seed layer 120, the first zirconium-containing oxide layer 122 and the first capping layer 128 provide negative capacitance due to the ferroelectricity or antiferroelectricity of the first zirconium-containing oxide layer 122 modified or enhanced by the layers 120 and 128 on opposite sides of the first zirconium-containing oxide layer 122. In some embodiments, the first zirconium-containing oxide layer 122 has ferroelectricity enhanced or modified by the first seed layer 120 and the second capping layer 136, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second seed layer 132 and the second capping layer 136.

Figure 39:
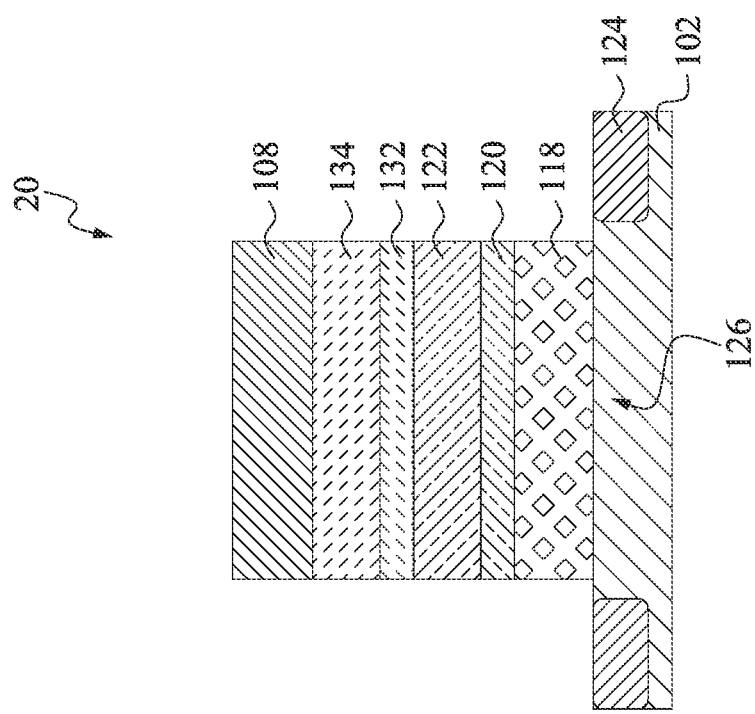

FIG. 39 shows another semiconductor structure 20 similar to the semiconductor structure 19, except for omitting the bottom electrode 104 and the middle electrode 130. In greater detail, the second seed layer 132 is in contact with the top surface of the first zirconium-containing oxide layer 122. In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132. In other embodiments, the first zirconium-containing oxide layer 122 has antiferroelectricity enhanced or modified by the first seed layer 120, and the second zirconium-containing oxide layer 134 has ferroelectricity enhanced or modified by the second seed layer 132.

Figure 40:
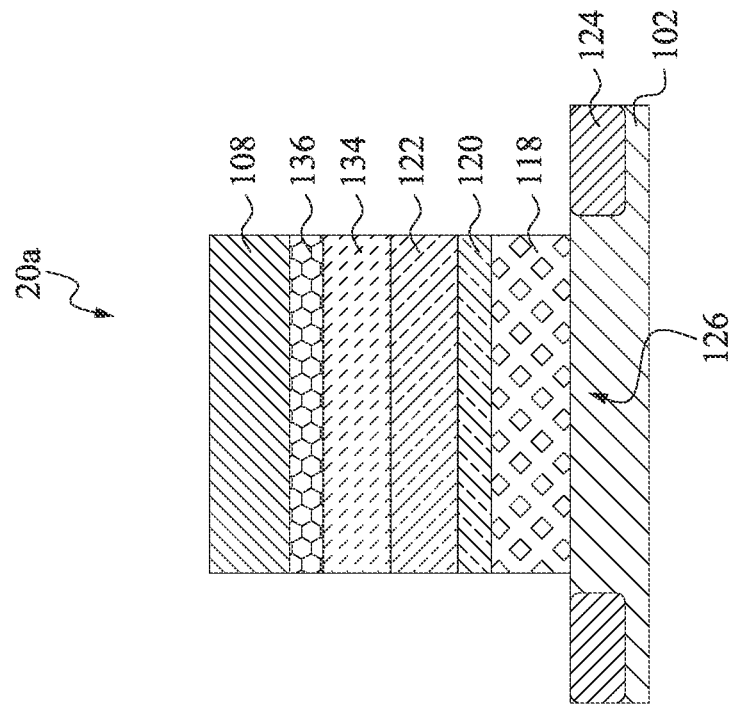

FIG. 40 shows another semiconductor structure 20a similar to the semiconductor structure 20, except for addition of the second capping layer 136 and omission of the second seed layer 132. In greater detail, the second zirconium-containing oxide layer 134 is in contact with a top surface of the first zirconium-containing oxide layer 122. In some embodiments, the first zirconium-containing oxide layer 122 has ferroelectricity enhanced or modified by the first seed layer 120, and the second zirconium-containing oxide layer 134 has antiferroelectricity enhanced or modified by the second capping layer 136. In other embodiments, the first zirconium-containing oxide layer 122 has antiferroelectricity enhanced or modified by the first seed layer 120, and the second zirconium-containing oxide layer 134 has ferroelectricity enhanced or modified by the second capping layer 136.

FIG. 41 shows another semiconductor structure 20b similar to the semiconductor structure 20, except for addition of the second capping layer 136. In some embodiments, the second capping layer 136 is between the top electrode 108 and the second zirconium-containing oxide layer 134. In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first seed layer 120, and the second zirconium-containing oxide layer 134 has ferroelectricity enhanced or modified by the second seed layer 132 and the second capping layer 136.

Figure 42:
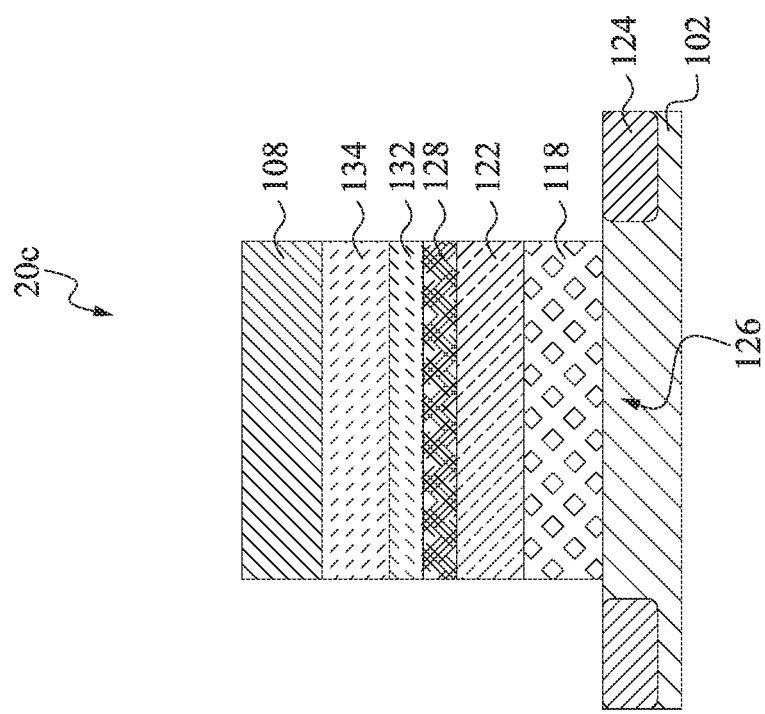

FIG. 42 shows another semiconductor structure 20c similar to the semiconductor structure 20, except for addition of the first capping layer 128 and omission of the first seed layer 120. In some embodiments, the second seed layer 132 is in contact with the top surface of the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132. In other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132.

Figure 43:
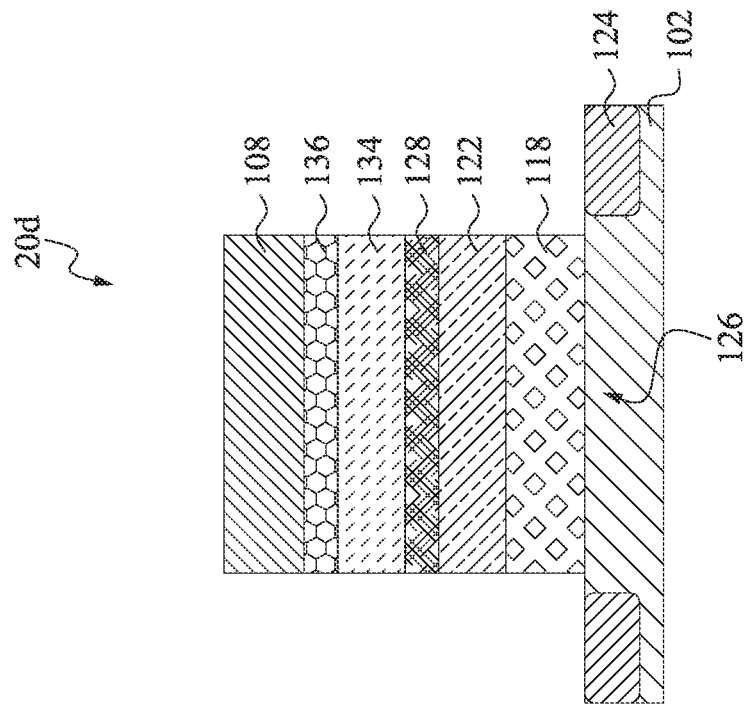

FIG. 43 shows another semiconductor structure 20d similar to the semiconductor structure 20a, except for addition of the first capping layer 128 and omission of the first seed layer 120. In some embodiments, the second zirconium-containing oxide layer 134 is in contact with the top surface of the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second capping layer 136. In other embodiments, the first zirconium-containing oxide layer 122 has antiferroelectricity enhanced or modified by the first capping layer 128, and the second zirconium-containing oxide layer 134 has ferroelectricity enhanced or modified by the second capping layer 136.

Figure 44:
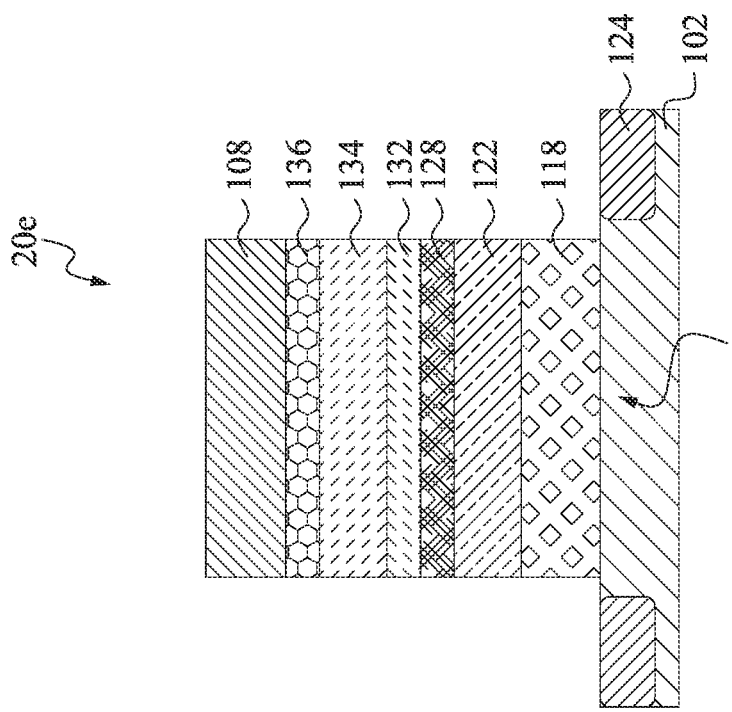

FIG. 44 shows another semiconductor structure 20e similar to the semiconductor structure 20e, except for addition of the first capping layer 128 and omission of the first seed layer 120. In some embodiments, the second seed layer 132 is in contact with the top surface of the first capping layer 128. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132 and the second capping layer 136.

Figure 45:
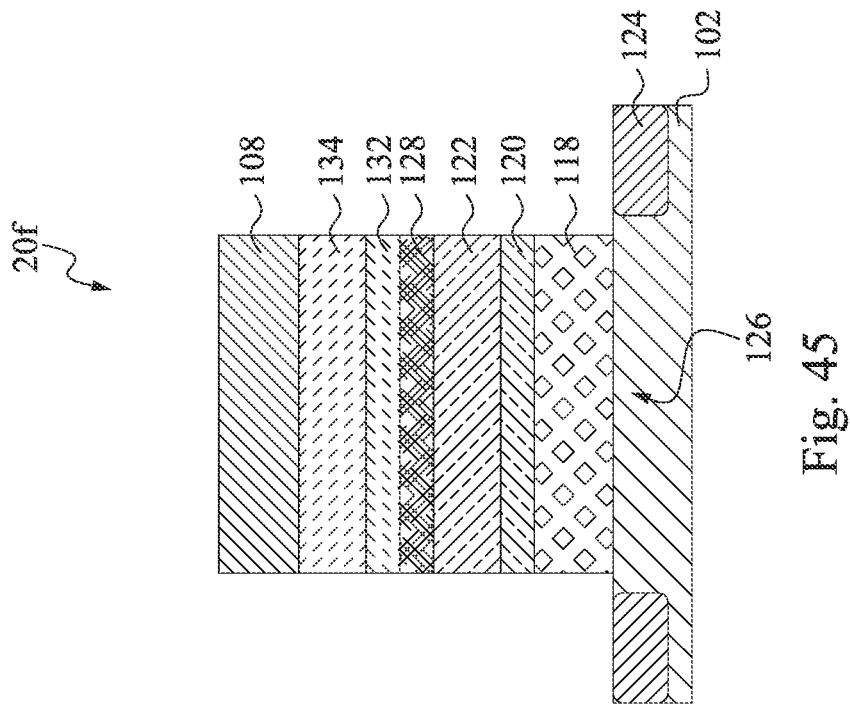

FIG. 45 shows another semiconductor structure 20f similar to the semiconductor structure 20, except for addition of the first capping layer 128. In some embodiments, the second seed layer 132 is in contact with the top surface of the first capping layer. In some embodiments, the first zirconium-containing oxide layer 122 has ferroelectricity enhanced or modified by the first seed layer 120 and the first capping layer 128, the second zirconium-containing oxide layer 134 has antiferroelectricity enhanced or modified by the second seed layer 132. In other embodiments, the first zirconium-containing oxide layer 122 has antiferroelectricity enhanced or modified by the first seed layer 120 and the first capping layer 128, the second zirconium-containing oxide layer 134 has ferroelectricity enhanced or modified by the second seed layer 132.

Figure 46:
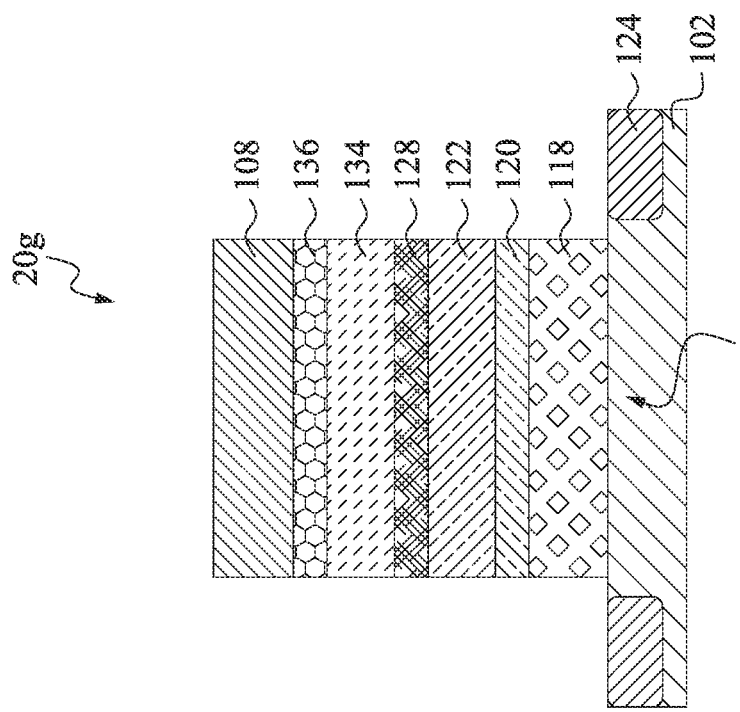

FIG. 46 shows another semiconductor structure 20g similar to the semiconductor structure 20a, except for addition of the first capping layer 128. In some embodiments, the second zirconium-containing oxide layer 134 is in contact with the top surface of the first capping layer 128. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second capping layer 136. In other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second capping layer 136.

Figure 47:
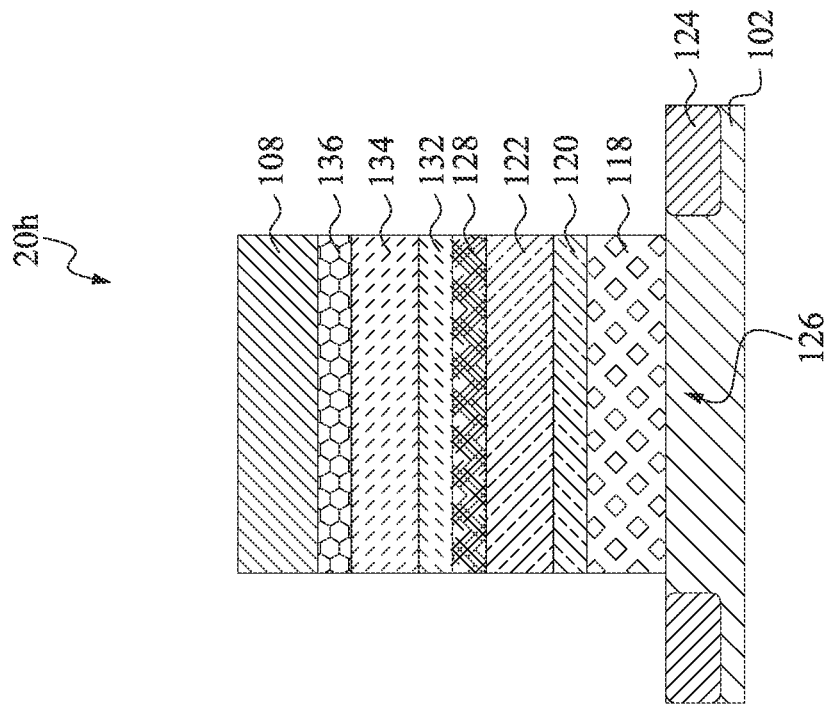

FIG. 47 shows another semiconductor structure 20h similar to the semiconductor structure 20b, except for addition of the first capping layer 128. In some embodiments, the second seed layer 132 is in contact with the top surface of the first capping layer 128. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second seed layer 132 and the second capping layer 136. In other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second seed layer 132 and the second capping layer 136.

Figure 48:
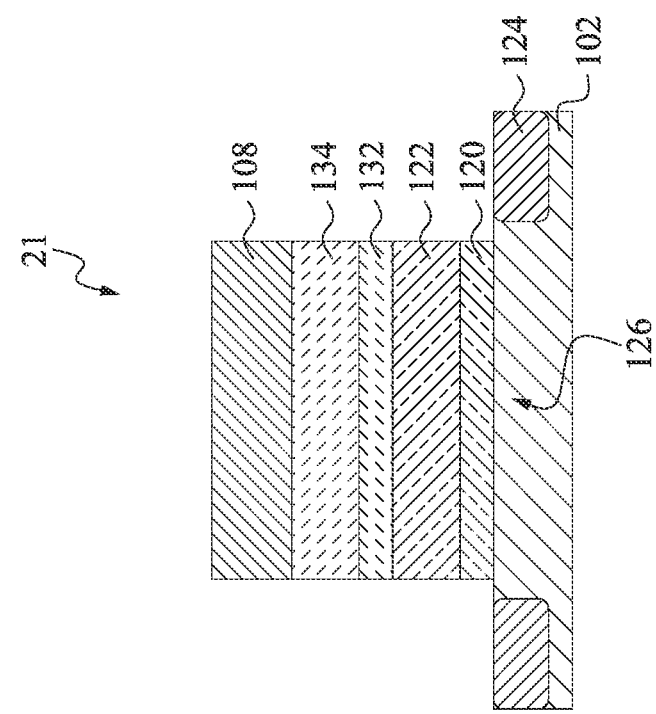

FIG. 48 shows another semiconductor structure 21 similar to the semiconductor structure 20, except for omitting the gate dielectric layer 118. In some embodiments, the first seed layer 120 is in contact with the channel region 126 of the substrate 102. In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132. In some other embodiments, the first zirconium-containing oxide layer 122 has antiferroelectricity enhanced or modified by the first seed layer 120, and the second zirconium-containing oxide layer 134 has ferroelectricity enhanced or modified by the second seed layer 132.

Figure 49:
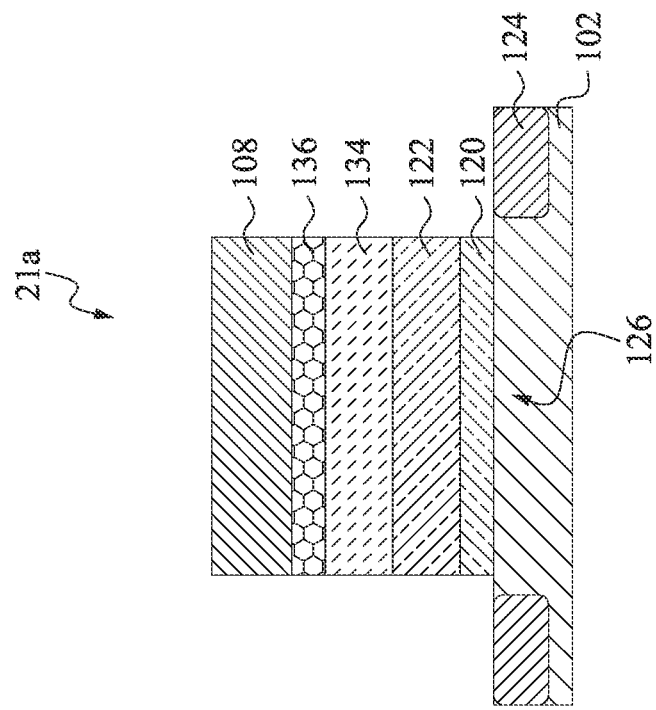

FIG. 49 shows another semiconductor structure 21a similar to the semiconductor structure 21, except for addition of the second capping layer 136 and omission of the second seed layer 132. In some embodiments, the second zirconium-containing oxide layer 134 is in contact with the top surface of the first zirconium-containing oxide layer 122. In some embodiments, the first zirconium-containing oxide layer 122 has ferroelectricity enhanced or modified by the first seed layer 120, and the second zirconium-containing oxide layer 134 has antiferroelectricity enhanced or modified by the second capping layer 136. In some other embodiments, the first zirconium-containing oxide layer 122 has antiferroelectricity enhanced or modified by the first seed layer 120, and the second zirconium-containing oxide layer 134 has ferroelectricity enhanced or modified by the second capping layer 136.

Figure 50:
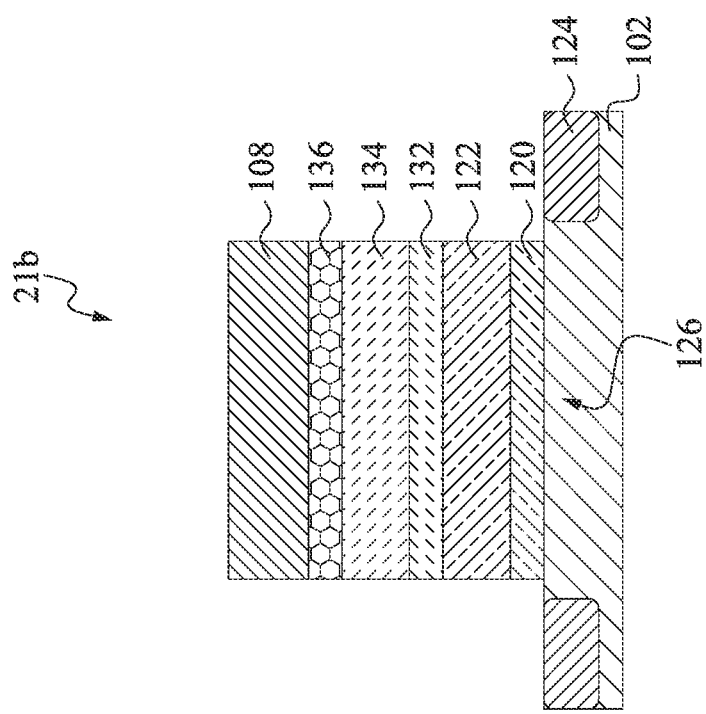

FIG. 50 shows another semiconductor structure 21b similar to the semiconductor structure 21, except for addition of the second capping layer 136. In some embodiments, the first zirconium-containing oxide layer 122 has ferroelectricity enhanced or modified by the first seed layer 120, and the second zirconium-containing oxide layer 134 has antiferroelectricity enhanced or modified by the second seed layer 132 and the second capping layer 136. In some other embodiments, the first zirconium-containing oxide layer 122 has antiferroelectricity enhanced or modified by the first seed layer 120, and the second zirconium-containing oxide layer 134 has ferroelectricity enhanced or modified by the second seed layer 132 and the second capping layer 136.

Figure 51:
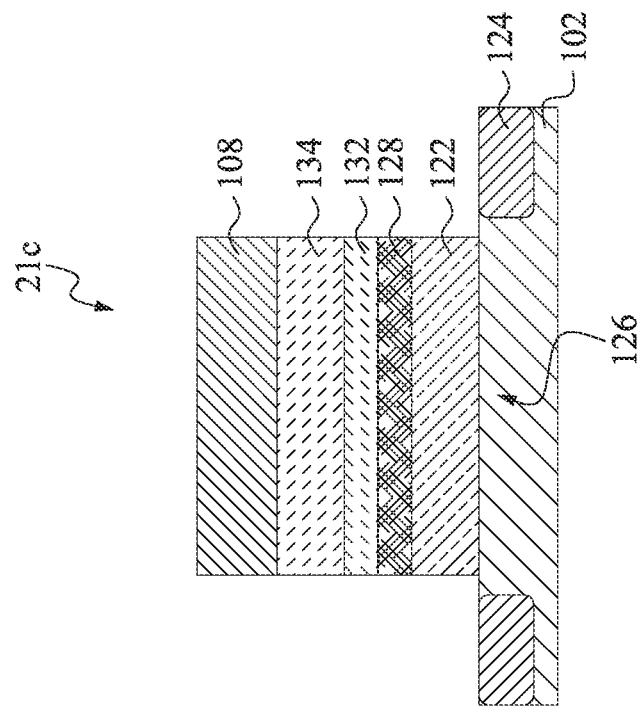

FIG. 51 shows another semiconductor structure 21c similar to the semiconductor structure 21, except for addition of the first capping layer 128 and omission of the first seed layer 120. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132. In some other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132.

Figure 52:
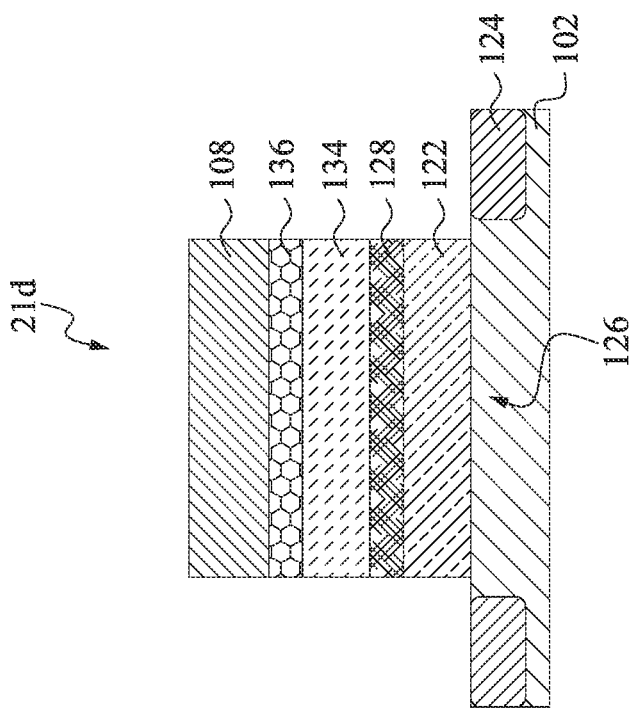

FIG. 52 shows another semiconductor structure 21d similar to the semiconductor structure 21a, except for addition of the first capping layer 128 and omission of the first seed layer 120. In some embodiments, the first zirconium-containing oxide layer 122 has ferroelectricity enhanced or modified by the first capping layer 128, and the second zirconium-containing oxide layer 134 has antiferroelectricity enhanced or modified by the second capping layer 136. In some other embodiments, the first zirconium-containing oxide layer 122 has antiferroelectricity enhanced or modified by the first capping layer 128, and the second zirconium-containing oxide layer 134 has ferroelectricity enhanced or modified by the second capping layer 136.

Figure 53:
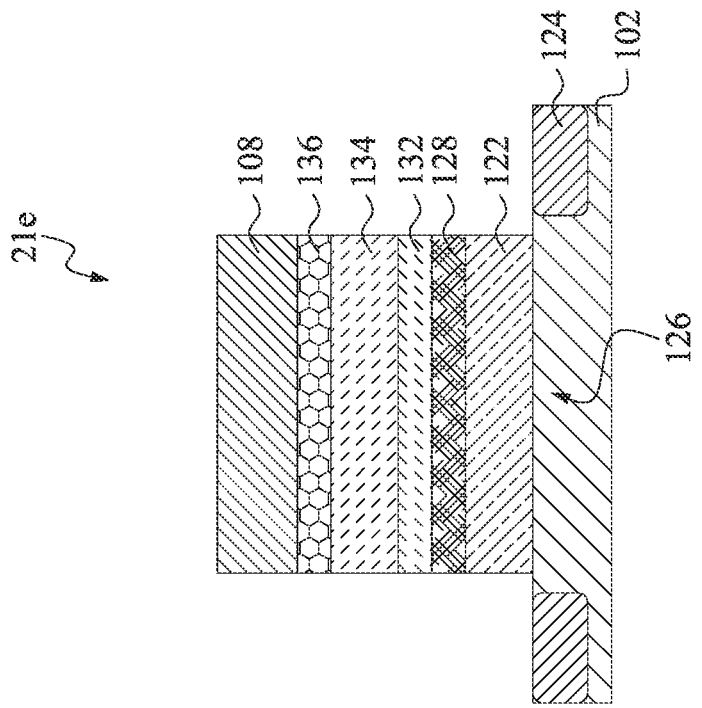

FIG. 53 shows another semiconductor structure 21e similar to the semiconductor structure 21b, except for addition of the first capping layer 128 and omission of the first seed layer 120. In some embodiments, the first zirconium-containing oxide layer 122 has ferroelectricity enhanced or modified by the first capping layer 128, and the second zirconium-containing oxide layer 134 has antiferroelectricity enhanced or modified by the second seed layer 132 and the second capping layer 136. In some other embodiments, the first zirconium-containing oxide layer 122 has antiferroelectricity enhanced or modified by the first capping layer 128, and the second zirconium-containing oxide layer 134 has ferroelectricity enhanced or modified by the second seed layer 132 and the second capping layer 136.

Figure 54:
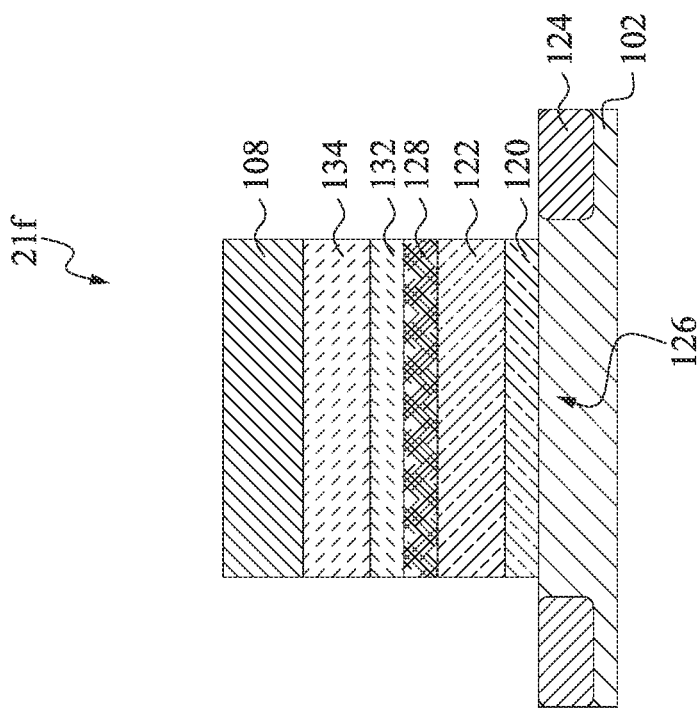

FIG. 54 shows another semiconductor structure 21f similar to the semiconductor structure 21, except for addition of the first capping layer 128. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second seed layer 132. In some other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second seed layer 132.

Figure 55:
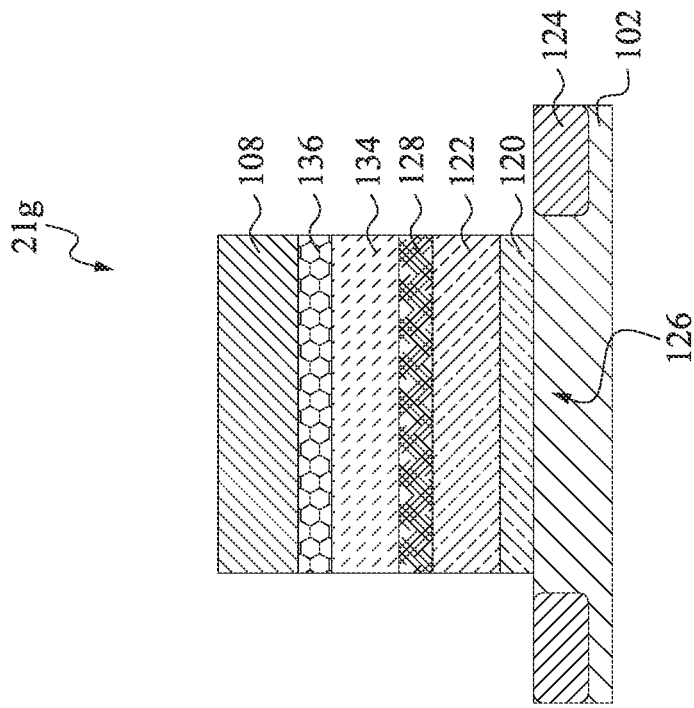

FIG. 55 shows another semiconductor structure 21g similar to the semiconductor structure 21a, except for addition of the first capping layer 128. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second capping layer 136. In some other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second capping layer 136.

Figure 56:
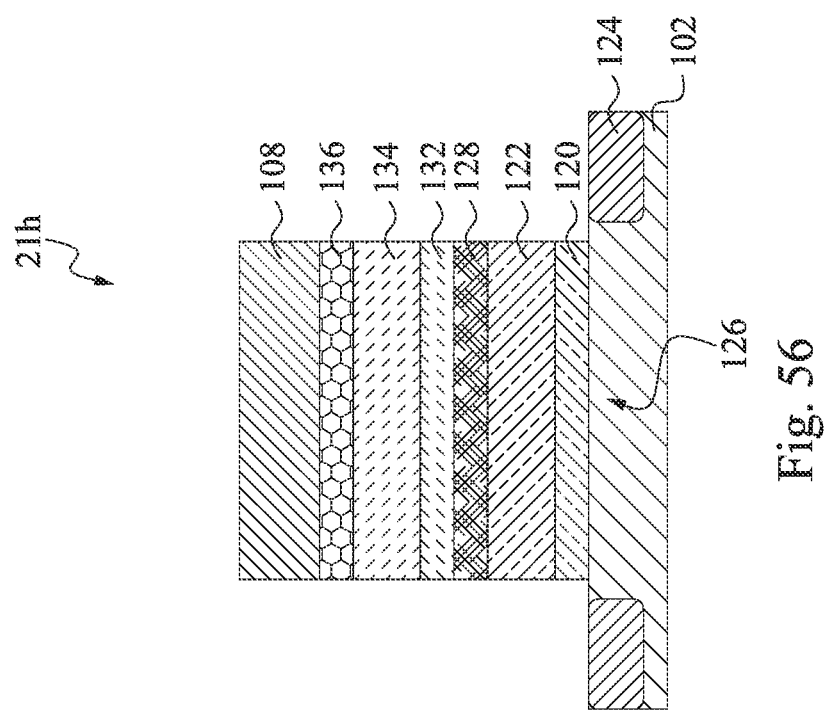

FIG. 56 shows another semiconductor structure 21h similar to the semiconductor structure 21b, except for addition of the first capping layer 128. In some embodiments, the first zirconium-containing oxide layer 122 has ferroelectricity enhanced or modified by the first seed layer 120 and the first capping layer 128, and the second zirconium-containing oxide layer 134 has antiferroelectricity enhanced or modified by the second seed layer 132 and the second capping layer 136. In some other embodiments, the first zirconium-containing oxide layer 122 has antiferroelectricity enhanced or modified by the first seed layer 120 and the first capping layer 128, and the second zirconium-containing oxide layer 134 has ferroelectricity enhanced or modified by the second seed layer 132 and the second capping layer 136.

Based on the above discussion, it can be seen that the present disclosure offers advantages. It is understood, however, that other embodiments may offer additional advantages, and not all advantages are necessarily disclosed herein. Moreover, no particular advantage is required for all embodiments. One advantage is that no annealing process is required to enhance or modify ferroelectricity or antiferroelectricity of the as-deposited $ZrO_2$ or $Hf_{0.5}Zr_{0.5}O_2$ layer and thus low thermal budget for deposition of layers of the semiconductor device is obtained, which is beneficial to process integration. Another advantage is that the thicknesses of the layers in the negative-capacitance gate stack can be reduced, resulting in further scaling down the NC-FET. Yet another advantage is that when the ferroelectric layer is made if $ZrO_2$, ferroelectricity or antiferroelectricity may be achieved in the ferroelectric layer without additional dopants. Still yet another advantage is that the ferroelectric layer can be prepared directly on the substrate without the gate dielectric layer. A further advantage is that when the ferroelectric layer is made of $ZrO_2$, by incorporating at least one of the seeding layer and the capping layer, either the ferroelectric phase or the antiferroelectric phase can be achieved, which provides flexibility in the formation of the NCFET. Another advantage is that $ZrO_2$ and $Hf_{0.5}Zr_{0.5}O_2$ are both compatible with silicon, and thus the $ZrO_2$ or $Hf_{0.5}Zr_{0.5}O_2$ layer can be directly deposited on the channel region of the silicon substrate without additional gate dielectrics.

In some embodiments, a device includes a substrate, a first zirconium-containing oxide layer, a first metal oxide layer and a top electrode. The first zirconium-containing oxide layer is over a substrate and having ferroelectricity or antiferroelectricity. The first metal oxide layer is in contact with the first zirconium-containing oxide layer. The first metal oxide layer has a thickness less than a thickness of the first zirconium-containing oxide layer. The top electrode is over the first zirconium-containing oxide layer.

In some embodiments, the device further includes a second metal oxide layer. The first zirconium-containing oxide layer is between the first metal oxide layer and the second metal oxide layer.

In some embodiments, the second metal oxide layer has a thickness less than the thickness of the first zirconium-containing oxide layer.

In some embodiments, the first metal oxide layer and the second metal oxide layer are made of the same material.

In some embodiments, the device further includes a second zirconium-containing oxide layer and a second metal oxide layer. The second zirconium-containing oxide layer is over the first zirconium-containing oxide layer. The second metal oxide layer is in contact with the second zirconium-containing oxide layer.

In some embodiments, the second metal oxide layer has a thickness less than a thickness of the second zirconium-containing oxide layer.

In some embodiments, the device further includes a third metal oxide layer. The second zirconium-containing oxide layer is between the second metal oxide layer and the third metal oxide layer.

In some embodiments, the third metal oxide layer has a thickness less than the thickness of the second zirconium-containing oxide layer.

In some embodiments, the second metal oxide layer and the third metal oxide layer are made of the same material.

In some embodiments, the first zirconium-containing oxide layer has ferroelectricity, and the second zirconium-containing oxide layer has antiferroelectricity.

In some embodiments, the first zirconium-containing oxide layer has antiferroelectricity, and the second zirconium-containing oxide layer has ferroelectricity.

In some embodiments, a device includes a semiconductor substrate, a first zirconium-containing oxide layer, a first metal oxide layer and a top electrode. The semiconductor substrate has source/drain regions and a channel region between the source/drain regions. The first zirconium-containing oxide layer is over the channel region of the semiconductor substrate and having ferroelectricity or antiferroelectricity. The first metal oxide layer is in contact with the first zirconium-containing oxide layer. The top electrode is over the first zirconium-containing oxide layer.

In some embodiments, the first metal oxide layer is over the first zirconium-containing oxide layer.

In some embodiments, the device further includes a second zirconium-containing oxide layer over the first zirconium-containing oxide layer and having ferroelectricity or antiferroelectricity.

In some embodiments, the second zirconium-containing oxide layer is between the first metal oxide layer and the top electrode.

In some embodiments, the device further includes a second metal oxide layer in contact with the second zirconium-containing oxide layer.

In some embodiments, the second metal oxide layer is between the first metal oxide layer and the second zirconium-containing oxide layer.

In some embodiments, the second metal oxide layer is between the top electrode and the second zirconium-containing oxide layer.

In some embodiments, a method includes forming source/drain regions in a semiconductor substrate; depositing a zirconium-containing oxide layer over a channel region in the semiconductor substrate and between the source/drain region; forming a metal oxide layer in contact with the zirconium-containing oxide layer; and forming a top electrode over the zirconium-containing oxide layer, wherein no annealing is performed after depositing the zirconium-containing oxide layer and prior to forming the top electrode.

In some embodiments, forming the metal oxide layer is performed such that the metal oxide layer is thinner than the zirconium-containing oxide layer.

In some embodiments, a method includes forming source/drain regions in a semiconductor substrate; depositing a zirconium-containing oxide layer over a channel region in the semiconductor substrate and between the source/drain region; forming a titanium oxide layer in contact with the zirconium-containing oxide layer; forming a top electrode over the zirconium-containing oxide layer, wherein no annealing is performed after depositing the zirconium-containing oxide layer and prior to forming the top electrode. In some embodiments, the titanium oxide layer is formed over the semiconductor substrate prior to depositing the first zirconium-containing oxide layer. In some embodiments, the method further includes depositing a zirconium-free metal oxide layer over a top surface of the first zirconium-containing oxide layer. In some embodiments, the titanium oxide layer is formed over the semiconductor substrate after depositing the first zirconium-containing oxide layer. In some embodiments, the method further includes depositing a second zirconium-containing oxide layer over the titanium oxide layer. In some embodiments, forming the titanium oxide layer is performed such that the titanium oxide layer is thinner than the first zirconium-containing oxide layer. In some embodiments, the titanium oxide layer has a thickness in a range from about 1 nm to about 6 nm. In some embodiments, the first zirconium-containing oxide layer has a thickness in a range from about 6 nm to about 20 nm. In some embodiments, the method further includes forming a bottom electrode over the semiconductor substrate prior to depositing the first zirconium-containing oxide layer and forming the titanium oxide layer. In some embodiments, the method further includes depositing a gate dielectric layer over the semiconductor substrate prior to depositing the first zirconium-containing oxide layer and forming the titanium oxide layer.

In some embodiments, a method includes depositing a first zirconium-containing oxide layer over a channel region of a semiconductor substrate; depositing a first zirconium-free metal oxide layer over the first zirconium-containing oxide layer; forming a middle electrode over the first zirconium-free metal oxide layer; depositing a second zirconium-free metal oxide layer over the middle electrode; depositing a second zirconium-containing oxide layer over the second zirconium-free metal oxide layer; forming a top electrode over the second zirconium-containing oxide layer. In some embodiments, the second zirconium-free metal oxide layer is made of a different material than the first zirconium-free metal oxide layer. In some embodiments, the first zirconium-free metal oxide layer is made of hafnium oxide. In some embodiments, the second zirconium-free metal oxide layer is made of titanium oxide. In some embodiments, the second zirconium-free metal oxide layer is made of a same material as the first zirconium-free metal oxide layer. In some embodiments, the second zirconium-free metal oxide layer has a thinner thickness than the second zirconium-containing oxide layer.

In some embodiments, a method includes forming a gate dielectric layer over a substrate; forming a bottom electrode over the gate dielectric layer; depositing a titanium oxide layer over the bottom electrode; depositing a zirconium oxide layer over the titanium oxide layer; depositing an hafnium oxide layer over the first zirconium oxide layer; forming a top electrode over the hafnium oxide layer. In some embodiments, the method further includes deposing a zirconium-free metal oxide layer over the hafnium oxide layer. In some embodiments, the method further includes deposing a second zirconium oxide layer over the hafnium oxide layer. In some embodiments, the first zirconium oxide layer has a thicker thickness than the hafnium oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a zirconium-containing oxide layer over a substrate;
   inducing a paraelectric-to-ferroelectric phase transition in the zirconium-containing oxide layer by forming a first titanium oxide layer in direct contact with the zirconium-containing oxide layer; and
   forming a top electrode over the zirconium-containing oxide layer and the first titanium oxide layer,
   wherein no annealing is performed after forming the zirconium-containing oxide layer and prior to forming the top electrode.

2. The method of claim 1, wherein the first titanium oxide layer is formed between the zirconium-containing oxide layer and the substrate.

3. The method of claim 1, wherein the first titanium oxide layer has a thickness less than a thickness of the zirconium-containing oxide layer.

4. The method of claim 1, further comprising:
   forming a second titanium oxide layer in direct contact with the zirconium-containing oxide layer, wherein the zirconium-containing oxide layer is between the first and second titanium oxide layers.

5. The method of claim 4, wherein the first and second titanium oxide layers have the same thickness less than a thickness of the zirconium-containing oxide layer.

6. The method of claim 1, wherein the top electrode is formed of Pt.

7. A method comprising:
   forming a dopant-free polarization insulating dielectric stack over a substrate by a deposition process, comprising:
      forming a zirconium-free metal oxide layer over the substrate; and
      forming a zirconium oxide layer in direct contact with the zirconium-free metal oxide layer, wherein the zirconium oxide layer has ferroelectricity or antiferroelectricity after the zirconium oxide layer is in direct contact with the zirconium-free metal oxide layer; and
   forming a top electrode over the dopant-free polarization insulating dielectric stack,
   wherein no annealing is performed after forming the zirconium oxide layer and prior to forming the top electrode.

8. The method of claim 7, further comprising:
   forming a middle electrode over the substrate after forming the zirconium oxide layer and prior to forming the top electrode.

9. The method of claim 7, wherein the zirconium-free metal oxide layer is formed prior to forming the zirconium oxide layer.

10. The method of claim 7, wherein the top electrode is formed of a different metal than titanium.

11. The method of claim 7, wherein the top electrode is formed of Pt.

12. A method, comprising:
    forming a zirconium-containing layer over a substrate;
    forming a first zirconium-free metal oxide layer between the zirconium-containing layer and the substrate and in contact with the zirconium-containing layer; and forming a top electrode over the zirconium-containing layer, wherein no annealing is performed after forming the zirconium-containing layer and prior to forming the top electrode.

13. The method of claim 12, further comprising:
forming a second zirconium-free metal oxide layer over and in contact with the zirconium-containing layer.

14. The method of claim 12, wherein the first zirconium-free metal oxide layer is a hafnium oxide layer or a titanium oxide layer.

15. The method of claim 12, wherein the zirconium-containing layer is made of zirconium oxide.

16. The method of claim 12, wherein the zirconium-containing layer comprises hafnium.

17. The method of claim 12, wherein the top electrode is formed of a different metal than titanium.

18. The method of claim 12, wherein the top electrode is formed of Pt.

19. The method of claim 1, wherein the zirconium-containing oxide layer is a zirconium oxide layer or a hafnium zirconium oxide layer.

20. The method of claim 7, wherein the zirconium-free metal oxide layer is a hafnium oxide layer or a titanium oxide layer.

* * * * *